(12) United States Patent
Pavicic et al.

(10) Patent No.: US 7,956,639 B2
(45) Date of Patent: Jun. 7, 2011

(54) INTELLIGENT CELLULAR ELECTRONIC STRUCTURES

(75) Inventors: Mark J. Pavicic, Fargo, ND (US); Chao You, West Fargo, ND (US)

(73) Assignee: NDSU Research Foundation, Fargo, ND (US)

( * ) Notice: Subject to any disclaimer, the term of this patent is extended or adjusted under 35 U.S.C. 154(b) by 0 days.

(21) Appl. No.: 12/508,149

(22) Filed: Jul. 23, 2009

(65) Prior Publication Data

US 2011/0001512 A1 Jan. 6, 2011

Related U.S. Application Data

(60) Provisional application No. 61/083,396, filed on Jul. 24, 2008, provisional application No. 61/082,947, filed on Jul. 23, 2008.

(51) Int. Cl.
H03K 19/173 (2006.01)
(52) U.S. Cl. .......................... 326/38; 326/41
(58) Field of Classification Search .............. 326/37–41, 326/46
See application file for complete search history.

(56) References Cited

U.S. PATENT DOCUMENTS

| | | | |
|---|---|---|---|
| 5,500,609 | A | 3/1996 | Kean |
| 5,646,545 | A | 7/1997 | Trimberger et al. |
| 5,761,483 | A | 6/1998 | Trimberger |
| 5,861,761 | A | 1/1999 | Kean |
| 6,107,821 | A | 8/2000 | Kelem et al. |
| 6,215,327 | B1 | 4/2001 | Lycke |
| 6,288,568 | B1 | 9/2001 | Bauer et al. |
| 6,308,208 | B1 | 10/2001 | Jung et al. |
| 6,331,788 | B1 | 12/2001 | Lycke |
| 6,388,466 | B1 | 5/2002 | Wittig et al. |
| 6,732,336 | B2 | 5/2004 | Nystrom et al. |
| 6,891,395 | B2 | 5/2005 | Wells et al. |
| 6,949,954 | B2 | 9/2005 | Nystrom et al. |
| 7,028,107 | B2 | 4/2006 | Vorbach et al. |
| 7,058,918 | B2 | 6/2006 | Abramovici et al. |
| 7,157,934 | B2 | 1/2007 | Teifel et al. |
| 7,187,201 | B1 | 3/2007 | Trimberger |
| 7,212,448 | B1 | 5/2007 | Trimberger |
| 7,250,786 | B1 | 7/2007 | Trimberger |
| 7,266,020 | B1 | 9/2007 | Trimberger |
| 7,348,796 | B2 | 3/2008 | Crouch et al. |

(Continued)

OTHER PUBLICATIONS

Adachi, S. et al. "Computation by Asynchronously Updating Cellular Automata" Journal of Statistical Physics, vol. 114, No. 1-2, 99.0261-289, Jan. 2004.

Mahram, A. et al. "An Asynchronous FPGA Logic Cell Implementation" Proc of the 17th ACM Great Lakes Symposium on VLSI, pp. 176-179, 2007.

(Continued)

*Primary Examiner* — Don P Le
(74) *Attorney, Agent, or Firm* — John P. O'Banion

(57) ABSTRACT

An apparatus and method controlling cellular automata containing a plurality of cascaded circuit cells having logic units. The cells are interleaved in groups toward supporting multiple directions, for example quad cells in which each cells of the quad is directed in a different directions separated by a fixed angle, such as 90 degrees (i.e., north, east, south, and west). These cells are triggered asynchronously as each cell is stabilized in preparation for receiving the trigger. The cells process data selectively based on the configuration of the cell and in response to receipt of data and trigger (or combined data and trigger) conditions from neighboring cells. The array can be utilized within a wide range of digital logic. As there is no need for distributing a global clock across the array of cells, the size of the array can be extended to any desired dimension.

50 Claims, 41 Drawing Sheets

U.S. PATENT DOCUMENTS

| | | | |
|---|---|---|---|
| 7,411,436 | B2 | 8/2008 | Fang et al. |
| 7,429,884 | B2 | 9/2008 | Ebergen et al. |
| 2007/0094166 | A1 | 4/2007 | Addison |
| 2007/0115040 | A1 | 5/2007 | Ebergen et al. |
| 2007/0252617 | A1* | 11/2007 | Lewis et al. .................. 326/41 |
| 2010/0102848 | A1 | 4/2010 | Gershenfeld et al. |
| 2010/0308858 | A1* | 12/2010 | Noda et al. .................. 326/10 |

OTHER PUBLICATIONS

Traver, C. et al. "Cell Designs for Self-timed FPGAs" Proc of the 2001 ASIC/SOC Conference.

Fang, D. et al. "Self-Timed Thermally Aware Circuits" Proceedings of the IEEE Computer Society Annual Symposium on VLSI, Karlsruhe, Mar. 2006.

Di, J. et al. "Cellular Array-based Delay-insensitive Asynchronous Circuits Design and Test for Nanocomputing Systems" Journal Electronic Testing: Theory and Applications, pp. 175-192, 2007.

Nakada, H. et al. "Plastic Cell Architecture: A Dynamically Reconfigurable Hardware-based Computer" 6th Reconfigurable Architecture Workshop, in LNCS No. 1586, pp. 679-687, 1999.

Lycke, J. et al. "Reconfigurable Cellular Array Architecture for Molecular Electronics" Final Report, Air Force Research Laboratory, Mar. 2001.

Teifel, J. et al. "Automated Synthesis for Asynchronous FPGAs" 13th ACM International Symposium on Field-Programmable Gate Arrays, Feb. 2005.

Teifel, J. et al. "Programmable Asynchronous Pipeline Arrays" 13th International Conference on Field Programmable Logic and Applications Sep. 2003.

Macias, N. J. "The PIG Paradigm, The Design and Use of a Massively Parallel Fine Grained Self-Reconfigurable Infinitely Scalable Architecture" Proceedings of 1st NASA/DOD workshop, p. 175, 1999.

Durbeck, L.J.K. et al. "The Cell Matrix: Architecture for Nanocomputing" Nanotechnology 12, pp. 217-230, Aug. 2001.

Ebergen, J. et al. "Notes on Pulse Signaling" 13th IEEE Int'l Symposium on Asynchronous Circuits and Systems pp. 15-24, Mar. 2007.

Peper, F. et al. "Laying Out Circuits on Asynchronous Cellular Arrays: a Step Towards Feasible Nanocomputers?" Nanotechnology 14, pp. 469-485, Mar. 2003.

Hauck, S. "Asynchronous Design Methodologies: An Overview" Proc. of the IEEE, vol. 83, No. 1, pp. 69-93, Jan. 1995.

Hauck, S. et al. "An FPGA for Implementing Asynchronous Circuits" IEEE DEsign & Test of Computers, vol. 11, No. 3, pp. 60-69, Fall 1994.

* cited by examiner

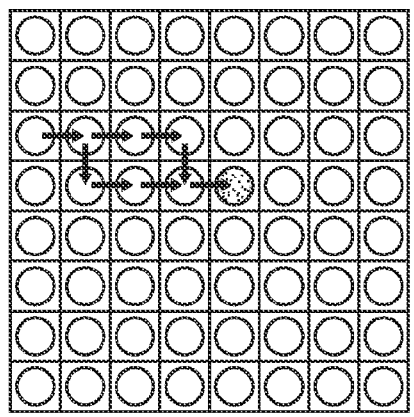
FIG. 10
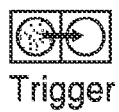 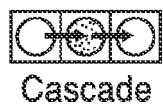 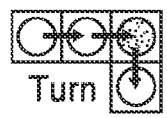  
Trigger    Cascade    Turn    Fork    Join
FIG. 11A    FIG. 11B    FIG. 11C    FIG. 11D    FIG. 11E
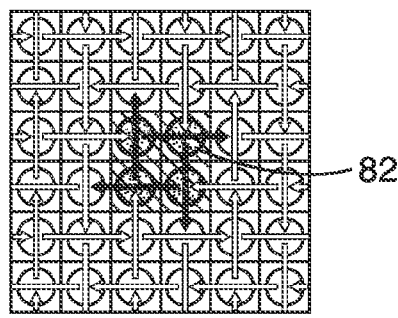
FIG. 12

$F = E \cdot C = A \cdot B \cdot C$

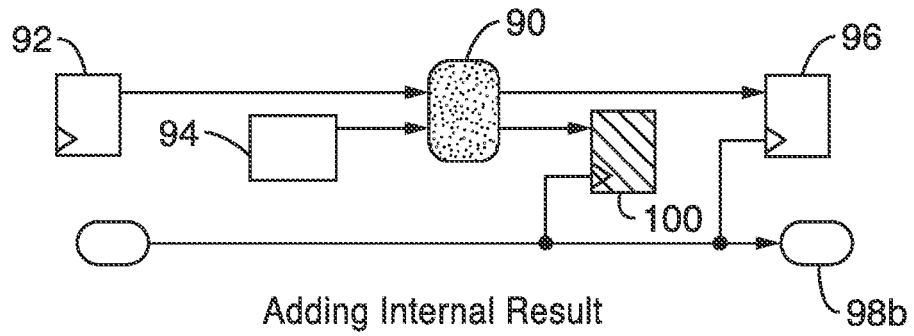
FIG. 16 Adding Internal Result
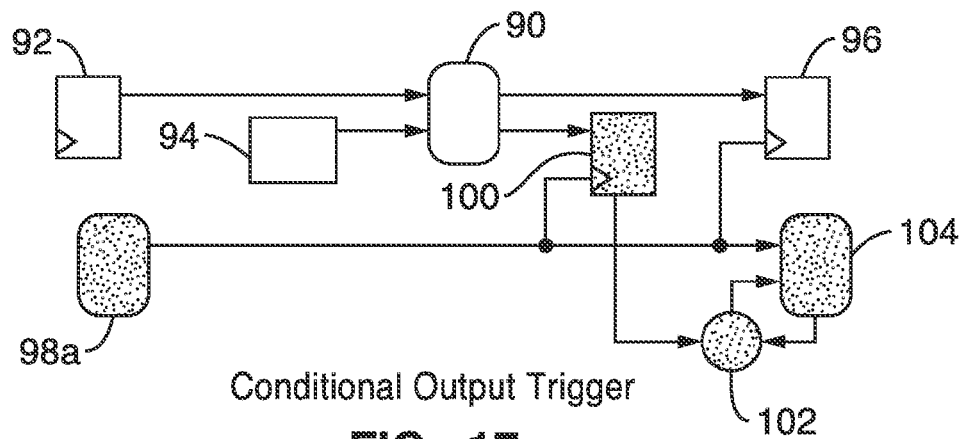
FIG. 17 Conditional Output Trigger
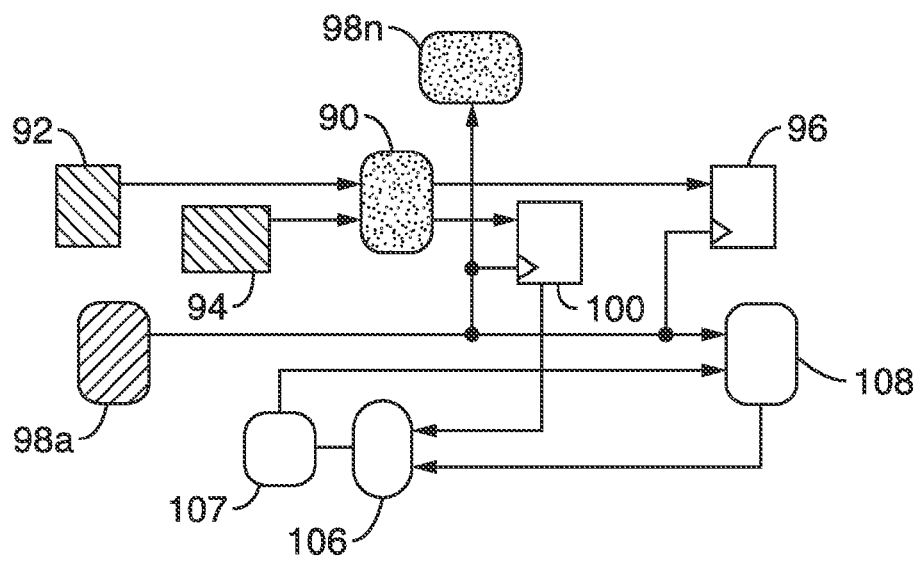
FIG. 18 Adding Fork and Join

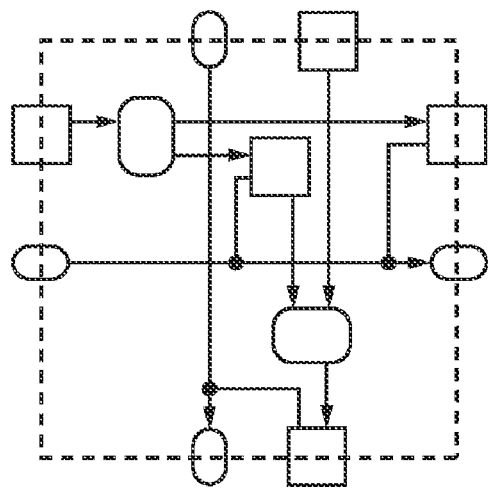
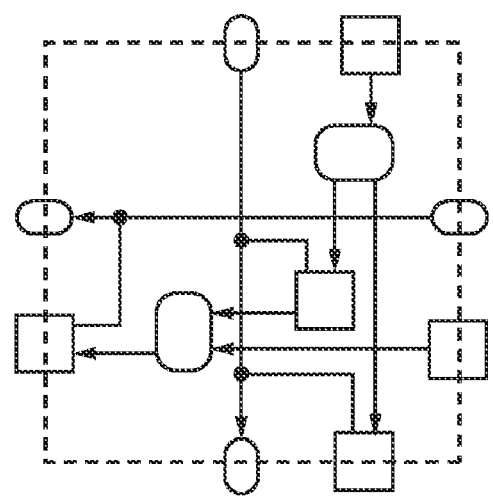
FIG. 22A          FIG. 22B
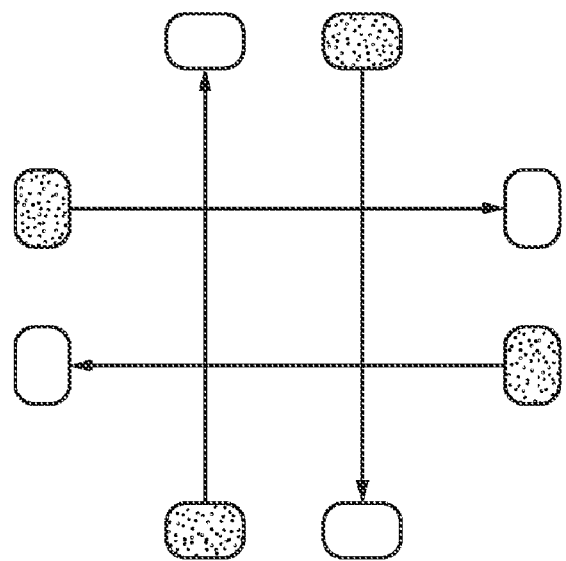
FIG. 23

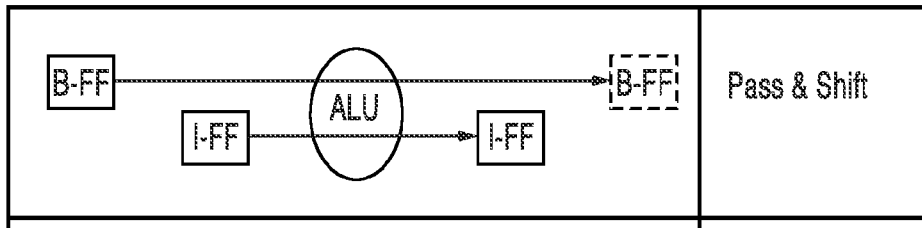
FIG. 33A — Pass & Shift
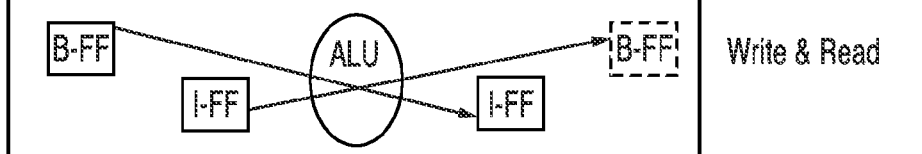
FIG. 33B — Write & Read
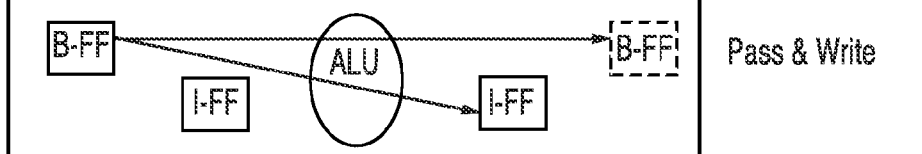
FIG. 33C — Pass & Write
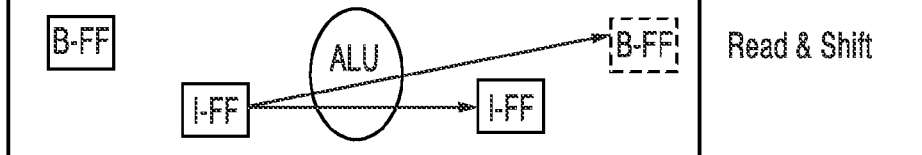
FIG. 33D — Read & Shift
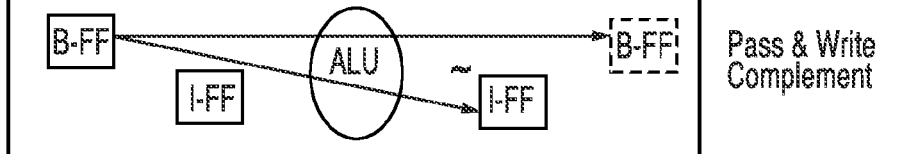
FIG. 33E — Pass & Write Complement
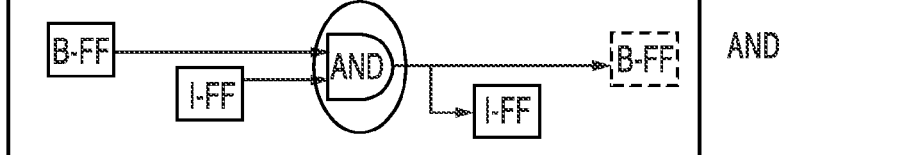
FIG. 33F — AND
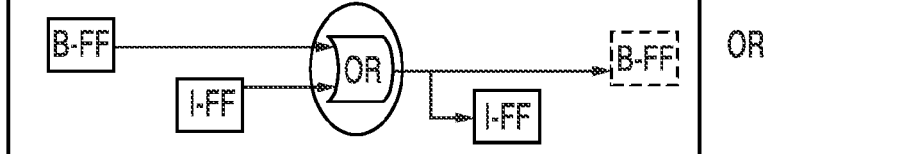
FIG. 33G — OR 1) Propagation delay of OR gate= PD OR 1) Propagation delay of NOT gate = PD (NOT)
2) Propagation delay of OR gate = PD (OR)
3) Propagation delay of AND gate = PD (AND)

1) Propagation delay of NOT gate= PD (NOT)
2) Propagation delay of OR gate= PD (OR)
3) Propagation delay of AND gate= PD (AND)

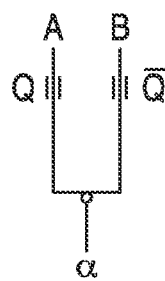
FIG. 50
 
 
FIG. 51A                FIG. 51B
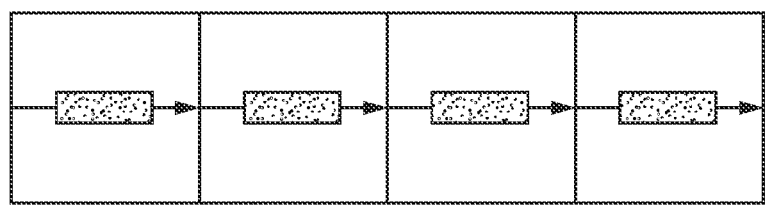
FIG. 52
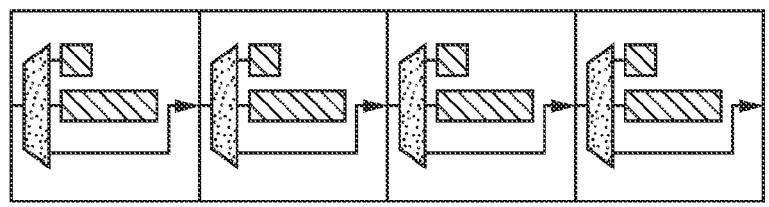
FIG. 53

INTELLIGENT CELLULAR ELECTRONIC STRUCTURES

CROSS-REFERENCE TO RELATED APPLICATIONS

This application claims priority from U.S. patent application Ser. No. 61/082,947 filed on Jul. 23, 2008, and from U.S. patent application Ser. No. 61/083,396 filed on Jul. 24, 2008, each of which is incorporated herein by reference.

STATEMENT REGARDING FEDERALLY SPONSORED RESEARCH OR DEVELOPMENT

This invention was made with Government support under Grant No. H94003-06-2-0603, awarded by the Defense Microelectronics Activity (DMEA). The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

A portion of the material in this patent document is also subject to protection under the maskwork registration laws of the United States and of other countries. The owner of the maskwork rights has no objection to the facsimile reproduction by anyone of the patent document or the patent disclosure, as it appears in the United States Patent and Trademark Office publicly available file or records, but otherwise reserves all maskwork rights whatsoever. The maskwork owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to cellular logic arrays, and more particularly to extensible intelligent cellular logic arrays as triggered cellular automata.

2. Description of Related Art

Cellular logic arrays are gaining interest in many applications, and in many applications, such as scalable reconfigurable computing, field programmable gate arrays (FPGAs), for instance in regard to speed, size or massive parallelism. However, the implementation of these arrays is fraught with numerous problems and limitations. One problem arises in regard to distribution of data and clocks and the associated problem with assuring proper setup times are provided in response to the distributions of the clock and data within a synchronous array.

Accordingly a need exists for apparatus and methods of connecting cellular logic arrays without the clock and data distribution problems and interfacing problems associated with conventional devices. These needs and others are met within the present invention, which overcomes the deficiencies of previously developed logic array apparatus and methods.

BRIEF SUMMARY OF THE INVENTION(S)

The invention is an apparatus and method of providing triggered cellular automata, such as to create an extensible FPGA which does not need a global clock. As used herein "cellular automata" means an array of logic cells with local connections only to neighboring cells. It will be appreciated that select cells, preferably on the periphery of the array of logic cells, interface with circuits for inputting signals to the cellular automata. The cells are identical with respect to hardware, but are configured differently. In the present invention the cells are only triggered (e.g., from a pulse) as necessary, wherein the cell processes data selectively. Cell arrays can be constructed in which the cell performs triggering, and cell function may vary according to the direction of trigger arrival. The cell function may toggle in response to the arrival of the trigger. Additionally, cells can be grouped to form combinatorial logic functions. This technology is an example of technology that could be implemented using molecular electronics because the computational structures are made from simple building blocks (cells).

The invention provides a uniformly extensible programmable logic architecture, similar to a gate array, FPGA, or CPLD, which utilizes cellular automata and asynchronous logic wherein there is no need for a global clock. Applicability ranges from the very small to the very large, such as for the construction of computers and other "intelligent" electronic devices and systems. A large number of cells would be required in a high end (complex) application, such as in a large computer. The technology may be especially attractive to FPGA vendors and integrated circuit (chip) vendors.

The use of an "asynchronous trigger" is an important aspect of the present invention. The actions in the present invention are not generated in response to a clock; that is to a synchronized signal received throughout the device. In the present invention, a single pulse causes action to take place, which can also cause other triggers to be generated.

It is also important to understand the difference between state and function with respect to the present invention. The trigger changes the "state" of the cell and not the "configuration". The configuration is the initial state of each cell and its respective function. State changes take place in response to receipt of a trigger. The present invention melds the use of asynchronous triggering within reconfigurable logic to yield an intelligent cellular electronic structure which provides a number of benefits over existing circuitry and individual components.

In response to use of the invention, large arrays of cells do not require a clock, so an array can be created to any desired size. It will be appreciated that clocking does not operate well in large arrays, while it consumes significant power. These clocking problems are overcome with the use of the asynchronous triggering according to the present invention. One primary aspect of the invention is a cascaded asynchronous triggered logic which supports turns, forks and joins. Turns are provided automatically in response to a cascaded configuration. The apparatus provides a mechanism to regenerate triggering for the cascaded configuration. Each time a trigger enters a cell, or an element of a multi-cell (e.g., quad-cell), the trigger is regenerated. A "join" can be provided as an essential component of the architecture.

The invention is amenable to being embodied in a number of ways, including but not limited to the following descriptions.

One embodiment of the invention is an apparatus for performing digital processing within an array of logic cells, comprising: (a) a multiple (e.g., four) of logic cells interconnected into a multiple cell (e.g., four); (b) an arithmetic and logic circuit within each of said logic cells and adapted for performing a function selected in response to its configuration setting; (c) wherein each said interconnected logic cell within said multiple cell is rotated a different predetermined extent within said multiple cell; (d) trigger generation circuits within the interior of said multiple cell for routing data between each cell of said multiple cell; and (e) trigger generation circuits at the boundary of said multiple cell, and shared with adjacent multiple cells, for routing data between adjacent multiple cells.

In at least one implementation, the data and triggers can be routed in multiple directions through an array of said multiple cells and be interspersed with computations. Each multiple cell is configured for outputting triggers and data to any of its neighboring multiple cells. The trigger and data is turned in response to traversing the circuitry of the rotated logic cells within a multiple cell when passed internally within the cells of the multiple cell. In one or more pulse versions of the apparatus, the data and triggers are routed in response to the transmission of pulses. In one mode of the invention, a pulse received on a first input indicates the presence of a "0" while a pulse received on a second input indicates the presence of a "1", or vice-versa.

In at least one implementation, the arithmetic and logic (ALU) circuit comprises a one-bit processing unit. In at least one embodiment, the ALU circuit is configured for executing digital logic operations consisting generally of, but not limited to, those selected from the group of digital logic operations consisting of AND, NAND, OR, NOR, XOR, XNOR, NOT, read, write as well as arithmetic functions.

In at least one implementation each logic cell within the multiple cell contains a data storage element into which configuration bits can be loaded to control the operations within each said cell within the multiple cell.

In at least one implementation each logic cell within the multiple cell contains selectors, whereas each selector is preferably adapted for supporting conditional branching or exit comprising routing, forking, joining or terminating the data and/or trigger signals.

One embodiment of the invention is an apparatus for performing digital processing within a cellular logic array, comprising: (a) an arrangement of four logic cells coupled into a quad cell; (b) an arithmetic and logic circuit within each said logic cells and adapted for performing a function selected in response to its configuration setting; (c) trigger generation circuits within the interior of said logic cell for routing data between each cell of said quad cell; and (d) trigger generation circuits at the boundary of said quad cell, and shared with adjacent quad cells, for routing data between adjacent quad cells. Each of the interconnected logic cell within the quad cell is rotated a different predetermined extent within the quad cell, such as preferably by 90 degrees more than its predecessor. Data and triggers from the quad cell can be routed in four different directions through an array of the quad cells and interspersed with computations.

One embodiment of the present invention is a method of triggering cellular automata, comprising: (a) cascading a plurality of interconnected circuit cells; (b) triggering, asynchronously, of each of said cells in as each cell stabilizes in preparation for receiving said trigger; (c) selectively processing data within a logic unit of each said cell based on the configuration of the cell and in response to receipt of data and trigger conditions from neighboring cells; and (d) outputting triggers and data to neighboring cells.

In at least one mode of the invention logic cells of each multiple cells are configured for performing selective processing and triggering, by loading configuration bits within each of the plurality of cells (e.g., a storage circuit, or more preferably a shift register) to control the operations within each of the cells.

In at least one implementation of the apparatus, more complex combinatorial logic is performed in response to sequential execution of operations in cascade as each cell has a limited number of bits available for each computation.

The present invention provides a number of beneficial aspects which can be implemented either separately or in any desired combination without departing from the present teachings.

An aspect of the invention is for providing logic circuit arrays which overcome the long-standing synchronization problems, such as when routing of trigger and data.

Another aspect of the invention is for configuring combination cells within digital circuit arrays which overcome the difficulty of routing signals to different multiple cells within a target design.

Another aspect of the invention provides for the use of triggers and data, while another utilized pulse logic in conveying data and triggers.

Another aspect of the invention provides improved thermal management. By way of example, the trigger generation can be responsive to a means for detecting thermal conditions, such as delaying generation of the trigger as temperature increases, thus mitigating thermal ramping. One important embodiment of the invention is within a reconfigurable cellular array.

Another aspect of the invention provides for the merging of timing and data.

A still further aspect of the invention is a means for determining the capabilities of neighboring cells and to selectively pass results from the ALU to any desired ALU which is near the source.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL
VIEWS OF THE DRAWING(S)

The invention will be more fully understood by reference to the following drawings which are for illustrative purposes only:

FIG. 10 is a block diagram of a cell array (CA) according to an aspect of the present invention, showing a trace of the progress of a trigger-driven computation.

FIG. 11A-11E are block diagrams of a set of common functions between cells according to an aspect of the present invention, showing trigger, cascade, turn, fork and join.

FIG. 12 is a block diagram of a cell array according to an aspect of the present invention, showing the interconnection of sequentially rotated processor structures within each quad cell.

FIG. 16 is a schematic of connecting the one-bit processor within a cell within a quad cell according to an embodiment of the present invention, showing boundary inputs and output controlled by trigger generators.

FIG. 17 is a schematic of connecting the one-bit processor within a cell of a quad cell as shown in FIG. 16, showing adding a conditional trigger output.

FIG. 18 is a schematic of connecting the one-bit processor within a cell of a quad cell as shown in FIG. 17, showing adding a fork and join.

FIG. 22A-22B are schematics of a one-bit adder pattern from FIG. 21 according to an aspect of the present invention, showing only the cells involved in the actual computation.

FIG. 23 is a data flow diagram of straight trigger paths in each of four different directions within a quad cell according to an embodiment of the present invention.

FIG. 33A-33G are block diagrams of eight different ALU operations according to an embodiment of the present invention.

FIG. 50 is a schematic of a selector circuit according to an aspect of the present invention.

FIGS. 51A and 51B are timing diagrams of the relationships between Q and /Q signals showing a proper relationship in FIG. 51A, in relation to an improper relationship in FIG. 51B.

FIG. 52 is a data flow diagram showing configuration data being passed between storage elements, such as shift-registers, in successive cells within an array according to an aspect of the present invention.

FIG. 53 is a data flow diagram of configuration data being passed between storage elements according to an aspect of the present invention, showing multiple paths in each cell depending on whether the data is command data, configuration data, or data for a subsequent cell.

DETAILED DESCRIPTION OF THE INVENTION

Figure 1:
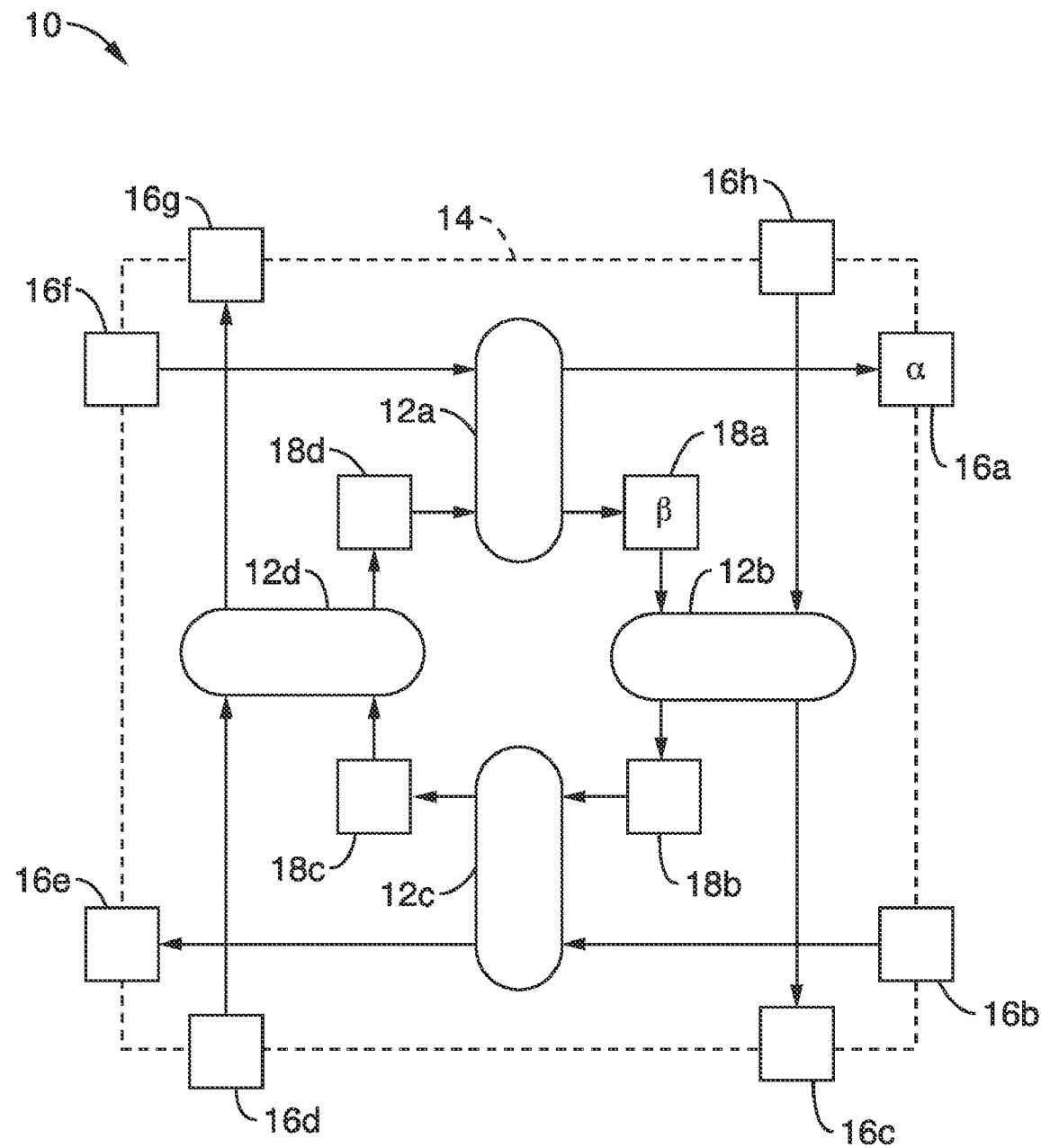
FIG. 1 is a schematic of a quad cell for connection within a cellular array block according to an aspect of the present invention, showing four rotated interconnected processing elements within its core.
Figure 73:
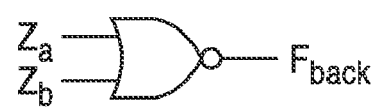

Referring more specifically to the drawings, for illustrative purposes the present invention is embodied in the apparatus generally shown in FIG. 1 through FIG. 73. It will be appreciated that the apparatus may vary as to configuration and as to details of the parts, and that the method may vary as to the specific steps and sequence, without departing from the basic concepts as disclosed herein.

The present invention comprises cellular arrays in which the cells operate at low power without the need of a global clock signal. Each cell in the array performs an operation (logic), when triggered to do so. A trigger may be received separately, or be accompanied by one or more bits of data, or be merged with one or more bits of data. The merged case may be more advantageous where only one bit of data is being transferred. Otherwise, the triggered cases may be more advantageous where multiple bits of data are being transferred. The operation to be performed may be determined by how the cell is configured. Alternatively, the operation to be performed may be specified in code send with the trigger (e.g., an OP code).

A cell may perform different operations in response to the direction from which the trigger is received. It could also follow a fixed pattern, such as toggling between two operations in response to each trigger arrival.

Preferably, the operations are digital logic based which can include up to sixteen possible functions involving two bits. In addition, operations may output multiple bits, such as two bits, for example storing one bit in another element of the same quad cell and the other result is passed on to a neighboring quad-cell. It should be appreciated that these logic functions may comprise, for example, the basic logic functions including AND, NAND, OR, NOR, XOR, XNOR, NOT, as well as read, write and arithmetic functions as desired. By way of example and not limitation, the functions of at least AND, OR, NOT, read, and write will be discussed for embodiments of the present invention. For these operations, one operand is the state of the cell while the other operand is the bit that accompanies the trigger. Cells can be grouped to/from the AND-OR blocks used to evaluate Boolean functions, and thus form the combinatorial logic. Synchronization may be achieved by constructing suitable logic and interconnected triggering. A cell can also pass through a trigger, as well as optional data and control, without itself performing any other operation.

The description is divided into numerous sections. It should be appreciated that some overlap may exist between the discussion in each section.

Section 1

The present invention generally comprises a low-power extensible array of cells which does not require use of a global clock for its operation. Instead of relying on a global clock, each cell in the array of cells operates when it is triggered to do so by a neighboring cell. A trigger may be accompanied by a bit, or more, of data. The operation to be performed may be set, such as based on a programmed "configuration", or the operation can be specified with the trigger. Operations may be logic type, arithmetic type, or other digital type operations.

A cell may perform a different operation depending on the direction from which the trigger arrived. It could also follow a fixed pattern, such as toggling between two operations in response to receipt of a trigger. Operations typically include that of AND, OR, NOT, read, write, and similar digital logic related actions. For these operations, one operand is typically configured as the state of the cell and the other operand is the bit that accompanies the trigger, or is combined with the trigger. In one implementation, the cells are grouped to form various logic blocks (e.g., AND-OR) used to evaluate logic functions to form any desired combinatorial logic. Synchronization mechanisms are built into the cell, and may be utilized in larger (multi-cell) constructions, but it should be noted that the cells themselves already contain the necessary synchronization primitives—with the "join" being the principle mechanism. A cell can also pass a trigger, as well as data and control as desired, through itself without performing any operation.

FIG. 1 illustrates a cell 10 according to an aspect of the invention having four interconnected logic blocks, preferably comprising one-bit processing elements 12a-12d, each configured for performing functions such as AND, OR, READ, WRITE and so forth. The squares in the figure denote storage devices, such as a latches or flip-flops. The boundary of the cell 14 is shown as the dashed line with the flip-flop (FF) squares 16a-16h bounding I/O to the neighboring cells, coupled to an output of the logic blocks being referred to as the alpha ($\alpha$) output. Another set of flip-flops (FFs) 18a-18d interconnect logic blocks 12a-12d, and shown coupled to an output of the logic blocks being referred to as the alpha (β) output.

Figure 2:
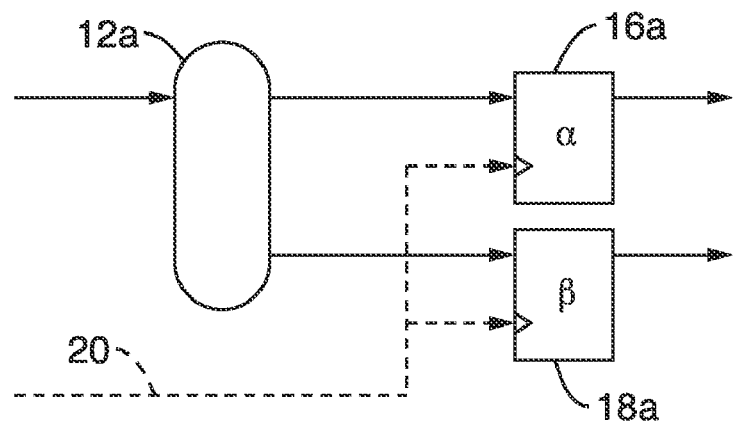
FIG. 2 is a schematic of the one-bit processor coupled to a FF from an internal and external set of FFs according to aspect of the present invention.

FIG. 2 depicts a portion of FIG. 1, shown with the one-bit processor 12a having a first output connected to a first storage device α 16a and a second output connected to a second storage device β 18a. Outputs from the logic block are input to the two storage devices and a trigger 20 is coupled to each of the storage devices 16a, 18a. The source of the triggers are not shown in FIG. 2 for the sake of simplicity of illustration. It will be appreciated that routing of the trigger (and data as desired) can occur at the corners of the cell.

Figure 3A:
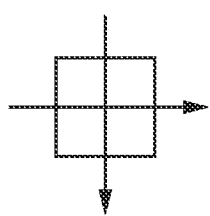
FIG. 3A-3D are path diagrams depicting four path options within an upper right hand corner of the quad cell of FIG. 1, according to an aspect of the present invention.
Figure 3B:
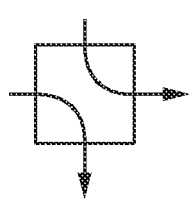
Figure 3C:
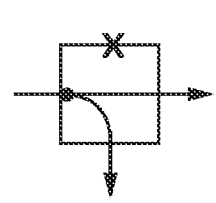
Figure 3D:
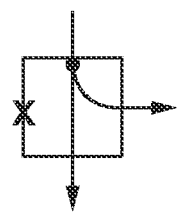

FIG. 3A-3D illustrates four path options (A, B, C and D) for a single cell within the quad cell of FIG. 1, in which the path can convey both trigger and data. In particular the cell in the upper right hand corner of FIG. 1 is considered which includes LU 12b (see also FIG. 30). The small dots in FIG. 3C-3D depict the common origin of the two vectors emanating from it. The "X" on the edges of those figures represent an entry point to the square (representing a cell in the quad-cell) that is not being used.

Figure 4:
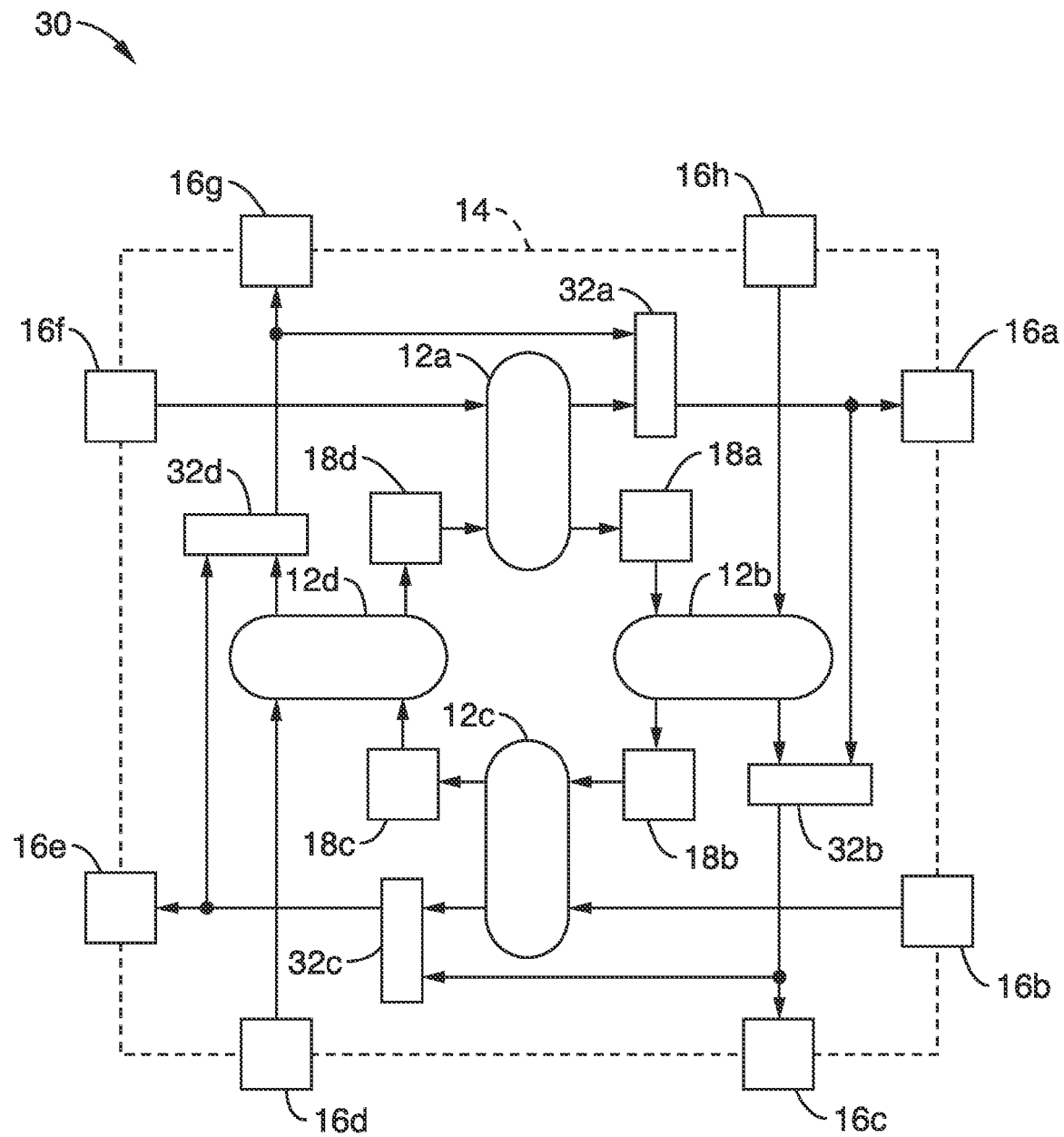
FIG. 4 is a schematic of a quad cell shown with a first configuration of signal selectors according to an embodiment of the present invention.

FIG. 4 illustrates an embodiment 30 which includes means of making signal selections within the cell of FIG. 1, as well as logic blocks 12a-12d, cell boundary 14, external I/O FFs 16a-16h, and internal I/O FFs 18a-18d which were already shown in FIG. 1 and FIG. 2. These signal selecting means are referred to herein as selectors. Inclusion of the selectors imbue the cells with a mechanism by which triggers can be routed, forked, joined and/or terminated. Four selectors, 32a-32d, are shown in the example cell, however, it will be appreciated that any number may be incorporated without departing from the teachings of the present invention.

Each selector is shown in the figure as a block having 2-inputs and 1-output (32a-32d), although other configurations can be utilized without departing from the teachings of the present invention. The selectors allow selecting the output from the logic block or from a cell edge which is then routed to another cell edge, and/or internally to the cell. In one option, the selector can also be configured to select neither input and thus provide for termination. It should be appreciated that this routing can be performed in a number of different ways according to the present invention.

Figure 5:
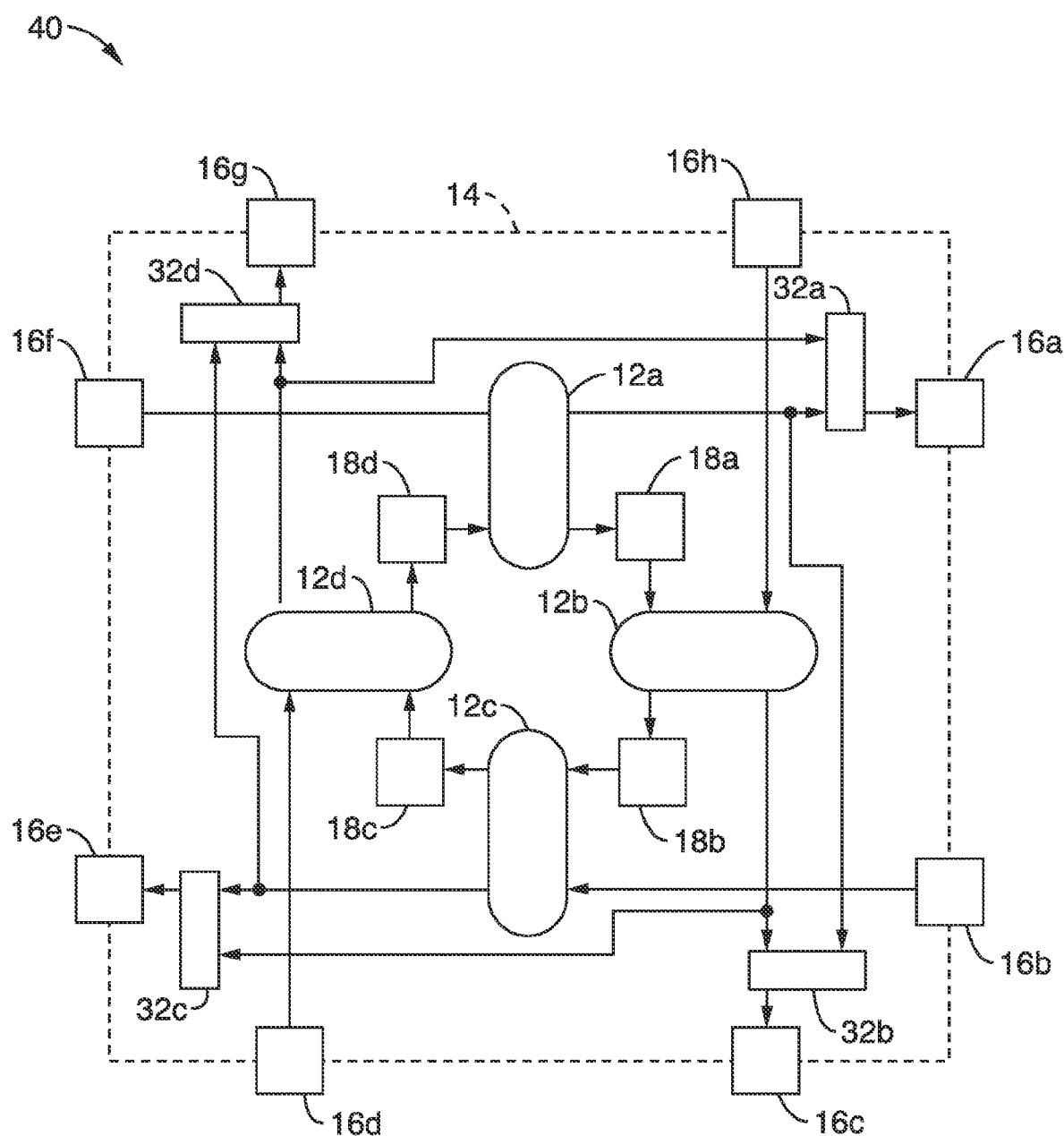
FIG. 5 is a schematic of a quad cell shown with a second configuration of signal selectors according to an embodiment of the present invention.

FIG. 5 illustrates an embodiment 40 having selectors 32a-32d connected in a different location within the cell, specifically from a tap that occurs before the previous selector, rather than after the previous selector. The figure also shows the same elements, including logic blocks 12a-12d, cell boundary 14, external I/O storage devices (e.g., FFs) 16a-16h, and internal I/O storage devices (e.g., FFs) 18a-18d as previously shown in FIG. 1-2 and FIG. 4.

Figure 6:
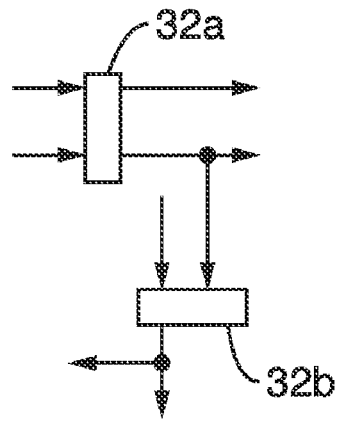
FIG. 6-7 are signal selector arrangements shown in FIG. 4 and FIG. 5 being compared according to aspects of the present invention.
Figure 7:
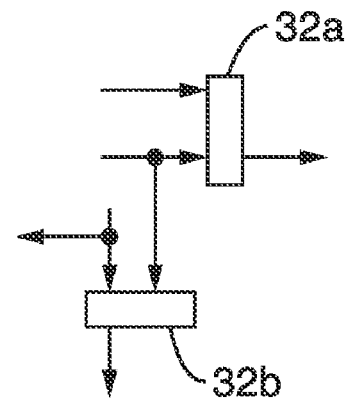

FIG. 6 and FIG. 7 illustrate a comparison of the selector arrangements used in FIG. 4 and FIG. 5 respectively. In providing a form of conditional branching, or exit, the selector control can be performed in response to the operation and/or its result.

Figure 8:
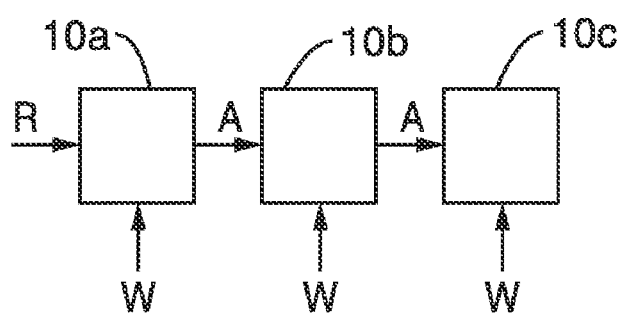
FIG. 8 is an block diagram of interconnecting cells performing various arithmetic, logic, and I/O functions according to an aspect of the present invention, showing write triggers received from the north.

FIG. 8 depicts an arrangement comprising an eastward sequence of cells 10a, 10b and 10c, comprising a read operation followed by two ANDs, while write triggers are received from south of the cells. The results of the three writes are in the northwest bits of their respective cells. Furthermore, the northeast (NE) bit of the third cell has the "AND" of the results of the three writes.

Figure 9:
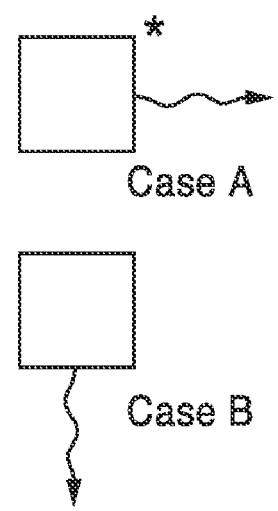
FIG. 9 are depicted triggers being directed either straight or turned, according to aspects of the present invention.

FIG. 9 illustrates a case A in which a trigger goes "straight" (east in this example), or "turns" as shown in case B. For example the trigger goes straight for a logic 1 or the trigger turns for a logic 0. For instance if the trigger is turned it loops back to repeat the "ripple AND" operation.

Section 2

An initial version of a cellular automaton (CA) has been created according to the present invention in which computation is driven by triggers.

FIG. 10 illustrates an embodiment 70 of a portion of a cell array (CA), and depicts a trace showing the progress of a trigger-driven computation within a small triggered CA (depicted by way of example as having 8×8 cells). The highlighted cell at the head of the right-most arrow is currently active. It will be appreciated that multiple computations can be performed simultaneously within a single CA.

A trigger is a single pulse that is used by and generated by a cell. A trigger usually signifies the arrival of a bit of data. Upon receipt of a trigger, the receiving cell generates a new pulse, thus ensuring the integrity (in particular, the duration) of the pulse. The circuitry that generates the trigger is called a trigger generator (TG). The TG delays the production of the new pulse until the circuitry within the cell has had sufficient time to process the input data bit and produce a result. The new pulse is used to latch the result and to trigger an adjacent cell.

2.1 Advantages 2.1.1 Scalability.

Since triggers are cell-to-cell events, no long wires are needed, making triggers scalable for use within any sized cell array. It will be appreciated that because computations proceed in response to triggers rather than to a global clock, the scaling problems are avoided which arise from the use of a global clock.

2.1.2 Minimal Power Dissipation.

Only triggered cells actively compute. The other cells are inactive and are expected to require significantly less power than the active calls. Therefore applications in which only a fraction of the cells are active at a time will exhibit considerably less power dissipation than if all the cells were active.

2.1.3 Simplified Thermal Management.

There may be cells that are subject to heavy use; in response to which the worst thermal case for a given cell can be significantly worse than the typical case. It would be difficult to design the system to safely dissipate the heat generated in a worst case scenario. Accordingly, at least one mode of the present invention is configured for providing an innovative thermal self-management feature which makes the overall system much easier to design. By way of example, the present invention can be configured so that trigger generation are a function of local thermal conditions whereby thermal ramping is mitigated, or heat dissipated, by delaying trigger generation.

2.2 Operational Basics

Triggers are cell-to-cell events by which cellular computations are initiated. A computation in a CA proceeds along paths of cascaded trigger events. A path may include turns, forks, and joins.

FIG. 11A-11E illustrates a set of common trigger functions between cells, with a trigger (FIG. 11A), cascade (FIG. 11B), turn (FIG. 11C), fork (FIG. 11D), and join (FIG. 11E), shown in the figures. It should be appreciated that, in general, the computational paths within a CA may proceed in any direction, fork and join in various places, and occasionally cross. The trigger functions should also support conditional events. By way of further example, other possible trigger events include: fork and join in the same cell, multiple fork, multiple join, turn left, turn right, reverse, and so forth. With so many possible trigger events, it seems that even a minimal set of triggering capabilities would result in more than the desired level of cell complexity. In response to which the present invention makes use of groups of up to four simple cells to implement the trigger functions. The cells can be used individually, or together, depending on what trigger functions are needed.

2.3 Quad Cells

FIG. 12 illustrates an example cell array embodiment 80, showing a plurality of quad cell 82 within the larger array of quad cells. Each cell within a quad cell, or "quad", is part of a group of four cells that support a wider variety of trigger functions than does an individual cell. It should be appreciated that due to the unique circularly segmented nature of these quad cells, the trigger paths can go in any direction from a quad. The interleaved triggers allow computational paths to cross each other. The cells within a quad collaborate to perform turns, forks, and joins. They also share initial configuration functions.

2.4 Cell Architecture

At the core of each cell is a 1-bit logic block (processor), such as with two inputs and two outputs. The following figures depict a progression of cell designs, starting with a 1-bit processor with two inputs and one output, and culminating in a design that includes conditional trigger generation for use in join and operations.

Figure 13:
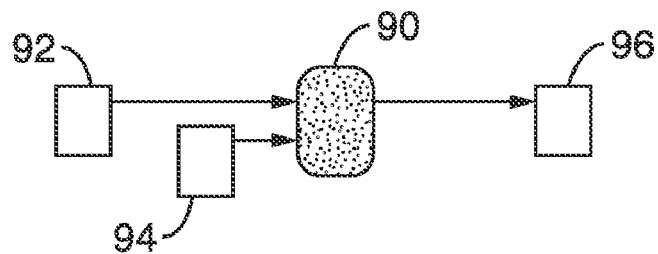
FIG. 13 is a schematic diagram of basic data flow for a one-bit processor having two inputs and a single output according to an embodiment of the present invention.

FIG. 13 illustrates the most basic data flow of a 1-bit processor 90 having two inputs (92, 94) and a single output 96. The two 1-bit inputs are combined to produce a single 1-bit output. A convention used in these diagrams is to show storage elements as sharp-cornered rectangles and processing or combinatorial logic as rounded shapes. The next diagram adds trigger generators as sources for the pulses that cause the storage elements to latch and trigger the next cell.

Figure 14:
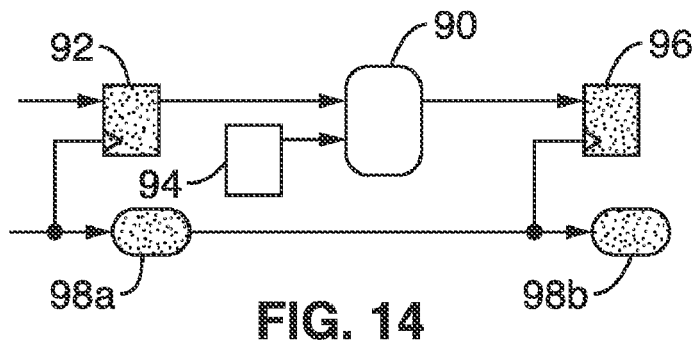
FIG. 14 is a schematic diagram of basic data flow for a one-bit processor having two inputs, a single output, and trigger generators coupled to the inputs and output according to an embodiment of the present invention.

FIG. 14 illustrates an example embodiment having added trigger generators 98a, 98b to trigger the action of the input storage element (e.g., FF) 92 and output storage element (e.g., FF) 96. Otherwise FIG. 14 contains the same 1-bit processor 90, inputs 92, 94 and single output 96 of FIG. 13.

Figure 15:
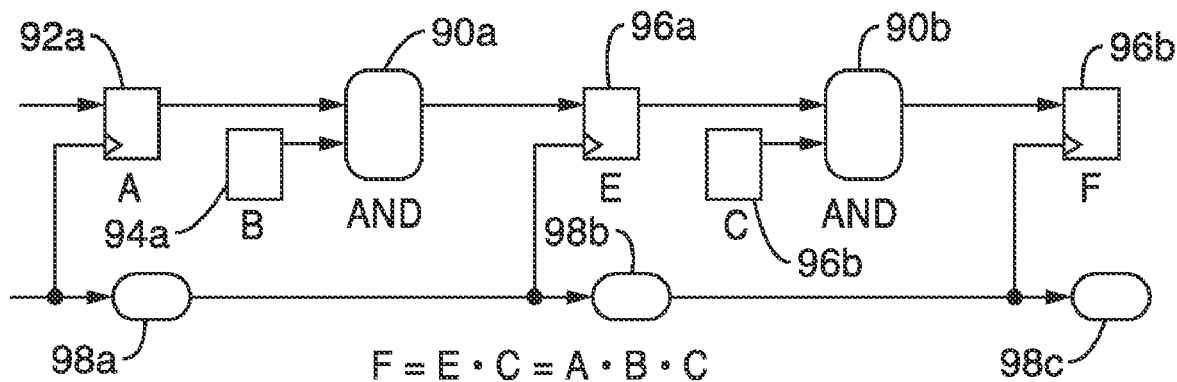
FIG. 15 is a schematic diagram of a short cascade used to evaluate a logical expression according to an aspect of the present invention, showing two of the basic data flows of FIG. 14 connected in sequence.

FIG. 15 illustrates an example embodiment of a short cascade used to evaluate a logical expression. Two of the blocks shown in FIG. 14 are joined, whereby inputs 92a (A), 94a (B) are coupled to a first 1-bit processor 90a, and a second set of inputs 92b (E), 94b (C) are coupled to a second 1-bit processor 90b. As shown, the output of the first 1-bit processor 90a forms the input 92b of the second 1-bit processor 90b. In response to this cascade, the value of block F 96b is evaluated each time a trigger arrives at the lower left input, thus a simple logical expression is evaluated by a short cascade of triggered cells.

FIG. 16-18 depicts a progression of features added to that of FIG. 14 to form the cell utilized within a "quad" according to the present invention. In particular, FIG. 16 depicts adding an internal result 100. FIG. 17 depicts adding a conditional trigger output 102, 104. In FIG. 18 a join 106 (e.g., AND), is added which is an enhanced version of the conditional circuitry 102 of FIG. 17, to which a fork 107 is added. Also in FIG. 18 are included an additional trigger generator 98n, as well as an added trigger regenerator 108. Each of these figures retains the 1-bit processor 90, two inputs 92, 94, single output 96, and some form of trigger generation 98a as shown in FIG. 14.

Figure 19:
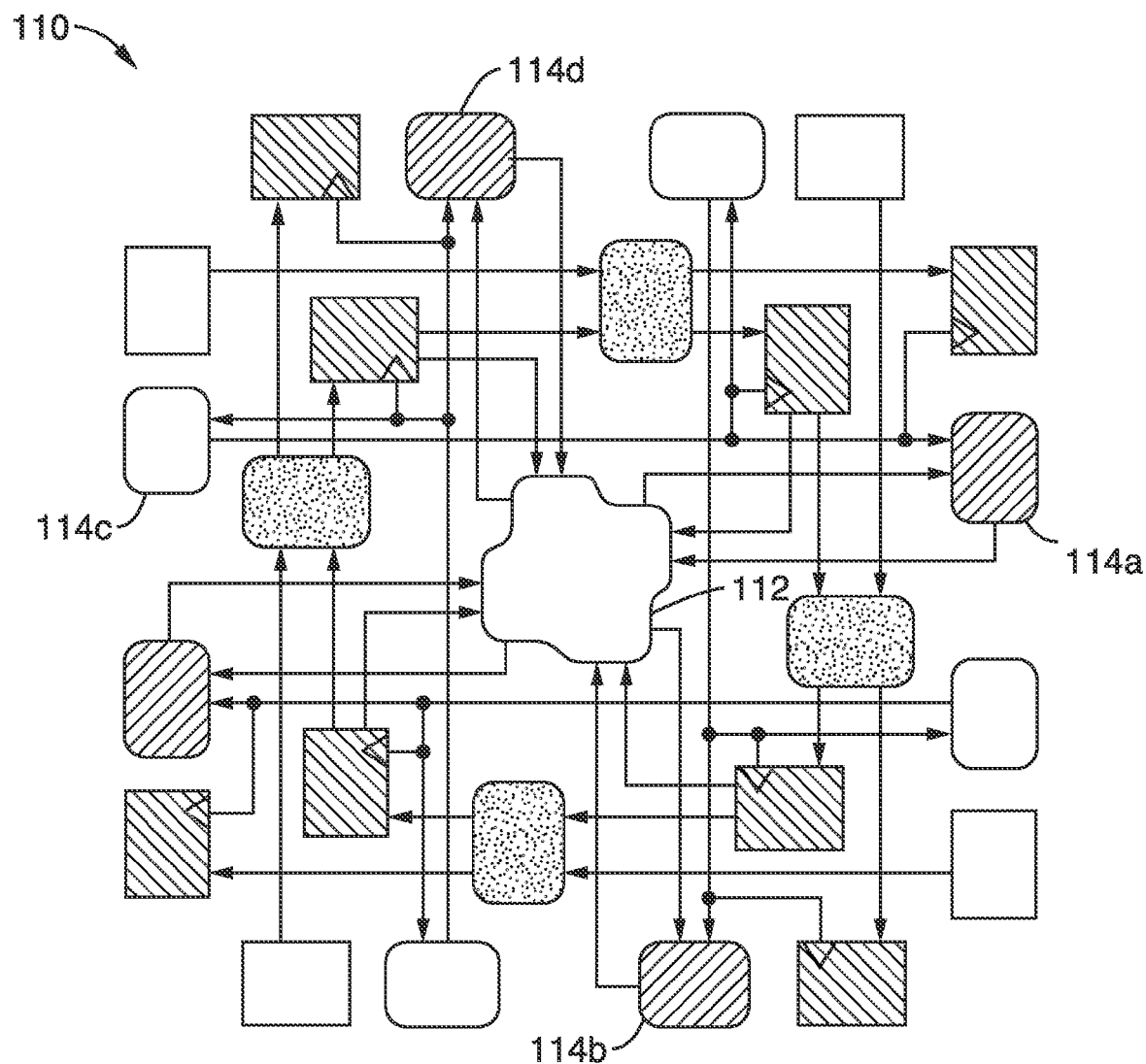
FIG. 19 is a schematic of a quad cell according to an embodiment of the present invention, showing interleaving of rotated one-bit processor structures within a single quad cell.

FIG. 19 illustrates an embodiment 110 of quad cell modeled on the last of the cells shown in the above progression which is used by way of example. Thus, the cell in the figure is formed by interleaving four rotated instances of a single cell.

The structure 112 ("blob") in the center of the cell, is a synchronizer which conditionally activates 0 to 4 of the outgoing trigger generators (TGs) 114a-114d. It is primarily a 4-input AND function. Each input to the AND function is the OR of a configuration bit and the output from an internal state bit. If the configuration bit is a 1, the corresponding TG will then receive its input from its complementary TG on the other side of the cell. If the configuration bit is a 0, the corresponding TG will not receive an input until all the conditions within the quad cell have been satisfied.

2.5 Programming Model

The quad cell architecture is intended to be used to form blocks of logic arranged somewhat like a programmable gate array.

Figure 20:
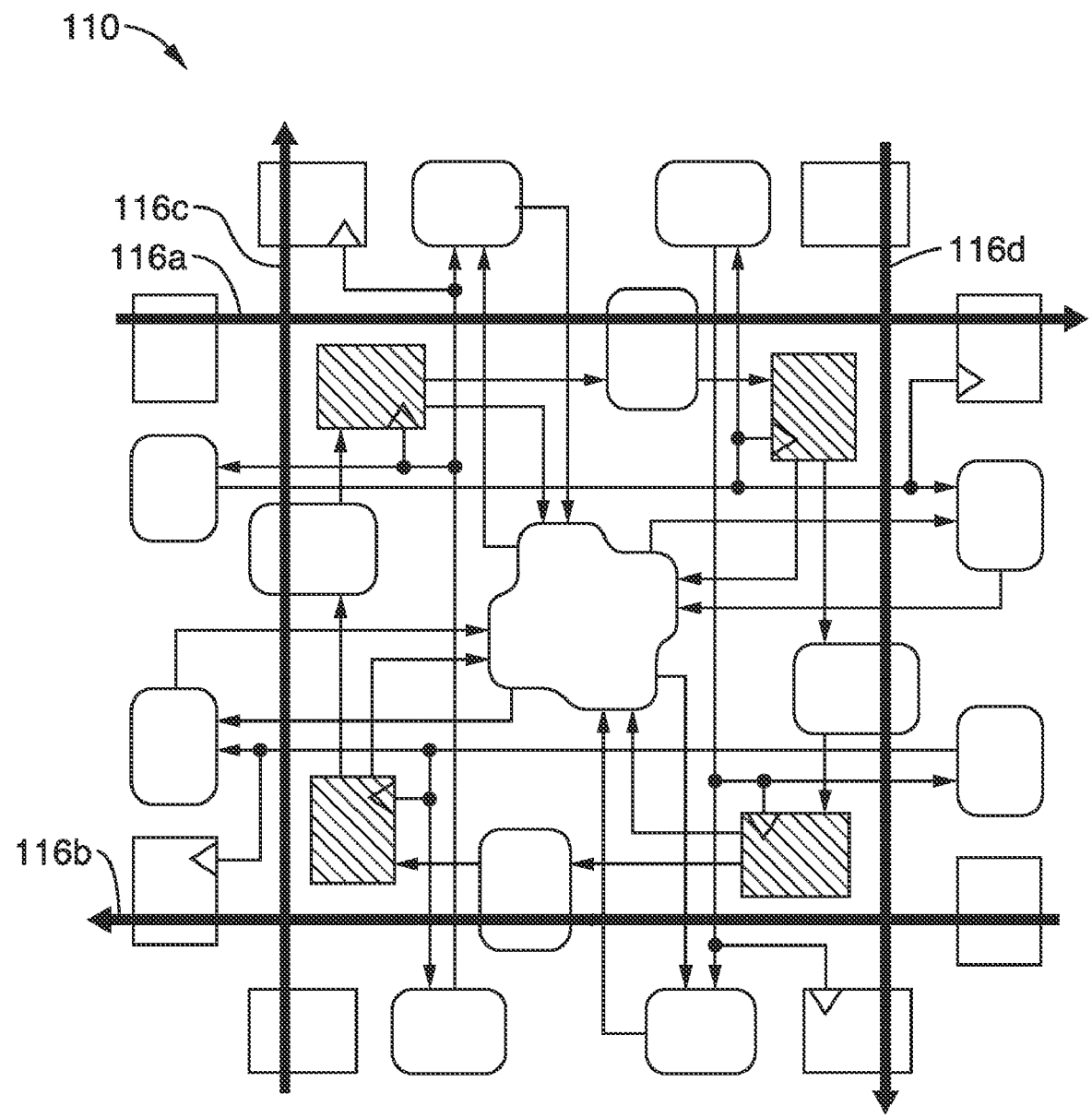
FIG. 20 is a schematic of the quad cell shown in FIG. 19, depicting four directions of trigger flow through the quad cell.

FIG. 20 illustrates by way of example embodiment 110, the general flow of triggers and data through a quad according to the present invention, showing right (east) 116a, left (west) 116b, up (north) 116c and down (south) 116d flows. Although the directions can be referred to with right, left, up, down or compass orientations, they can be labeled with any desired terms without departing from the teachings of the present invention.

Figure 21:
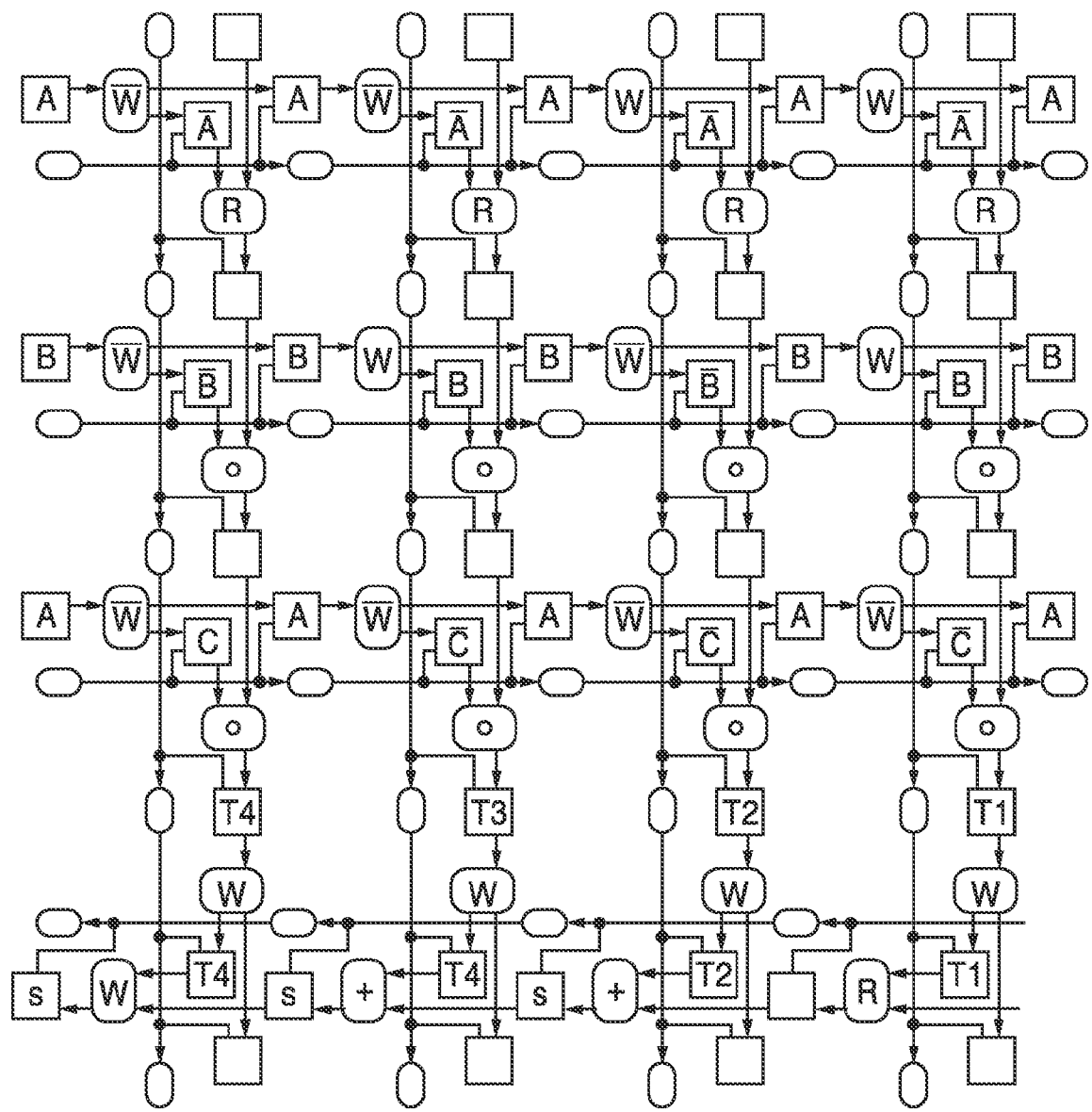
FIG. 21 is a schematic of a one-bit adder implementation according to an aspect of the present invention, showing implementation of the one-bit adder upon a group of one-bit processor cells.

FIG. 21 depicts an implementation of a 1-bit adder with carry input to illustrate how an array of quads can be utilized to implement a logic or arithmetic function. The function is that of a 1-bit adder with carry input. The two bits to be added are A and B, with C being the carry input, and S as the sum.

There are three steps involved in the process. The first step is data propagation. The inputs, A, B, and C, are distributed along the three top rows. Two operations are used: W=write and /W=write complement. It should be noted that the slash "/" preceding a signal name indicates the logical complement of that signal name. The four terms, T1 through T4, are formed by reading a first bit and combining it with two more bits using successive AND operations. For example, the first column forms the term T4=/A·/B·C. The third step combines the terms to compute the sum function S. It begins by reading the first term T1 and combining it with the other terms by using successive OR operations. So S=T1+T2+T3+T4.

FIG. 22A-22B illustrates a 1-bit adder pattern. The quads shown in FIG. 21 were abbreviated to show only the cells that are involved in the computation. In fact, there are just two patterns, each involving two cells, as pictured in FIGS. 22A and 22B.

The storage unit in each pattern (the shaded square) should be noted, as this internal state bit is used to communicate information between crossing data flows. The first pattern shown in FIG. 22A passes data from a left-to-right flow to a top-to-bottom flow. The second pattern shown in FIG. 22B passes data from a top-to-down flow to a right-to-left flow.

2.6 Trigger Routing

Absent from the above examples are the trigger flows, as the focus has been on data flows. However, it will be appreciated that data flows arise only when caused to do so by the triggers. The general directions are simple. It is easy to see how triggers can propagate from left-to-right, top-to-bottom, right-to-left, and bottom-to-top.

FIG. 23 illustrates an example of straight trigger paths in each of four different directions.

Figure 24A:
FIG. 24A-24D are data flow diagrams of different trigger paths within a quad cell according to an aspect of the present invention, showing a straight path, and fork right paths turning 1, 2 or 3 times.
Figure 24B:
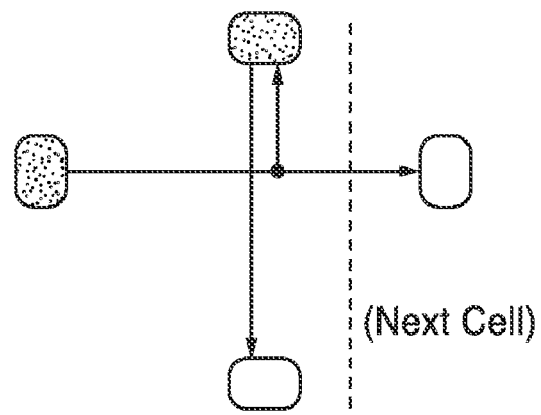
Figure 24C:
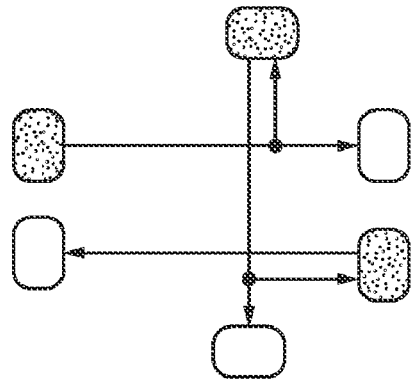
Figure 24D:
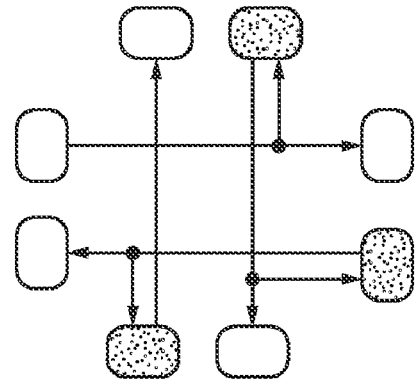

FIG. 24A-24D illustrates four example paths within the quad. FIG. 24A depicts an unconditional path (straight). FIG. 24B represents a straight path and a fork right, accomplished through another TG. By way of example, a dashed line is shown on the right of the figure indicating that the rightmost TG is part of an adjacent cell. It will be seen that the turns can be cascaded. It should also be appreciated that the upper right TG in FIG. 24B must be configured for internal activation. Turns are achieved by having one TG trigger another TG within the same quad. This mechanism is used for right turns. A series of right turns is supported. FIG. 24C depicts two right turns, while FIG. 24D illustrates three right turns. In the quad, the maximum number of right turns is three, because each TG must be configured to be triggered either externally or internally. After three turns, the remaining TG is the one that was triggered externally.

It should be noted that each turn triggers a neighboring cell. Thus, up to four neighboring cells can be triggered in response to a single input trigger. This is how a single computation can split, or fork, into multiple parallel computations.

Figure 25:
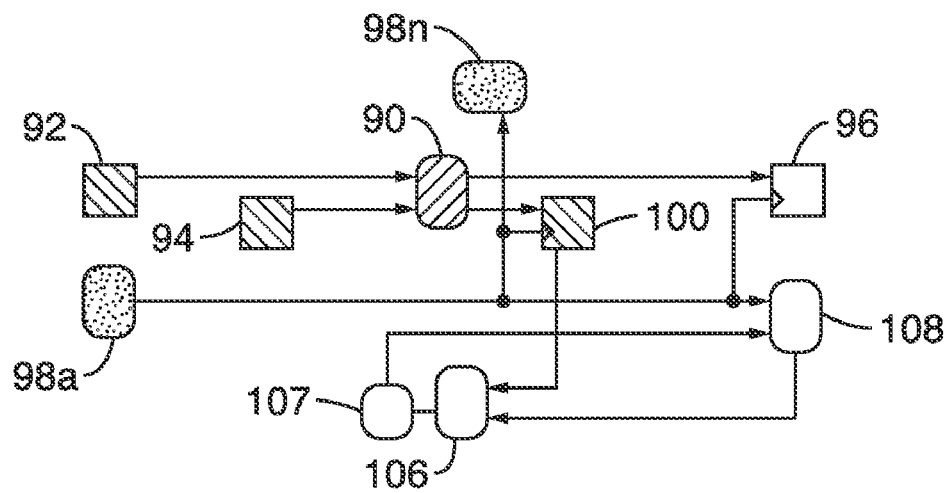
FIG. 25 is a schematic of a one-bit processor cell structure according to an aspect of the present invention, showing an internal state bit which can make a transition in response to the computation.

FIG. 25 illustrates a computation which can cause the internal state bit to make a 0-to-1 transition. This can activate the right TG, depending on how that TG is configured. There may also be dependencies on other cells in the quad (see join). This arrangement is similar to that shown in FIG. 18, with the 1-bit processor 90, two inputs 92, 94, a first output 96, some form of trigger generation 98a, 98n, and internal result storage 100. A trigger regenerator 108 is shown having two inputs, allowing it to select either of these two inputs as an impetus for generating a trigger. (In FIG. 34-35, the selector is separated out). The state of the configuration bit is output from trigger regenerator 108 for receipt by join circuitry 106, such as an AND gate. A fork 107 is shown connected to the output of the join 106. If the cell is participating in the join, then the lower input of trigger regenerator 108 is selected, otherwise the upper input is selected.

Although not used in the 1-bit adder example, general computation requires some form of conditional operation. To support this, a cell can be configured so that its outgoing TG is activated by a 0-to-1 change in its internal storage bit. However, regard must be given to what the other cells are doing, because of how a join is implemented.

Figure 26:
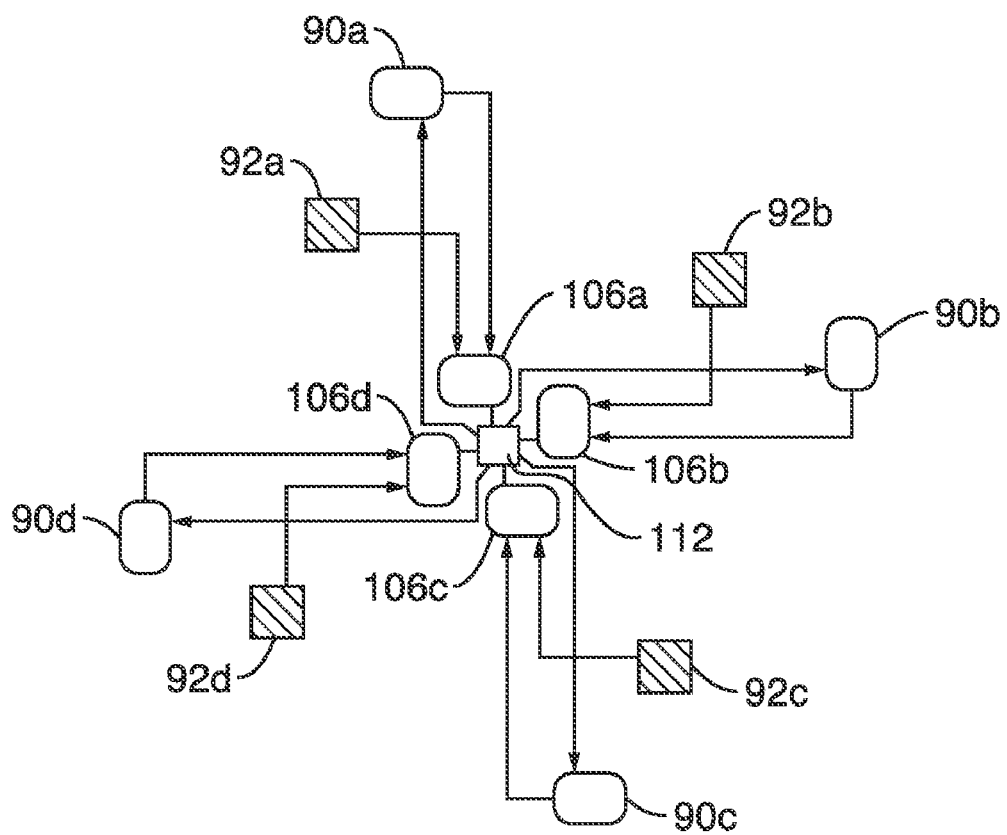
FIG. 26 is a schematic of a portion of a quad cell according to an aspect of the present invention, showing a join performed by combining multiple parallel computations into a single four input AND computation.

FIG. 26 depicts elements involved in a join, and illustrates an example of the details of the configuration of the "blob" shown in FIG. 19. A join complements a fork by combining multiple parallel computations into a single computation. This is supported by a feature of the conditional operation that involves all the cells in a quad. The figure depicts the four-input AND device 112 within the core of the cell, four state bits 92a-92d, four trigger generators 90a-90d, and four ORs 106a-106d. Each of the internal state bits 92a-92d is ORed with a configuration bit associated with TGs 90a-90d in OR element 106a-106d with the results combined by a 4-input AND 112 to generate a TG activation signal. If there is only one conditionally activated TG in the quad, then conditional operations perform as previously described. However, if there are multiple such TGs, then the activation signal is not produced until the last of the relevant storage bits changes from 0 to 1. The described aspects provide a number of novel aspects for use with conformal computing within an array of logic cells.

Section 3

3.1 Introduction to TQ-Cell

TQ-cell (triggered quad cell) is the basic unit of an extensible cellular array according to the present invention. Any number of these cells can be used to make the desired processing unit which is designed as asynchronous, toward providing a fast circuit with low power consumption. The TQ-cell has the capability of performing both conditional and unconditional operations. Moreover all the cell operations can be performed in four directions: north to south (N to S), south to north (S to N), east to west (E to W) and west to east (W to E). Alternatively, these directions can be referred to as up-to-down, down-to-up, right-to-left, and left-to-right, or any other desired designations.

3.1.1 Basic Principles of TQ-Cell Design.

Figure 27:
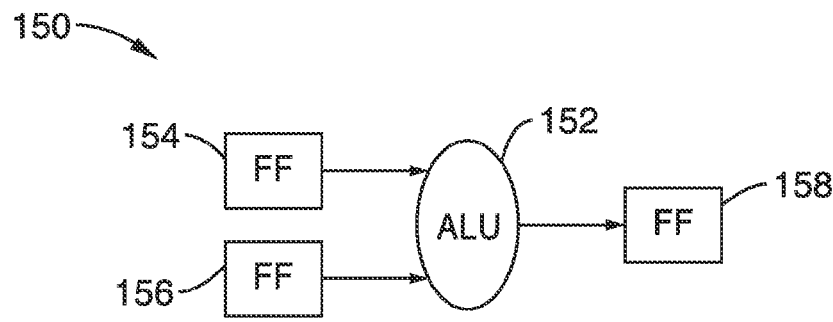
FIG. 27 is a block diagram of a single arithmetic and logic unit (one-bit processor) cell according to an aspect of the present invention.

FIG. 27 illustrates by way of example embodiment a one-bit processing unit 150. It will be appreciated that a very basic one-bit processing unit should at least include an ALU 152, two flip-flops 154, 156 as inputs and one flip-flop as output 158, as is shown in the figure.

The flip-flops should be provided with clocks and they are preferably edge triggered, and more preferably configured as rising edge triggered. However, one of the important goals of the invention is to have an asynchronous processor, so rather than using a global clock, a pulse (trigger) is fed to the flip-flops so that at the rising edge of the pulse the data is latched into the flip-flops.

In forming an array of these one-bit processing units, each unit is preferably configured for reading and/or writing data from its neighboring units. One means for facilitating this interaction within the array of units performing these operations is to retain some input and output flip-flops in common between neighboring units.

Figure 28:
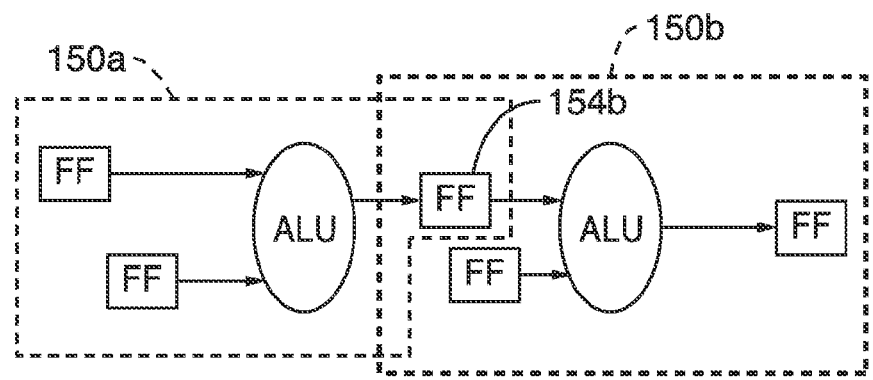
FIG. 28 is a block diagram of two arithmetic and logic unit cells shown in FIG. 27, being connected sequentially with cells indicated in dashed lines.

FIG. 28 depicts two of the one-bit processing units 150, shown as 150a and 150b, shown interconnected with common flip-flop circuits; in particular shown with 154b in common. The other issue in making an array of these units is the direction of operation flow.

Figure 29:
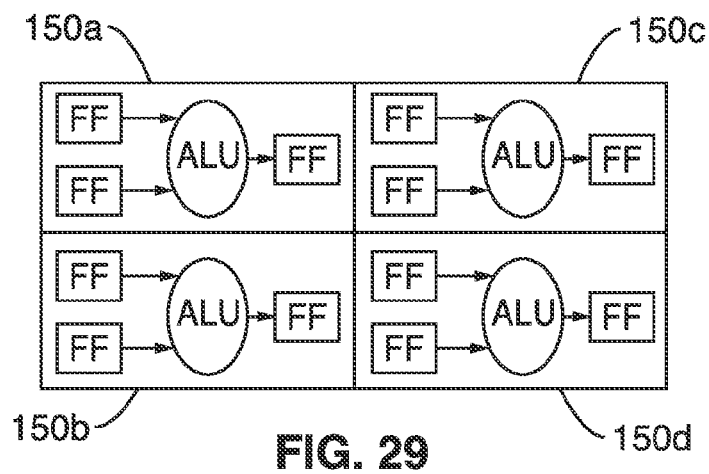
FIG. 29 is a block diagram of four of the one-bit processing units shown in FIG. 27, interconnected in a 2×2 array with common flip-flop circuits that exhibits directional flow limitations.

FIG. 29 illustrates a 2×2 array of one-bit processing units 150a-150d. As can be seen in this example figure, the flow of operations is still constrained to be only from west to east, and as a result each unit can only have a relationship with westerly or easterly neighbors. Therefore, within the present invention it has been recognized that a new connection paradigm is needed to overcome these shortcomings.

Figure 30:
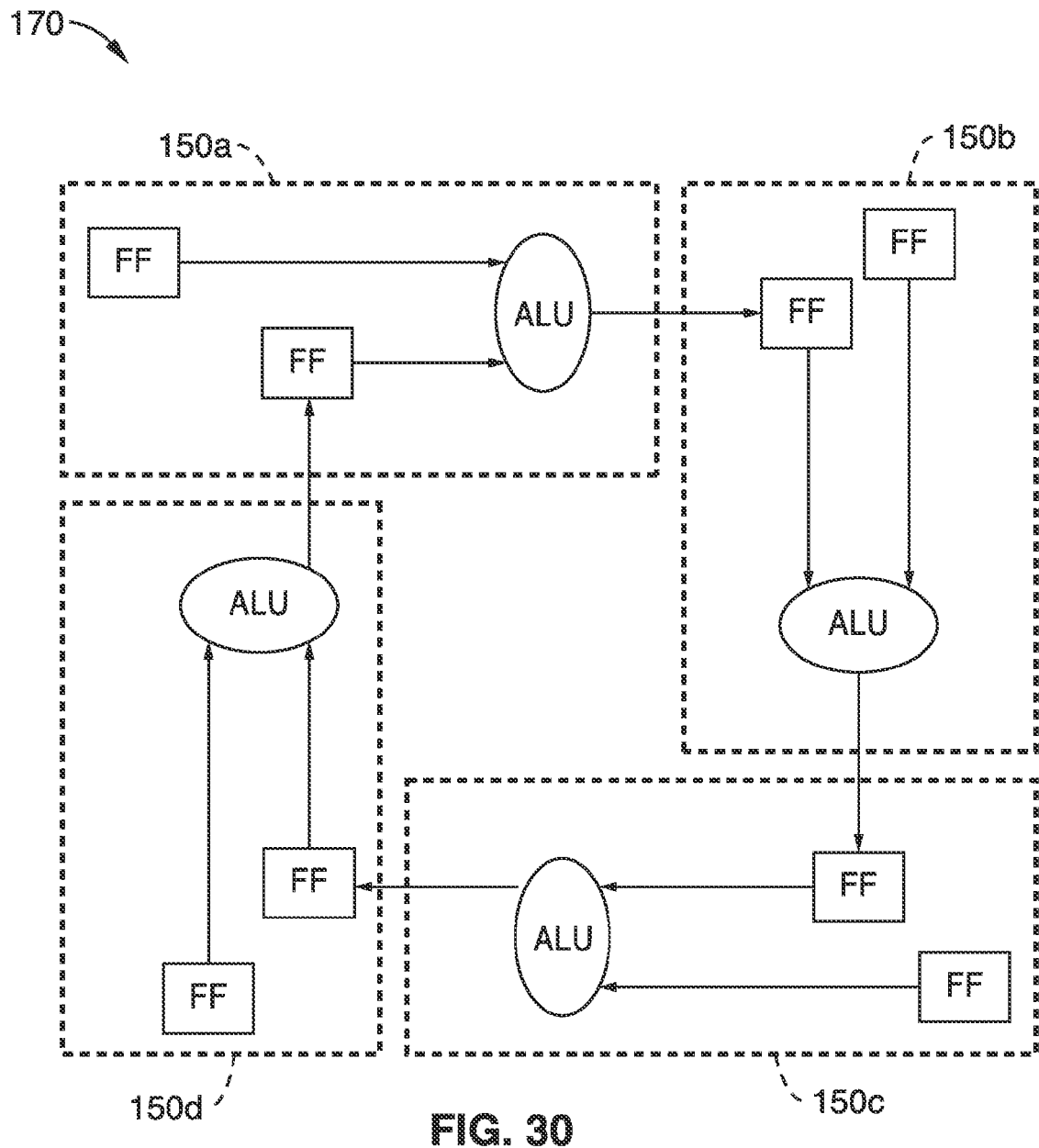
FIG. 30 is a block diagram of a quad cell according to an aspect of the present invention, showing the four one-bit processor cells of FIG. 29 being sequentially rotated and interconnected into the quad cell.

FIG. 30 depicts a one-bit processing unit 170 adapted according to the present invention for interconnecting cells 150a-150d, in four directions to overcome the communication direction problem. The one-bit processing units 150a-150d are circularly coupled spanning across four directions as shown in the figure, and are considering as being a single processing cell; referred to herein as a "quad cell", although it should be appreciated that any desired designation can be utilized without departing from the invention. It will be brought out that creating these macro-cells can do more than just change the level of granularity or quantization; as the structure provides novel organizational aspects which provide a wide range of benefits. In order to communicate with northern, southern, eastern and western neighbors, each cell is provided with flip-flops for inputs and outputs of the ALU in common with its neighbors.

Figure 31:
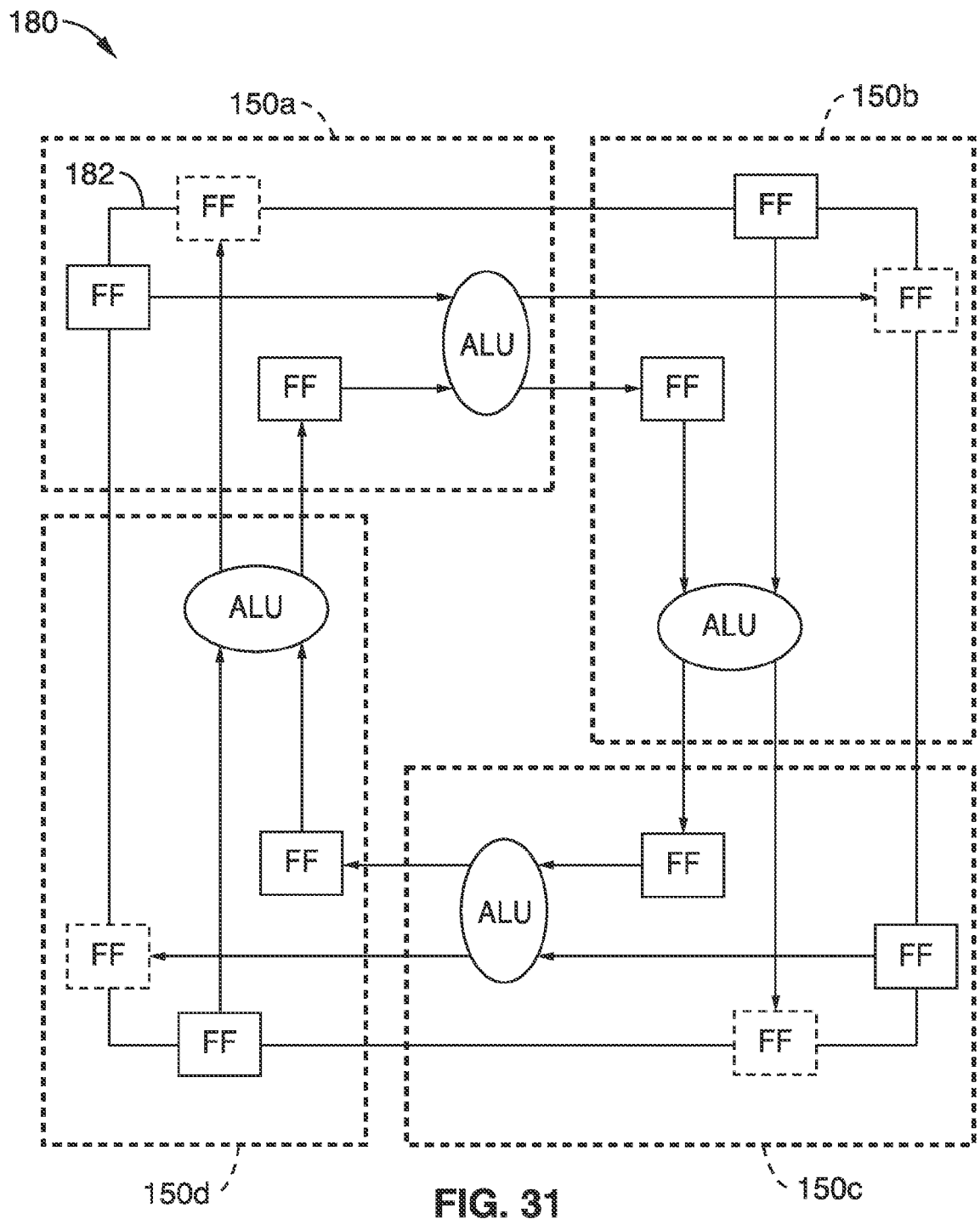
FIG. 31 is a block diagram of a quad cell according to an aspect of the present invention, showing common flip-flops (FF) arranged at the cell boundary to facilitate communicating between neighboring cells.

FIG. 31 illustrates an embodiment 180 of a quad cell configured with common storage elements (e.g., FFs) arranged at the cell boundary 182 to facilitate communication between neighboring cells.

3.1.2 TQ-Cell.

The principles of TQ-cell design have been discussed above, wherein the design can be described in greater detail.

The TQ-cell operates in two different modes:

(1) Initialization mode: In which configuration bits are loaded. This mode will be described in detail later.

(2) Normal operation mode: In which the normal operation of cell is being performed.

The components of an TQ-cell can be categorized in three major sections, A, B and C as discussed in the following.

A. Components in Data Map

Figure 32:
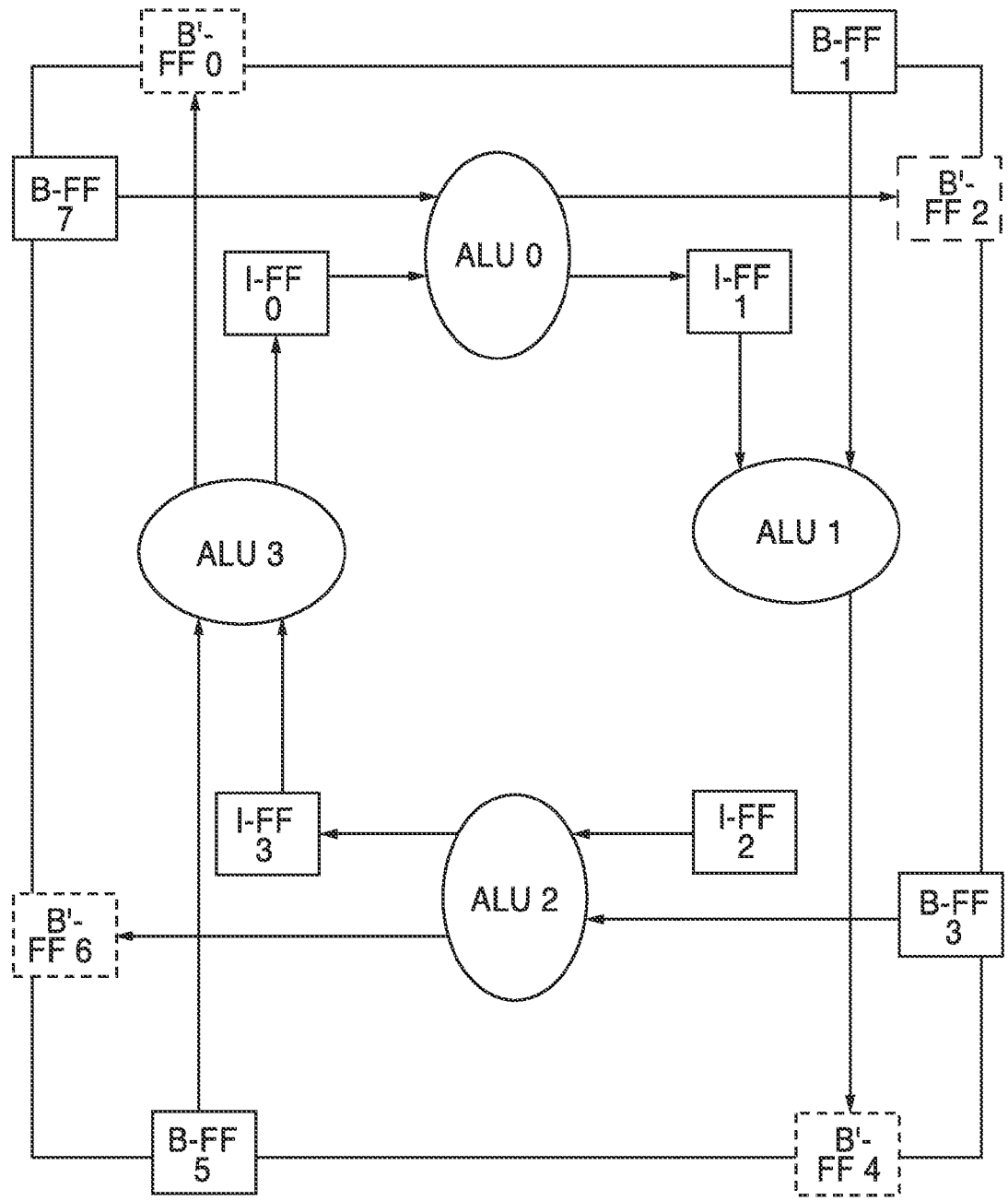
FIG. 32 is a block diagram of a quad cell according to an aspect of the present invention, showing alternate boundary edge FFs contributed from neighboring quad cells.

FIG. 32 illustrates an embodiment 190 of an TQ-cell showing a data map of the cell with ALU_0 through ALU_3, connected with inner FFs (I-FFs) I_FF_0 through I_FF_3 within the inner square between the ALUs, and boundary FFs (B-FFs) B_FF_0 through B_FF_7. It will be noted that the even numbered B-FFs are shown with a dashed periphery, indicating that they belong to the neighboring TQ-cell.

(1) Four inner flip-flops. The states of the four inner flip-flops (I-FF), are defined in initialization mode. During normal operation mode, I-FFs can be read for an ALU operation or can be written responsive to the result from the ALU.

(2) Four boundary flip-flops. The four boundary flip-flops (B-FF) are held in common between the cell and its neighbors.

(3) Four ALUs. The four ALUs are contained within the "quad", and by way of example and not limitation, each ALU preferably performs eight operations including "AND", "OR", "Pass & Shift", "Write & Read", "Pass & Write", "Read & Shift", "Pass and Write complement", and "No operation", although the apparatus can be implemented with more operations, fewer operations, and/or different operations within each of the ALUs without departing from the invention. The operations of ALUs are defined by configuration bits, for example the use of three configuration bits.

FIG. 33A through 33G illustrate, by way of example, implementations of each of these eight example ALU operations, showing: pass and shift, write and read, pass and write, read and shift, pass and write complement, AND, as well as OR.

B. Components in Trigger Map

Figure 34:
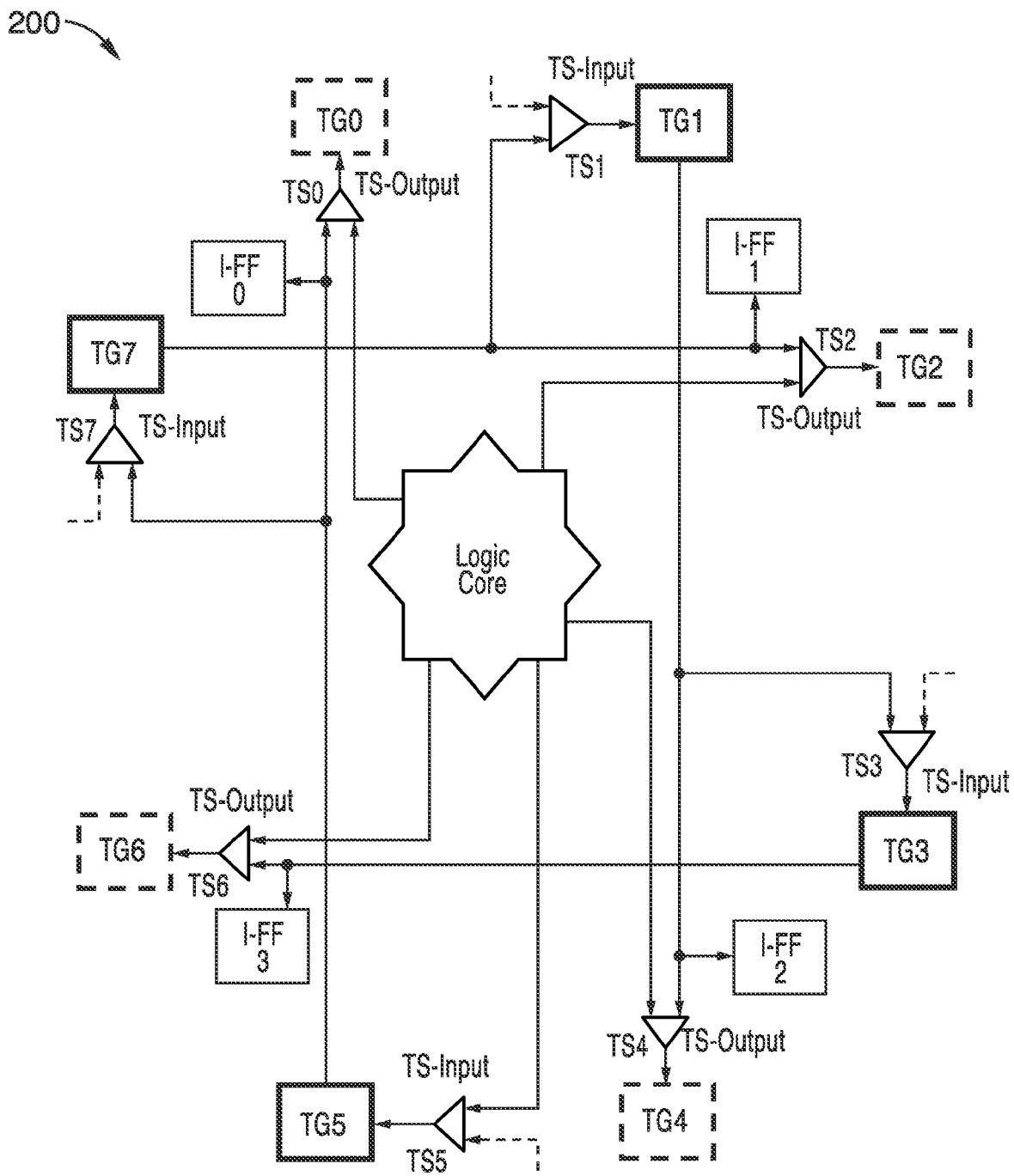
FIG. 34 is a block diagram of a triggering within the quad cell according to an aspect of the present invention, showing inclusion of trigger selecting blocks.

FIG. 34 illustrates a trigger map of an TQ-cell embodiment 200, shown with logic core, and trigger generators (TGs) belonging to the TQ-cell (TG1, TG3, TG5, TG7), and TGs shown with dashed periphery (TG0, TG2, TG4, TG6) that belong to the neighbor of the TQ-cell. In addition, trigger selecting (TS) inputs (TS0-TS7) are shown with the triangular symbols configured for selecting which signal is received by the TGs. The quad is thus represented having four each of TGs, TS-Inputs and TS-Outputs as follows.

(1) Four trigger generators (TG) in the quad, not counting the TGs of adjacent quads.

(2) Four input trigger selecting blocks (TS-Input). These blocks decide whether the input trigger should proceed in a straight path, make a turn or both to perform a "fork". This decision is made, such as by one configuration bit per block in TS-Config.

(3) Four trigger selecting blocks (TS-Output). These blocks decide whether the output trigger can go out of the cell unconditionally or conditionally. This decision is made, such as by one configuration bit (TS-Config) in initialization mode.

C. Components for Initialization Mode

Figure 35:
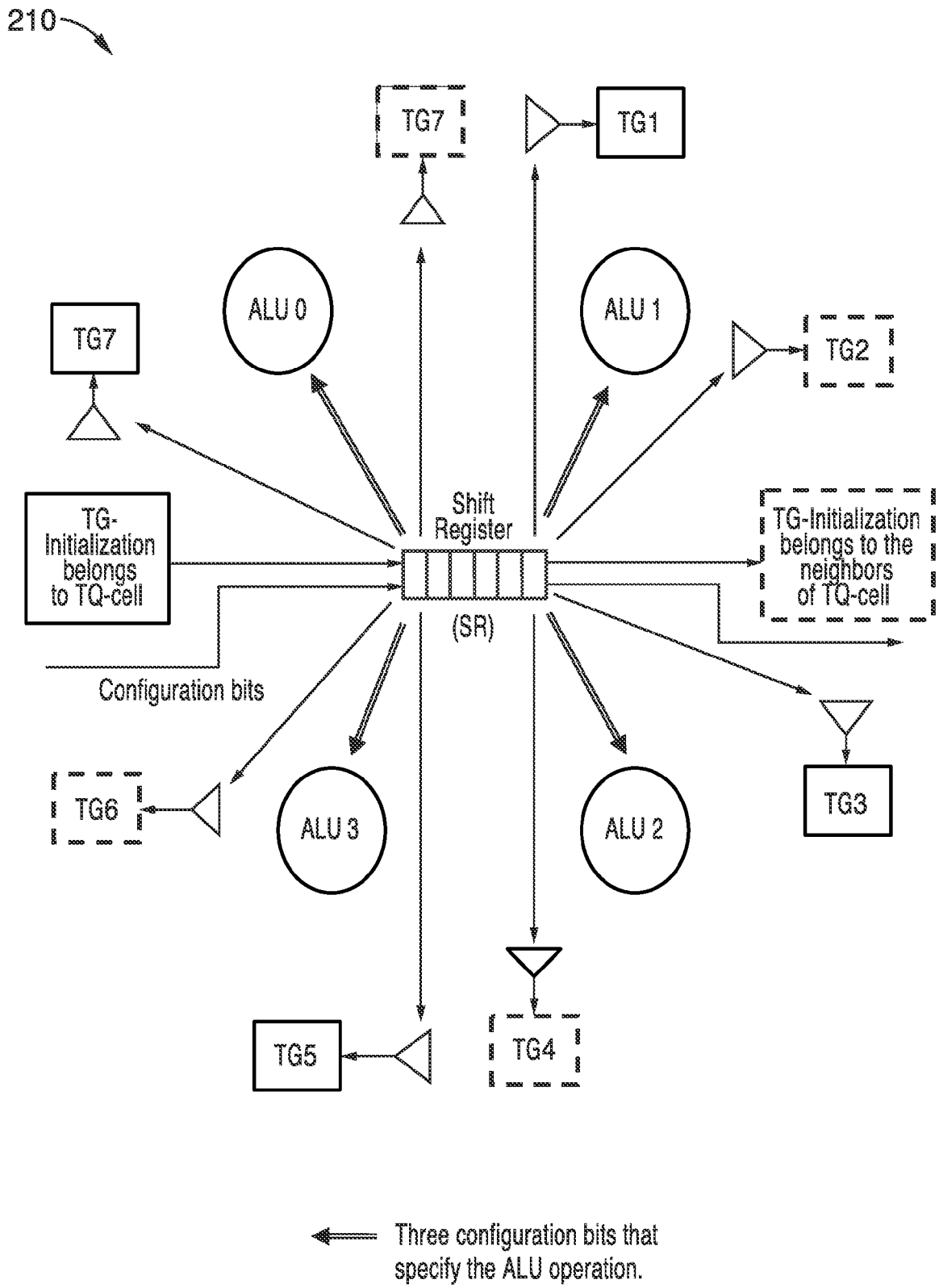
FIG. 35 is a block diagram of initialization within a quad cell according to an aspect of the present invention, showing how initialization data can be loaded for controlling circuit elements in the quad during initialization.

FIG. 35 illustrates an initialization mode embodiment 210 in which a central shift register (SR) is shown at the center for controlling the process. TG-Initialization is shown with Trigger generators (TG1, TG3, TG5, TG7) that belong to the TQ-cell, while TGs that belong to the neighbors of the TQ-cell are shown with dashed periphery (TG0, TG2, TG4, TG6). The narrow arrows extending from the shift register represent TS-Config bit settings in which one configuration bit is used for controlling select lines for TS. The wide arrows from the shift register (SR) indicate configuration bits (e.g., 3 bits to specify up to eight ALU operations) are directed at each of the four ALUs in the quad to specify ALU operation. Configuration bits are thus contained and loaded in response to the following.

(1) A shift register for retaining the configuration bits.

(2) One trigger generator (TG-Initialization) that is used for triggering the shift registers to load configuration bits.

3.2 Trigger Operation

As mentioned previously, the TQ-cell of the present invention operates asynchronously. So instead of utilizing a global clock to synchronize the operations, asynchronous triggers are used. A trigger is a pulse with a minimum width that is defined by considering the propagation delays of gates. All of the operations are preferably performed at the rising edge of the trigger. If the trigger entering a cell were simply passed along to the neighboring cell, it would become distorted as the leading and trailing edges can propagate at different rates. Thus, the diminishing length of the trigger pulse would readily become too short for triggering cell operations. Therefore, in most applications it is necessary to regenerate the pulse before passing it to the next cell.

To meet this requirement, four TGs are provided in each direction (north, south, east and west) of the cell. Trigger generator design is described in detail in a later section.

Each trigger generator receives its input from either inside or outside of the cell. The inside sources can be a conditional or an unconditional regenerated trigger. According to the position of the cell in an array of cells, the outside sources can be either array inputs or neighbors of the cell. It should be noted that if the cell is located on the boundary of the array, trigger sources will be array inputs; otherwise, the triggers come from neighboring cells.

From the above discussion, it is obvious that in each direction two TSs should be provided. One set is used to decide the choice of inputs for trigger generator by means of "one configuration bit" as in Table 1 showing TS configuration bits.

These configuration bits determine whether the cell passes the trigger, such as in a straight path, or causing it to perform a 90-degree turn, or causing it to perform a "fork".

The other set of TSs are utilized to send the trigger signal out of the cell conditionally or unconditionally. In performed conditionally, the condition can be defined, such as upon the result of one, two, three or all of four ALUs. This decision is made in response to another bit of configuration as reflected in Table 2, showing by way of example and not limitation, TS-Config bits for TS-output.

3.2.1 Trigger Selecting Block (TS)

Figure 36:
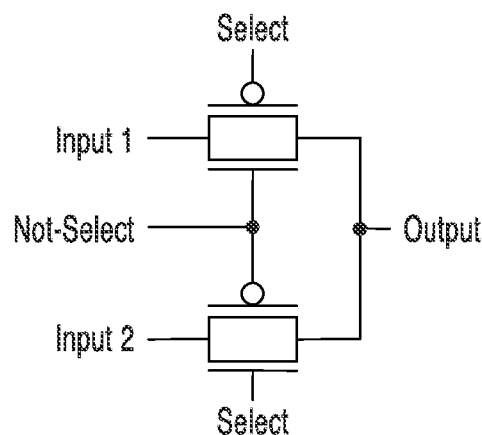
FIG. 36 is a schematic of a multiplexer implemented with transmission gates according to an aspect of the present invention to implement a trigger selecting block.

FIG. 36 illustrates a multiplexer implemented with transmission gates to implement a trigger selecting block (e.g., the two-input multiplexer). The multiplexers can be easily formed using transmission gates as shown in the figure. A first input (Input 1) and a second input (Input 2) are shown with a select (Select) and its complement as not-select (Not_Select) signal. In response to the state of the select signal, either Input 1, or Input 2 is directed to the output (Output).

3.2.2 Trigger Generator (TG)

Figure 37:
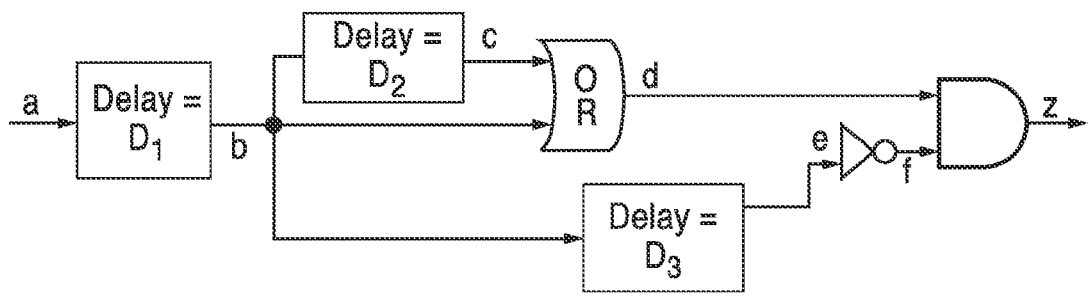
FIG. 37 is a schematic of a trigger generator circuit according to an aspect of the present invention, showing an example of trigger pulse timing and control circuits.

FIG. 37 illustrates a trigger generator circuit showing a $D_1$ delay which determines the delay between input and output pulses, therefore it should be of sufficient duration so that the operation of cell completes. The $D_2$ delay provides an amount of delay by which the delayed input pulse will be stretched, so that generation of an output pulse is not prevented by receiving an input pulse that is too narrow. The $D_3$ delay determines the width of the output pulse. Signal "a" passes through $D_1$ delay to node b. Signal at node "b", is directed in parallel with a signal through a $D_2$ delay at node "c", through an OR gate whose result shows up on node "d". Signal at node "b" is also delayed by $D_3$ delay to node "e", and inverted to node "f". Finally, the signals from node "d" and node "f" are ANDed to produce the signal at node "z". In addition, $D_1$ could be made longer to allow for heat dissipation and can be adjusted as a function of locally monitored temperature in a manner known to those skilled in the art.

The trigger generator is configured to generate the output pulse when the current ALU operation is completed and the FFs arrive at a valid output. The width of the generated pulse should be independent of the falling edge of the input pulse. In other words, the width of the input pulse should not affect the generated pulse.

There are some important timing issues, which should be considered in this design. Suppose the width of the input pulse is $W_a$, and it is delayed by the amount of $D_1$, producing a delayed pulse having a width $W_b$. Under non-idealized conditions, $W_a$ and $W_b$ will not be necessarily equal. The output pulse of the OR gate has width $W_d$ and the pulse periods are represented as T.

At first, all gate propagation delays in the circuit (including AND, OR, NOT) are assumed to be negligible and are ignored. The timing constraints are listed in Table 3. Detailed information of the equations and timing diagrams are provided in a later section on TG Timing Issues without Propagation Delays.

Thereafter, the gate propagation delays (AND, OR, NOT in FIG. 37) are taken into consideration, while the other assumptions remain the same. The new timing constraints are listed in Table 4. Detailed information on the equations and timing diagrams are provided in a later section describing TG Timing Issues with Propagation Delays.

3.3 Conditional Operations

As mentioned in a prior section, the cell is facilitated by one configuration bit in each direction, such as in each of four directions for a preferred embodiment of a quad cell according to aspects of the invention, for specifying what TS output does. In the example embodiment there exists four configuration bits for controlling output, and four configuration bits for controlling input, for each TQ-cell. This one bit in each direction is configured in initialization mode. Then it will decide whether the current operation is conditional or not as can be seen in Table 2.

In each direction, if TS-Config is '1' then the ALU does its normal operation and so does TG. The trigger generator will regenerate the incoming trigger and pass the regenerated trigger according to the other set of TS-Config bits. If the TS-Config is '0', the ALU operation is conditional; therefore, the result of the operation, which is stored in I-FFs influences the trigger paths. It means the regenerated trigger that comes out of TG will be blocked and cannot be passed any further until the result of the ALU operation is defined. As shown in Table 5 if the result of the ALU operation is '0', then no trigger will go out of the cell in that direction. However, if the result of the ALU operation is '1', the condition is satisfied and another trigger will be generated and passed out of the cell.

3.4 Join Operation

Having in mind the above mechanism for conditional operation, a join of triggers is also implemented within the present invention. As explained so far, for each TQ-cell there are trigger inputs and outputs in four directions, so at any time up to four triggers may arrive at the cell. These triggers can be managed conditionally in a way that they can only leave the cell when the condition in two, three or four directions is satisfied. In this way the incoming triggers will be blocked until all the desired conditions are met, then another trigger will be generated and conducted to the desired output. Therefore, it seems that the cell gets several triggers, joins them, and sends the output trigger conditionally.

Figure 38:
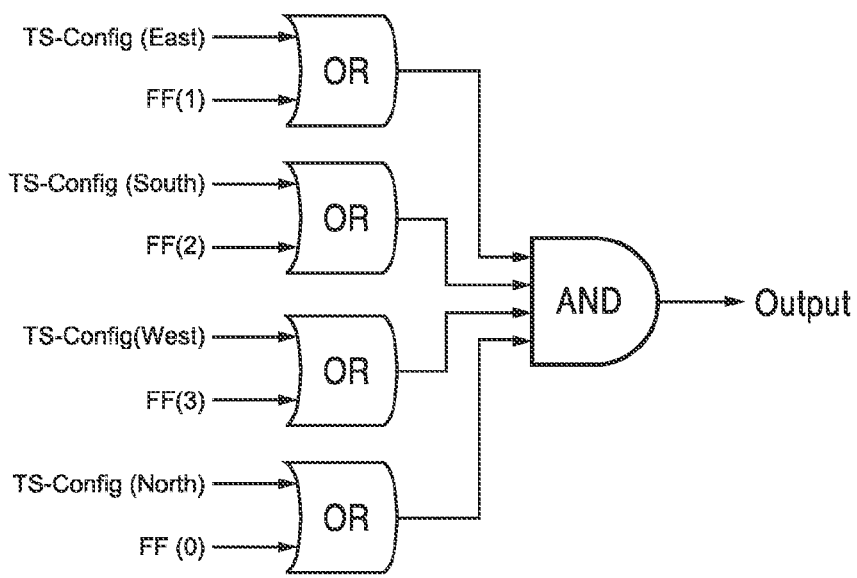
FIG. 38 is a schematic of a circuit for conditional and join operations to manage triggers arriving from each of four directions, according to an aspect of the present invention.

FIG. 38 illustrates by way of example, a circuit for conditional and join operations which manages the triggers according to Tables 2 and 3. In this figure a TS-Config is seen arriving from each of four directions, which is ORed with FF1, FF2, FF3 and FF0, respectively. Output from the four OR gates are ANDed to produce an output (Output).

3.5 Initialization Mode

The present invention may utilize a number of different means for loading configuration bits to each cell of the array. The following is provided by way of example and not limitation: (a) shift registers and non-volatile memory can be utilized so that the data can be restored from the memory in case of power cut; (b) photodiodes; (c) shift registers, and so forth.

One preferred approach is that of using chains of shift registers, placed symmetrically around the cell; for example five bits long on each side. The shift register performs each shift upon receiving a trigger from a trigger generator (TG-Initialization) (as seen in FIG. 35) provided for this purpose, rather than using a global clock.

Figure 39:
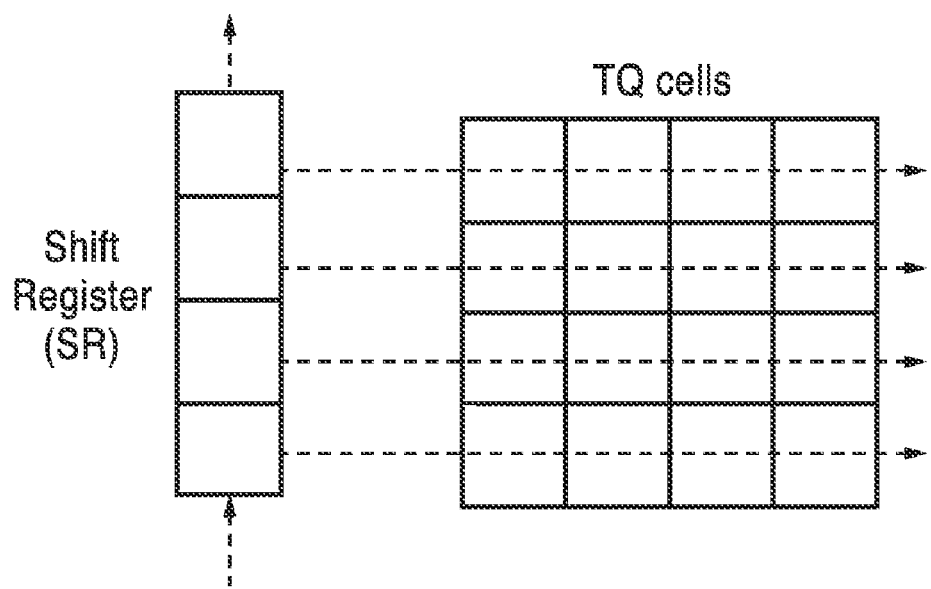
FIG. 39 is a block diagram of a shift register (SR) feeding configuration bits to an array of TQ-cells according to an aspect of the present invention.

FIG. 39 illustrates a shift register (SR) feeding configuration bits to an array of TQ-cells, it will be appreciated as shown in the figure, that all the rows of the array can be initialized simultaneously.

It is preferably that all of the ALUs (e.g., 12 bits for each TQ-cell), TS-Config bits (8 bits for each TQ-cell) and state of the I-FFs should be initially configured. The initialization is preferably accomplished in the following steps.

Step 1: All ALU and TS-Config bits should be configured so that in the next step the state of I-FF can be written from B-FFs.

Step 2: The states of all I-FF are loaded.

Step 3: All ALUs and TS-Config bits are initialized to provide the normal operation of the cell.

3.6 TG Timing Issues without Propagation Delays

This section is directed at timing issues of the TG while neglecting the propagation delays of the gates. Suppose the width of the input pulse is $W_a$. This pulse is delayed by the amount of $D_1$. Then the delayed pulse has width $W_b$. In non-ideal conditions, $W_a$ and $W_b$ will not necessarily be equal.

If $W_b$ is less than $D_3$, the timing of the falling edge of the output pulse is determined by the falling edge of the input pulse and the output would be very close to $D_3$. It is significant to make sure that the generated pulses are longer than $D_3$. Therefore, the input pulse should be made somewhat longer. One way to do that is to OR it with a delayed copy of itself. However, the copy must be delayed by less than the pulse width.

$$\text{If } W_b > D_2 \text{ then } W_d = W_b + D_2 \tag{1}$$

It will be appreciated that in Eq. 1, the pulse is stretched by $D_2$.

Figure 40:
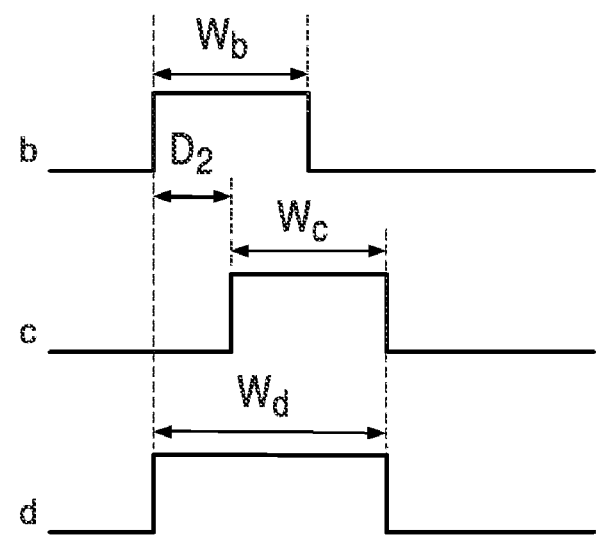
FIG. 40-47 are timing diagram of different trigger generator timing issues considered according to aspects of the present invention for the example trigger generator timing circuit of FIG. 37.

FIG. 40 illustrates trigger generator timing issues, showing timing relationships between signals "b", "c" and d of FIG. 37.

According to at least one implementation, in order to avoid the extra unwanted pulse in the output, the following condition must be met.

$$W_b + D_3 > W_d, \text{ hence } W_b + D_3 > W_b + D_2 \tag{2}$$

where Eq. 2 leads to $D_3 > D_2$.

Figure 41:
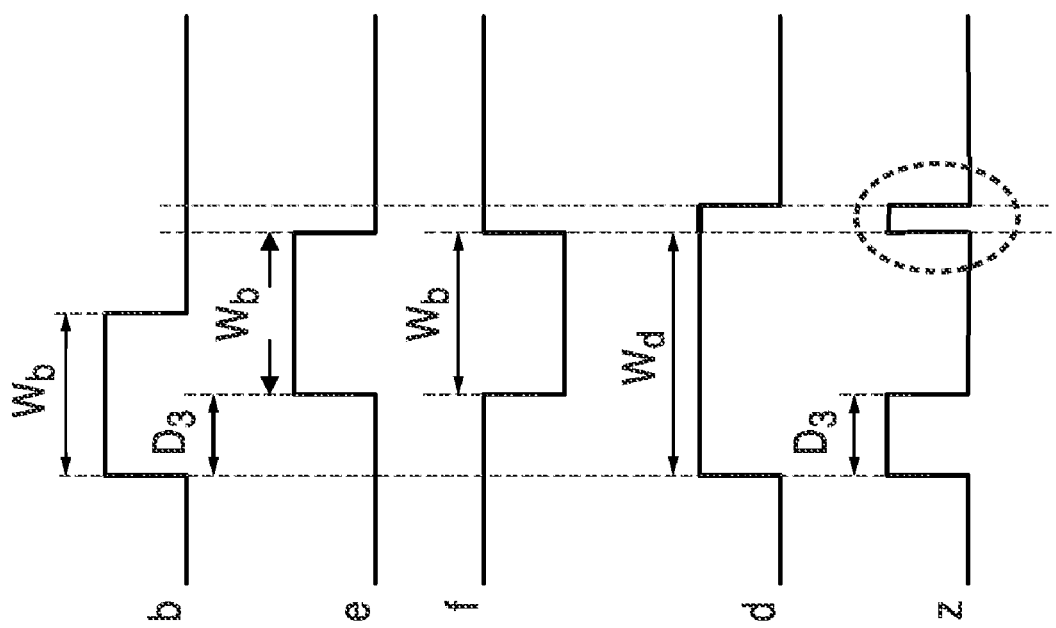

FIG. 41 illustrates that if $D_3$ is much longer than $D_2$, then the falling edge of output pulse "z" will be dependant on signal "d" instead of "f", as shown in the timing diagram. Therefore, it is necessary in this implementation that $W_d > D_3$, in other words the following condition must be met:

$$W_b + D_2 > D_3, \text{ so } W_b > D_3 - D_2. \tag{3}$$

Figure 42:
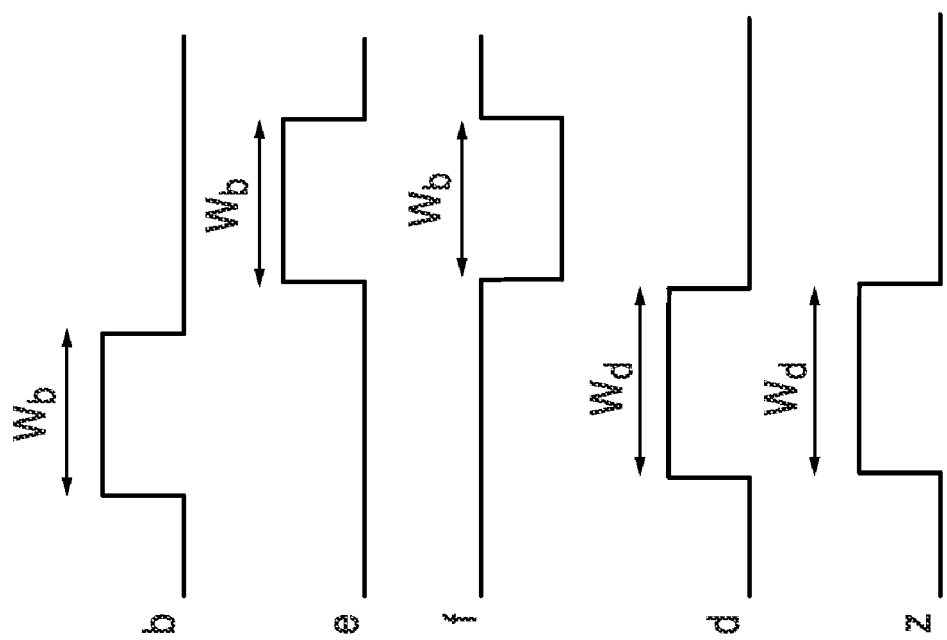

FIG. 42 depicts the important of maintaining a minimum time between two triggers. If the minimum time is not kept properly, the next pulse will be missed partially or completely.

Figure 43:
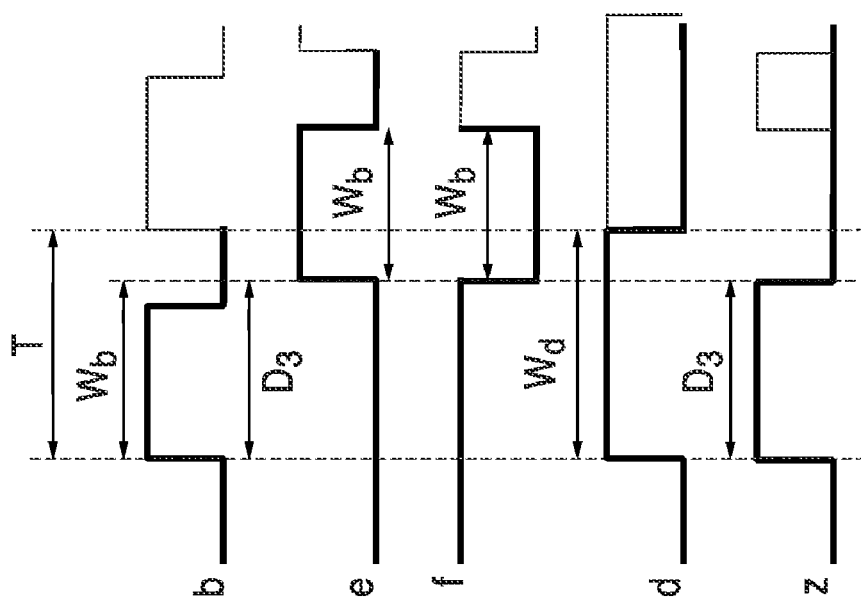

FIG. 43 depicts the result of missing the next pulse, in some parts of the second regenerated trigger is missed and does not show up in the output.

To have each regenerated pulse complete properly, the following condition must be met.

$$T > D_3 + W_b. \quad (4)$$

It is very useful to have an estimation of the period, which should be adjusted for triggers, proportional to their widths. If $W_b$ is considered equal to 'W', which is our desired width for triggers, $D_3$ is chosen to be W and $D_2$ to be W/2 then, according to Eq. 3 $W_b > W/2$. Also based on Eq. 2 and Eq. 3, $D_2 < D_3 < D_2 + W_b$, so $0 < D_3 - D_2 < W_b$ and it results in $0 < D_2 < W$. Finally, Eq. 4 requires $T > D_3 + W_b > 3W/2$.

Considering Eq. 1 and Eq. 2 simultaneously bring up the condition in which $W_b$ can be limited to $W_b < D_3 + \delta$, then $T > 2D_3 + \delta$. If $\delta = W/2$ then the period of triggers can be adjusted to $T > 5W/2$.

3.7 TG Timing Issues with Propagation Delays

This section is directed at timing issues of TG which includes considering the propagation delays of the gates. The initial assumptions remain the same, as in the prior section.

Referring back to FIG. 37, a trigger generator (TG) was shown by way of example and not limitation. For the sake of simplicity, the propagation delay of the NOT gate (inverter) will be included in the $D_3$ delay, making it a $D_{3'}$ delay. This means $D_3$ will be $D_{3'} = D_3 - PD_{NOT}$. The propagation delay of the AND gate appears between input and output pulses of TG circuit. As can be seen in FIG. 37, delay $D_1$ is used to determine the delay between input and output pulses. Therefore, these two delays can be combined together to make a new $D_1$ delay, which can be defined as $D_{1'} = D_1 - PD_{AND}$.

Figure 44:
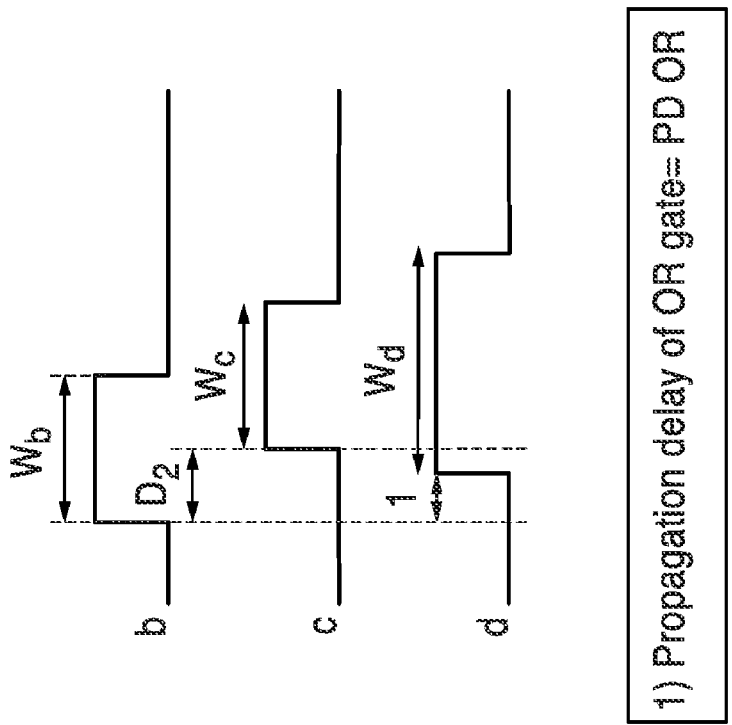
Figure 45:
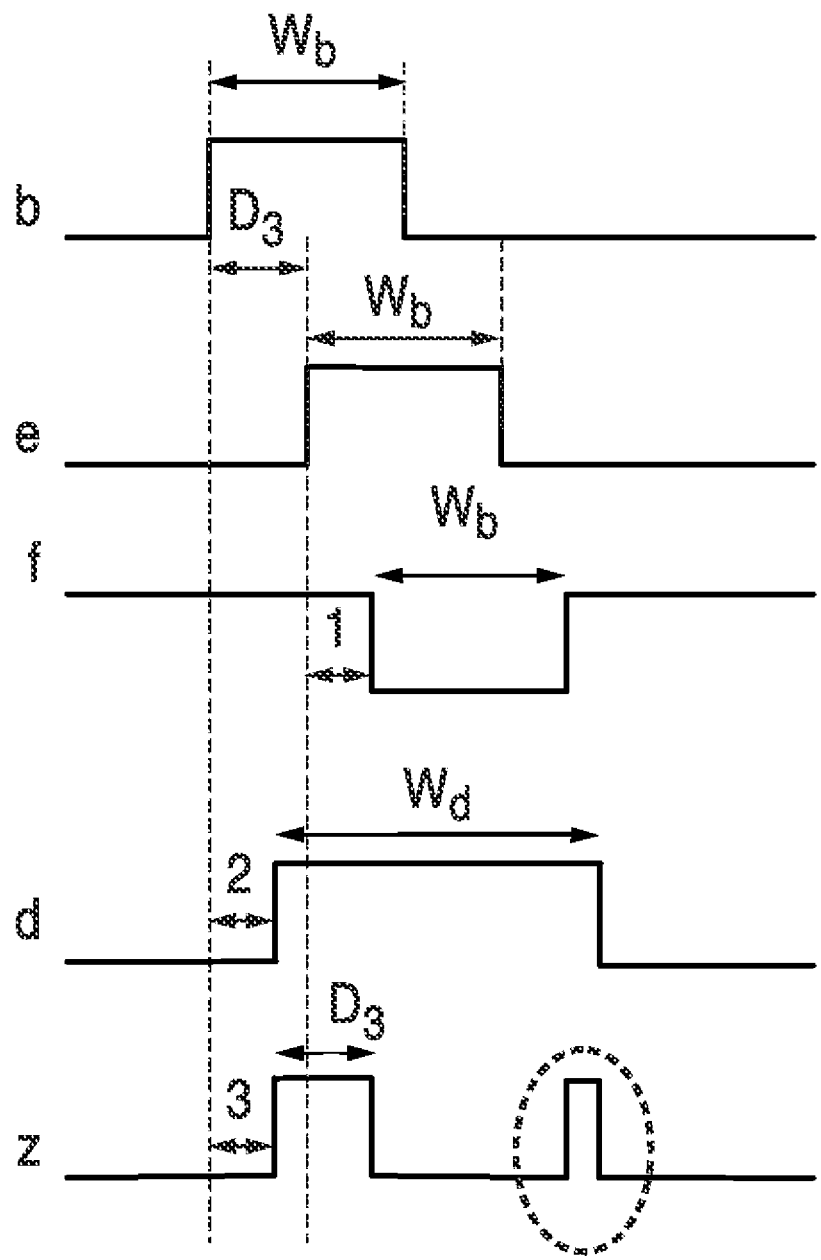
Figure 46:
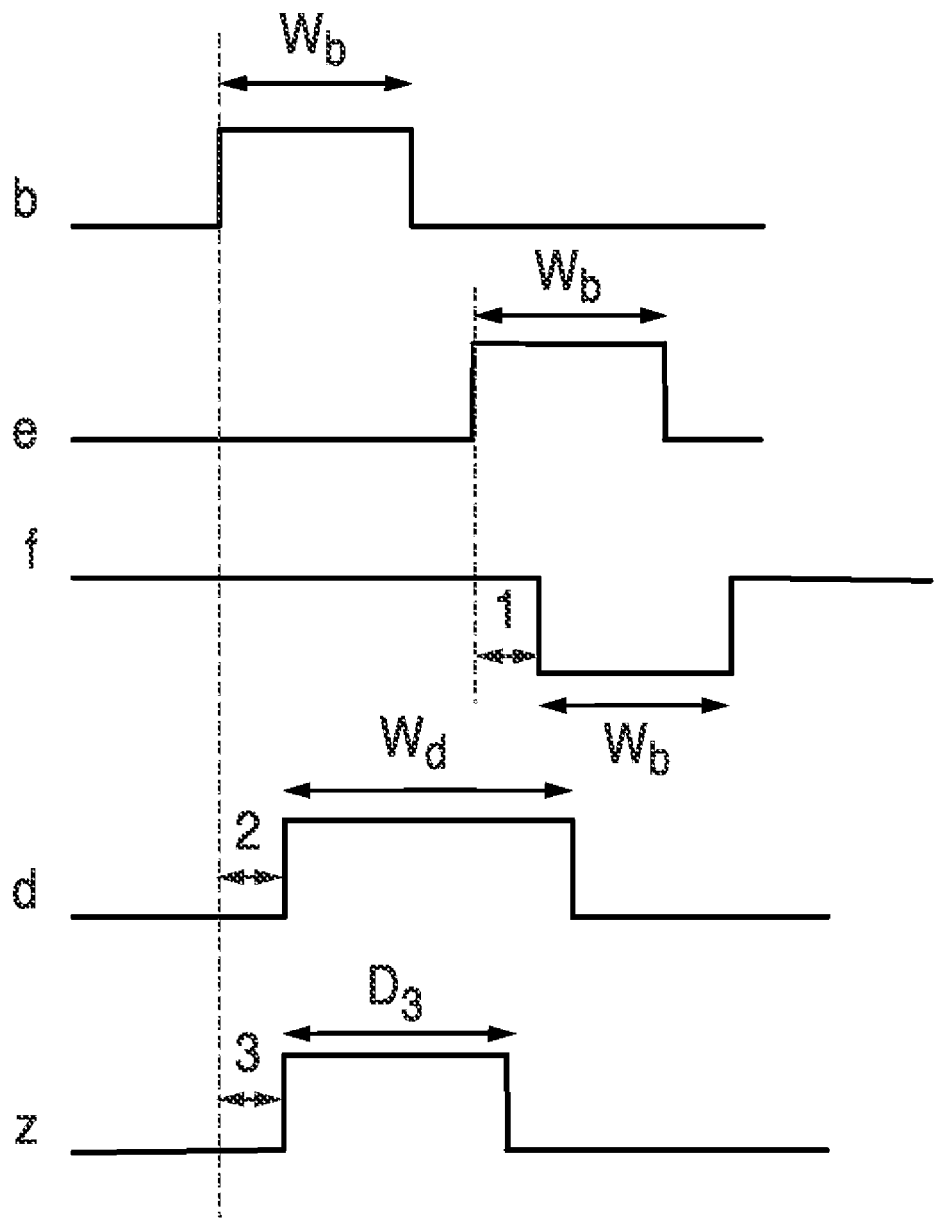
Figure 47:
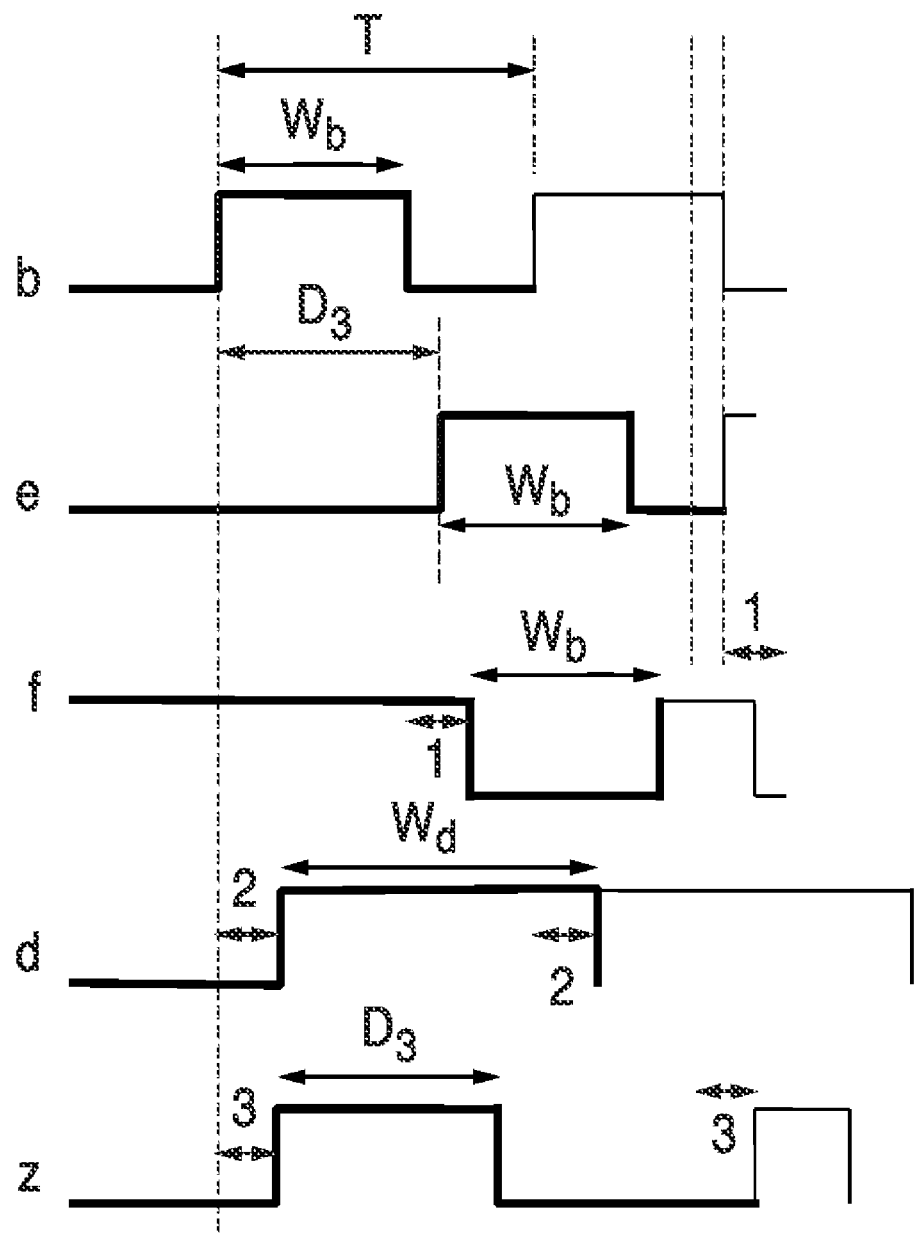

FIG. 44 through FIG. 47 illustrate new sets of TG timing diagrams which correspond to FIG. 40 through FIG. 43, however, now taking propagation delays into account. FIG. 44 depicts signals "b", "c" and "d" shown with note 1 depicting OR gate propagation delay as $PD_{OR}$. In FIG. 45 through FIG. 47 the relationships of signals "b", "e", "f", "d", and "z" are shown with notes 1-3 relating to the propagation delay of the NOT gate, the OR gate, and the AND gates respectively.

Based on Eq. 1, it is still necessary for $D_2 < W_b$. Wherein based on Eq. 2, $PD_{OR} + < D_3 + W_b$, so $PD_{OR} + D_2 + W_b < D_3 + W_b$ and it can then be concluded that $PD_{OR} + D_2 < D_3$.

According to Eq. 3, $D_3 < PD_{OR} + D_2 + W_b$ and then $D_3 < PD_{OR}$ $W_d$. Therefore $0 < D_3 - (PD_{OR} + D_2) < W_b$. Eq. 3.4 gives $T > D_3 + W_b = D_{3'} + PD_{NOT} + W_b$.

As the previous assumption takes $D_3 = W$ and in an ideal case $W_b = W_a$. If $W/2 < W_b$ then $D_2 < W_b$ is satisfied if $D_2 \leq W/2$, so let $D_2 = W/2$. Provided $W_b < 3W/2$ then $T > D_3 + W_b$ is true if $5W/2 \leq T$.

To determine the propagation delay of the OR gate, it has already been concluded that $PD_{OR} + D_2 < D_3$ and which leads to $PD_{OR} < D_3 - D_2$. Therefore by considering $D_3 - D_2 = W - W/2 = W/2$, the lower band of the delay can be determined as $PD_{OR} < W/2$. To determine the upper band, it is already stated that $D_3 < PD_{OR} + D_2 + W_b$ and this will be satisfied if $D_2 < W_b$ and $D_3 - 2D_2 < PD_{OR}$. Finally, propagation delay of the OR gate can be defined to be $0 < PD_{OR} < W/2$.

Section 4

This section describes the combining of the trigger and data, toward providing even higher-speed alternatives to the triggered CA design described in prior sections.

To explain the circuits of this section, it will be helpful to reconsider FIG. 14, showing the design for a triggered cell, having 1-bit processor 90, inputs 92, 94, single output 96, and trigger generators 98a, 98b. The processor 90 is preferably configured having two 1-bit inputs and one 1-bit output. Inputs are respectively received from storage devices, such as D-type flip-flops, while the output is routed to a similar device. In fact, when the cells are cascaded, the output of one cell is an input to the next cell.

The operation of the triggered cell is as follows. First, a bit of data arrives at the input to the first storage device 92. After a short set-up time, the leading edge of a trigger pulse appears at the clock input of the storage device 92 and at the input to the trigger generator 98a. The pulse stays high long enough to satisfy the hold time of storage device 92, at which point the data bit is securely stored in the storage device.

At some point the output level of the storage device reflects the stored bit of data and this level, if different from previously, will induce the processor 90 logic to form a new result involving the two inputs. The result appears at the input to the second storage device 96. Meanwhile, the trigger generator forms a new version of the input pulse, but with a delay that is sufficient to ensure that the leading edge of the new pulse satisfies the set-up time requirement when it appears at the input to the second storage device.

In summary, each cell receives a bit of data which is shortly followed by the leading edge of a trigger pulse. Following are two things of particular note. First, the trigger and the data are separate. Second, the trigger must follow the data. To ensure this, the trigger generator must delay the trigger by an amount of time (duration) which equals or exceeds the worst case delay experienced by the result as it is formed by the processor. Assuming this circuitry is to be fabricated as an integrated circuit, it will be appreciated that timing then depends on process variations and temperature. Consequently, ensuring the correct timing relationship will have a negative impact on performance.

In this new aspect of the design, although the cell also has two inputs, the trigger and data functions are now combined. An input is always a single pulse. What distinguishes a 0 from a 1 is the input at which the pulse appears. If it appears at the first input, it is defined to be a 0. If it appears at the second input, it is defined to be a 1. A significant advantage of this format is that no timing relationship needs to be ensured between a trigger and a bit of data.

Figure 48:
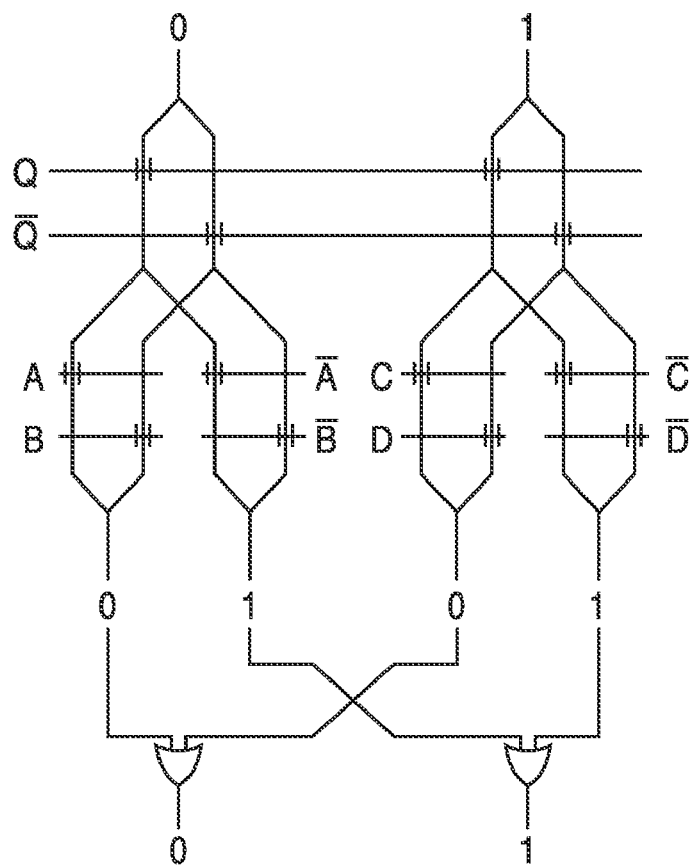
FIG. 48 is a schematic of a circuit for routing pulses according to an aspect of the present invention, showing combination of data and triggers.

FIG. 48 illustrates a circuit for routing pulses so as to perform logic functions within an enhanced CA in which the data and pulse are combined, and no timing constraints between data and trigger need be considered. The only timing that is necessary is the need to store the first bit before a second bit arrives.

A bit of data appears as a single pulse. It is interpreted as a "0" if the pulse arrives on the left input, and as a "1" if received on the right input. The routing of the pulse is determined by the states of Q, A, B, C and D as shown in the figure. The parallel bar symbol used in FIG. 48, as seen at select vertical-horizontal junctions, represents a switch which allows the pulse to pass through if the controlling input is "active" (e.g., a "1") or to otherwise block the pulse. Inputs 0 and 1 are shown at the bottom of the figure.

Suppose ABCD=0100, the output is a "1" if Q=1 OR the input is a "1". So it performs the OR of Q and the input. Other operations are selected by changing ABCD.

Figure 49A:
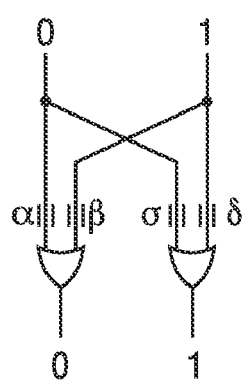
FIGS. 49A and 49B are schematics of a circuit for combining data and trigger signals according to another embodiment of the present invention.
Figure 49B:
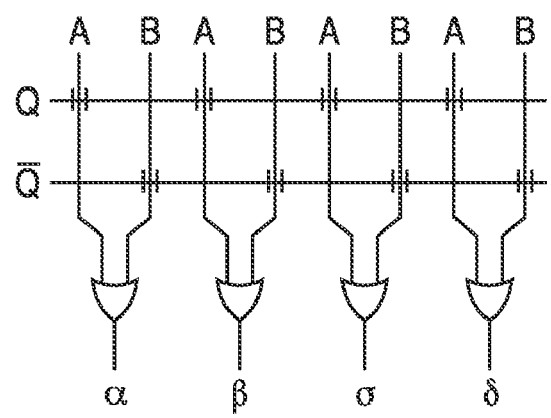

FIGS. 49A and 49B illustrate an alternative circuit which is substantially equivalent to that of FIG. 48, although it has the same complexity as circuits previously discussed, it should be subject to less delay because the input pulses pass through only a single circuit element, instead of through two circuit elements. The OR gates in FIG. 49B can be selectors because Q and /Q are guaranteed not to be true at the same time. It should be appreciated that pull-downs, for assuring a proper gate input sense (e.g., so that both inputs are not floating), are not shown in these figures for the sake of clarity. Each of the sections shown in the right portion of the figure is a selector.

FIG. 50 depicts one implementation of a selector, which is possible because it is not desirable to enable both lines at the same time due to the behavior of a set-reset (SR) flip-flop. The selector shown either passes A or B to output alpha.

FIGS. 51A and 51B depict necessary timing relationships between the Q to /Q signals in FIG. 51A, which are distinct from the improper relationship shown in FIG. 51B. It is important that Q and /Q not both be high at the same time. An SR FF has the desired behavior, if the inputs to the FF are assumed to be both 0 until a change is needed, at which time a positive pulse is applied to the appropriate input.

Section 5

FIG. 52 illustrates an example of performing cell configuration according to an implementation of the present invention. It should be appreciated that each cell of the cellular array is configured by a set of configuration bits, which are shown in the figure being passed through the cells, so that each cell receives a set of configuration bits.

The configuration bits for each cell are held in a shift register. The shift registers for all the cells are linked together to form one long shift register. All the cells are configured at the same time. A clock signal is not shown for advancing the bits, nor is a completion signal shown for indicating when the configuration bits have reached the intended locations.

FIG. 53 illustrates an example cell configuration for selective configuration setting. It is sometimes desirable to configure selected cells rather than all the cells. This ability becomes particularly important as the cellular arrays increase in size. In the example shown, the bits arriving at a cell can take one of three paths. The first two paths enter a first or second shift register, while the last path is for bits that are passed through to the next cell. In this example, the first shift register captures command bits, while the second shift register captures configuration bits. The following considers the sequence of events as bits arrive. The first bits to arrive are received at the command register. One of these bits indicates whether or not there are configuration bits for this cell. If so, the next N bits are received by the configuration register, where N is the number of configuration bits. If there are no configuration bits for this cell, or all N bits have arrived, then any succeeding bits are passed through to the next cell.

The cell can return to an initial state in a number of ways. In one approach each cell monitors the bits being passed through for a pattern that signifies the end of the bit stream, or a separate signal can be supplied.

To avoid the need for a global clock, each bit can comprise a pulse that appears on either of two inputs. A pulse at one input is interpreted as a "zero" and a pulse at the other input is interpreted as a "one". To operate a shift register, the first stage can be a set-reset latch where set is connected to the "one" input and reset is connected to the "zero" input. Successive stages can be clocked by a signal formed in each cell, such as in response to a logical OR of the two inputs.

A simple way to determine when a shift register is full is to initialize it with all zeros except for the first bit. The first bit is initialized to "one". The shift register is full when this "one" bit reaches (or exits) the final stage.

The configuration circuitry may be adapted to serve a group of cells, instead of serving only a single cell. In this case the configuration bits would be provided for all the cells in the group.

To supply configuration bits so that they reach all the cells in a non-linear array, the configuration circuit needs to follow a route that will include turns to reach each cell in a two-dimensional array. Following is a description of an example of dynamic routing which overcomes routing problems that arise in response to changes in the extent of an array. The dynamic routing circuit automatically connects the routing circuit when an array is formed or changed.

In one implementation of dynamic routing, the following assumptions are used when the circuit is designed. (1) Each row has the same number of cells. (2) Each column has the same number of cells. (3) The number of cells in a row does not need to be the same as the number of cells within a column. (4) The configuration bits are sent to the array from one corner, and are only received at each cell a single time. (5) Configuration bits leave the array from one location, preferably a corner, so that the bits can be verified.

Given the above assumptions, this design (by way of example and not limitation) has the configuration bits sent through the upper left side of the array. If the configuration insertion point is changed, the dynamic routing circuit design has to be changed accordingly for the new insertion point.

Figure 54:
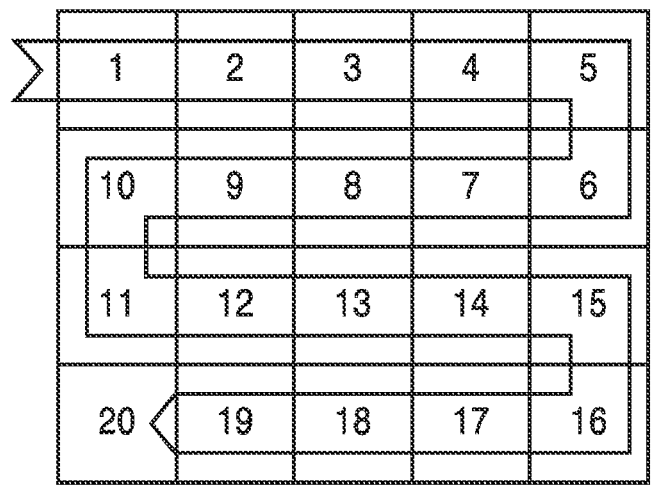
FIG. 54 is a data flow path of passing configuration data through a cellular array according to an aspect of the present invention, showing a serpentine path by which the configuration data is passed.

FIG. 54 illustrates an example of dynamic routing of configuration information, depicted for a 5×4 array. In this preferred example, each cell receives input in one direction only and forwards output in another direction only. The circuit generates its output in response to its input direction and the condition of neighboring cells, such as whether present or absent.

The pseudo-logic code for each cell is listed in Table 1, while a truth table in Table 2 is for dynamic logic which can be built from the above pseudo logic code. The functional results of the above table are:

$$S_{out} = W_{in} \cdot \overline{EN} + E_{in} \cdot \overline{WN}$$

$$E_{out} = W_{in} \cdot EN + N_{in} \cdot EN$$

$$W_{out} = E_{in} \cdot WN + N_{in} \cdot WN$$

Each cell is uniform, while the cells will perform the above functions once they form an array. The output pins of each cell are connected to the input pins of the neighboring cell. Two input pins are added to each cell to receive status from a neighbor cell, while two output pins are added to each cell to pass status information to the following neighbor.

Figure 55:
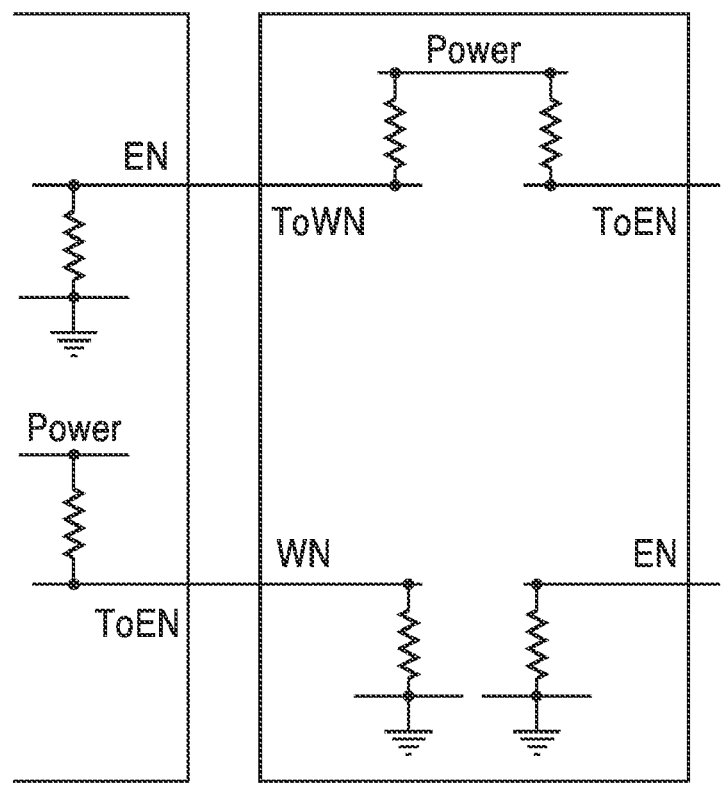
FIG. 55 is a schematic of a circuit for sensing the connection of a neighboring cell within a cellular array according to an aspect of the present invention.

FIG. 55 illustrates an example circuit for determining the existence, or absence, of the neighbor cell. It should be appreciated that other implementations can be created without departing from the teachings of the present invention. In the example shown, the left cell has one west neighbor but no east neighbor. Once the cell is connected to the array, the west neighbor (WN) will be logic high to indicate the existence of a west neighbor. The east neighbor (EN) will be logic low to indicate the absence of the east neighbor.

Figure 56:
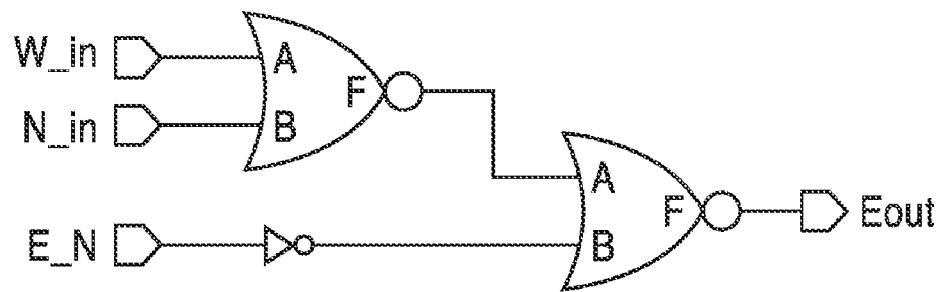
FIG. 56-58 are schematics of circuits for generating routing control signals within the quad cell according to aspects of the present invention.
Figure 57:
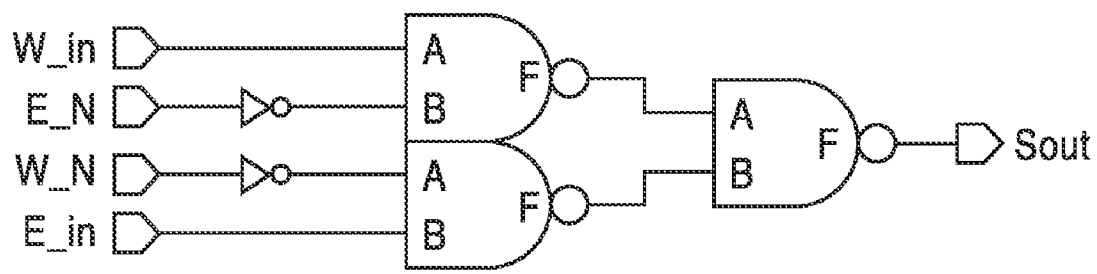
Figure 58:
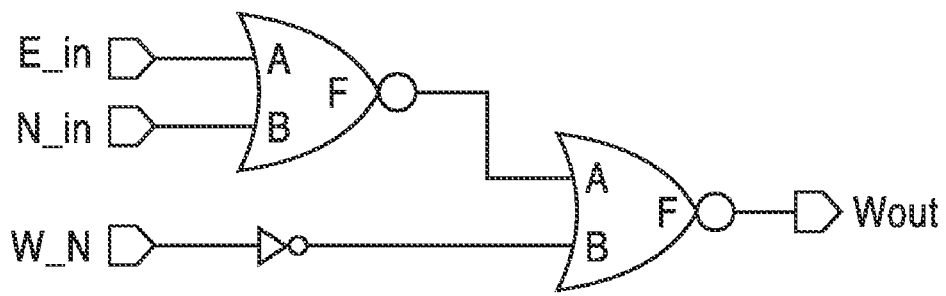

FIG. 56-58 illustrate example embodiments of circuits configured for generating output signals for east output, south output, and west output, respectively. In FIG. 56 signals W_in and N_in are received at inputs A and B of a NOR gate having output F, while signal E_N is inverted. Signal Eout is generated from a second NOR gate receiving signal F and the inverted E_N signal. In FIG. 57 signals W_in and E_in are received on inputs of a first and second NAND gate, while signals E_N and W_N are inverted and received at the other input of each NAND gate. The two outputs from the NAND gates are received as input to a second NAND gates whose output is Sout. Finally, in FIG. 58 inputs E_In and N_In are received at a first NOR gate to output a signal F. A second NOR gate receives signal F from the first NOR gate as well as the complement of the W_N signal to generate Wout.

Figure 59:
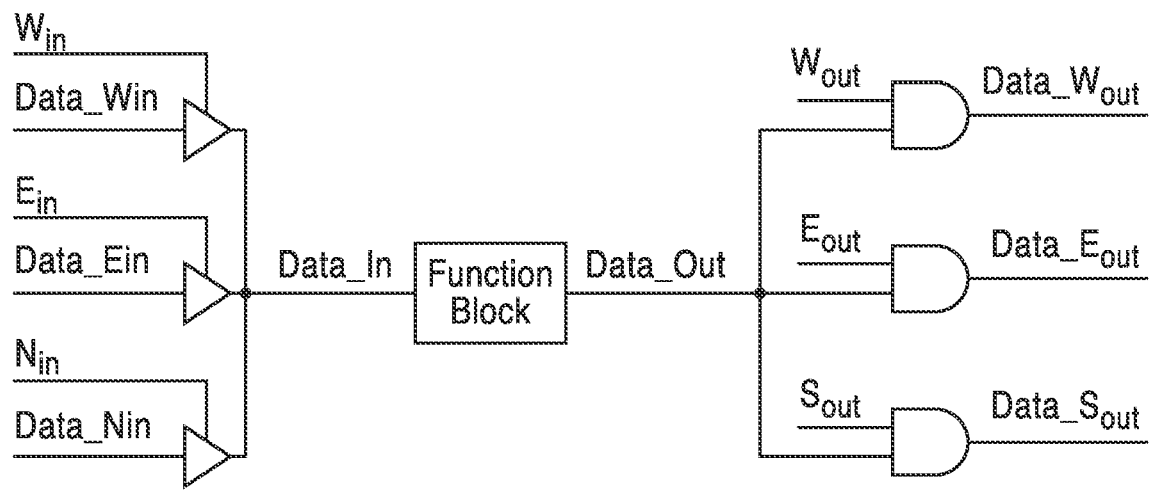
FIG. 59 is a schematic of a dynamic configuration routing circuit according to an aspect of the present invention.

FIG. 59 illustrates a dynamic configuration routing circuit which is determined in response to the presence or absence of nearby cells, where the configuration data is arriving from and where it should be forwarded. It will be appreciated that the cell will select one from three directions as its input. The cell sends its output to one direction based on the previous routing rules. By way of example, the cell marked as #6 in FIG. 54, enables a north input and a west output. All the other signals will be disabled for configuration purposes.

For large arrays, it is desirable to have a way to configure subsets of the cells without passing through all the cells in the array. This could be achieved by partitioning the array into sub-arrays and forming a configuration route within each sub-array. However, these sub-arrays may not correspond to the functional structures to be formed in the array.

Figure 60:
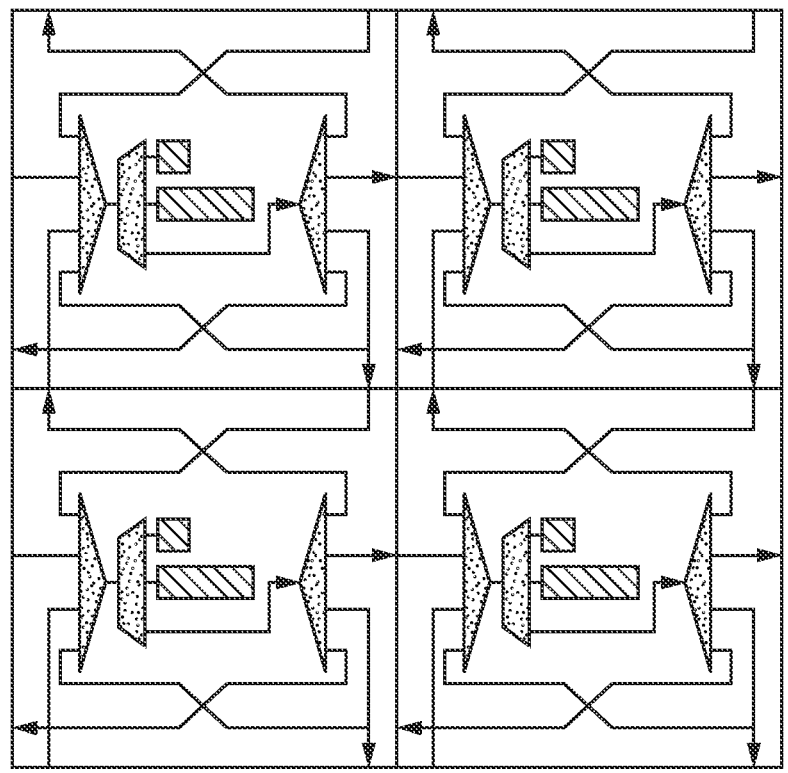
FIG. 60 is a schematic of individual configuration within the cells of a cellular array, according to an aspect of the present invention.

FIG. 60 illustrates an example embodiment of individually configuration of the cells in the cellular array. It will be appreciated that a more flexible scheme can be beneficial for allowing functional structures of various shapes and sizes to be individually configured. One such scheme is shown in the figure, in which the configuration stream can enter and exit a cell in any direction. The four input paths are merged (using an OR function). The output direction is specified by bits in the command register. Again, each path may be dual rail, meaning there are separate wires to carry "zero" and "one" pulses.

Section 6

The following describes a mechanism for simplifying resetting of the join circuitry for the TQ-cell, as described previously in this document. To reset the join, zeroes need to be stored in the logic unit (LU) output storage devices of the cells which are to participate in the next join operation. The invention can be implemented to perform this function automatically, as described herein, as part of the join operation.

Figure 61:
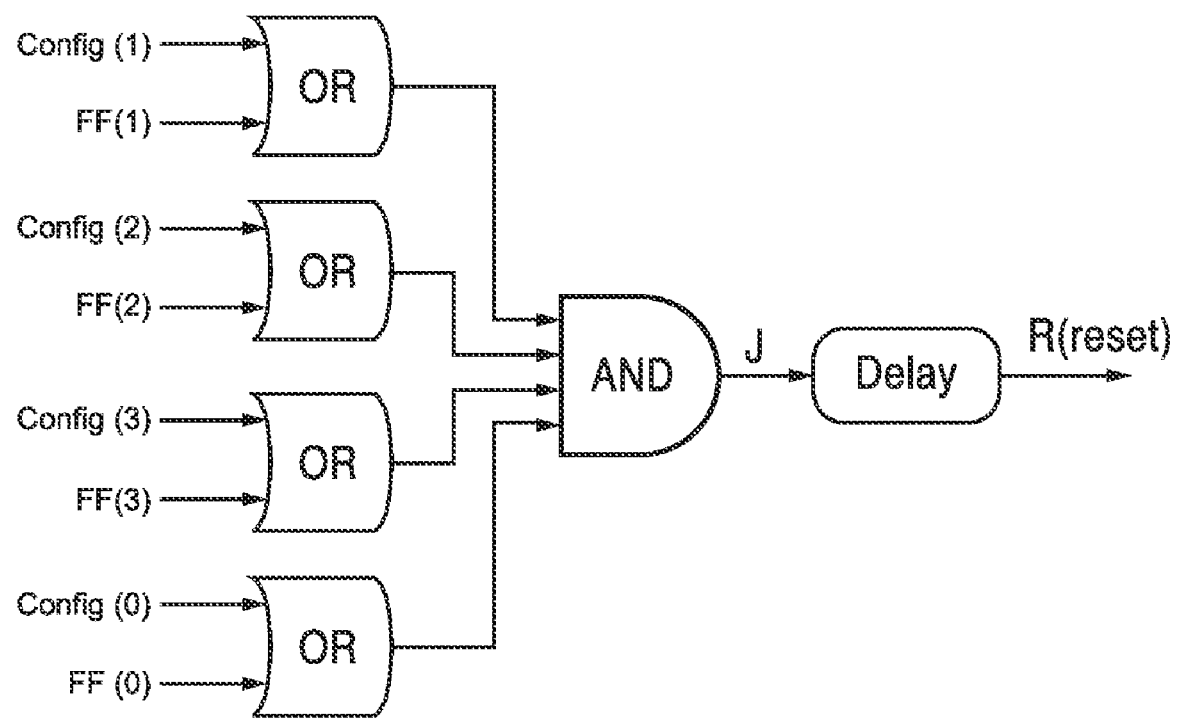
FIG. 61 is a schematic of a self-resetting join according to an aspect of the present invention, showing generation of signals J (join) and R (reset).
Figure 62:
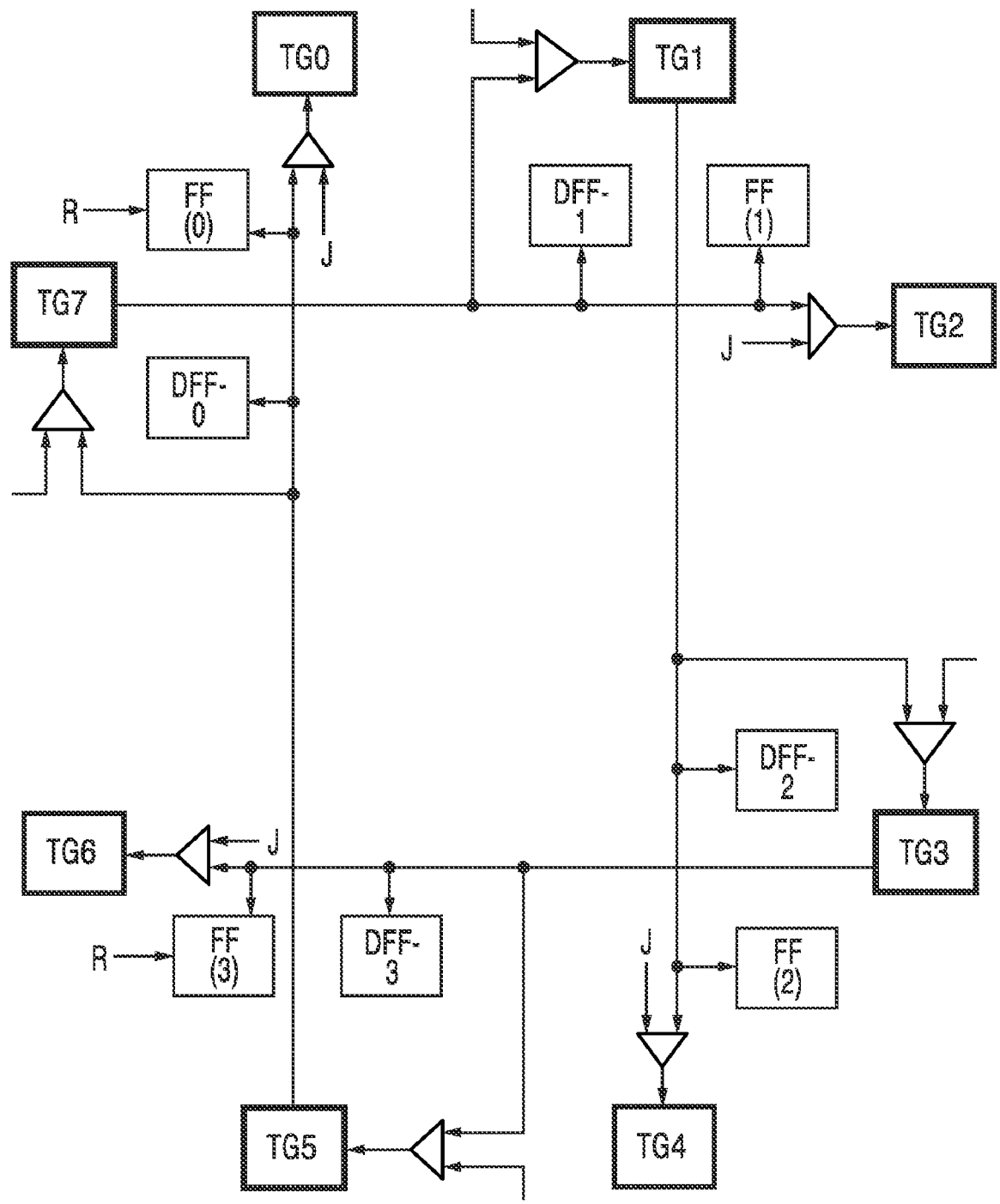
FIG. 62 is a schematic of a quad cell showing the use of the J and R signals shown in FIG. 61, according to an aspect of the present invention.

FIG. 61 and FIG. 62 illustrate an implementation for simplifying resetting of the join circuitry for the TQ cell. In FIG. 61 four configuration inputs (Config (0) to Config (3)) comprise configuration bits. The four flip-flop (FF) inputs (FF (0) to FF (3)) are received from the outputs of four flip-flops with the same label in the FIG. 62. The J and R outputs can be seen from FIG. 61, with the J (join) output generated after both the four OR operations and the AND operation are performed, while the R (reset) output is generated after a delay following the join. The J and R inputs can be seen controlling the selectors and resetting interior flip-flops of FIG. 62.

The delay element in FIG. 61 delays the leading edge of a pulse which is formed when the output of the AND gate becomes true (high). The trailing edge results from the effect of propagating the output of the Delay element as signal R (reset) to the four flip-flops labeled FF(0), FF(1), FF(2), and FF(3) in FIG. 62 causing them to be reset and ultimately causing the output of the AND gate to become false (low). The pulse formed by these actions passes through the 2:1 selectors (triangles in the diagram below), if configured to do so, and stimulates the generation of a trigger pulse which exits the cell.

The flip-flops reset by R simply record the fact that an operation was performed by the corresponding cell. This is evidenced by the trigger event which stores the result from the logic unit and sets the flip-flop originally. Note that the flip-flop may comprise a set-reset (SR) latch.

The following considers the synchronizer 112 shown in FIG. 19 as a variation of the join described above. As with the case of a join, the synchronizer has two inputs from each cell. One input P is from a configuration bit that specifies whether or not the corresponding cell is participating in the synchronization operation. The other input S signals when an event of interest has occurred in the corresponding cell.

A possible event of interest is when a register has received a "true" output from the logic unit. Another possible event of interest is when a latch has been set to "true" by the trigger regenerator. It is noted that S is an output of the register or latch that records the event of interest.

The output of the synchronizer is a function F of the inputs from the cells in the quad-cell. In participating cells, this output goes to one of two inputs of a selector whose output goes to a trigger regenerator of a neighboring cell. The other input to this selector is the output of the trigger regenerator of the participating cell. (See the join circuitry for an example of this, in which the selector is labeled TS-Output.)

Let P=1 if the cell is participating and let P=0 if the cell is not participating. Let S=1 if the event has occurred and let S=0 if the event has not occurred. Let $P_i$ and $S_i$ be the synchronizer inputs that come from cell i.

Then the function for a join operation, $F_J$, can be expressed as $$F=F_J=(/P_1+S_1)\cdot(/P_2+S_2)\cdot(/P_3+S_3)\cdot(/P_4+S_4)$$

Other functions can be substituted or added. If the synchronizer can perform multiple functions, configuration bits will select which one is to be used. An example of another useful synchronization function is the Merge operation, $F_M$. $F_M$ is the logical complement of $F_J$ and causes the participating cells to output a trigger when any one of the events of interest has occurred.

As with the case of a join, the synchronizer can also output a delayed version of F to be used to reset the registers or latches that record the events of interest.

Section 7

A cell array can be designed so that the cells are driven by a clock, a trigger, or a "pulse". It should be appreciated that a trigger and a "pulse" are both pulses. However, a trigger is a timing signal whereas a "pulse", according to this aspect of the present invention, is considered to carry both data and timing information. The data is signified in the pulse in response to which wire the pulse appears on, where an n-bit quantity can be represented by a pulse on one of 2n wires. A "pulse" will be referred to as a pulse where the context makes the distinction evident.

Triggers and pulses are local cell-to-cell stimuli that avoid the disadvantages of a global clock and support the formation of arrays that are large, low power, fast, and which can be thermally self-regulating.

Figure 63:
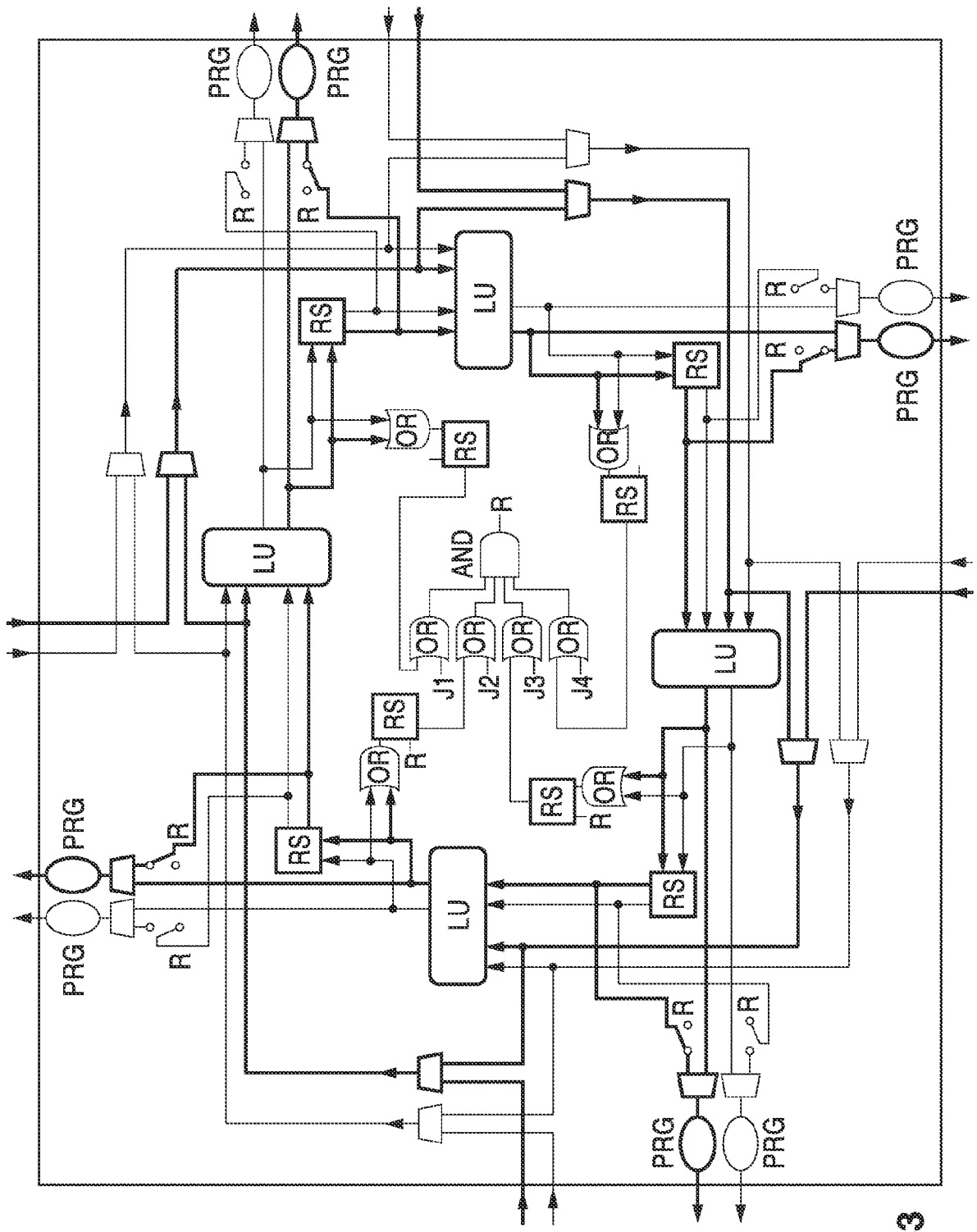
FIG. 63 is a schematic of a pulsed quad cell (PQ) design according to an aspect of the present invention.

FIG. 63 illustrates an example embodiment for a pulsed quad (PQ) cell design. It will be appreciated that a number of the paths shown utilize a pair of wires, these pairs carry the pulses that merge data and timing.

Figure 64:
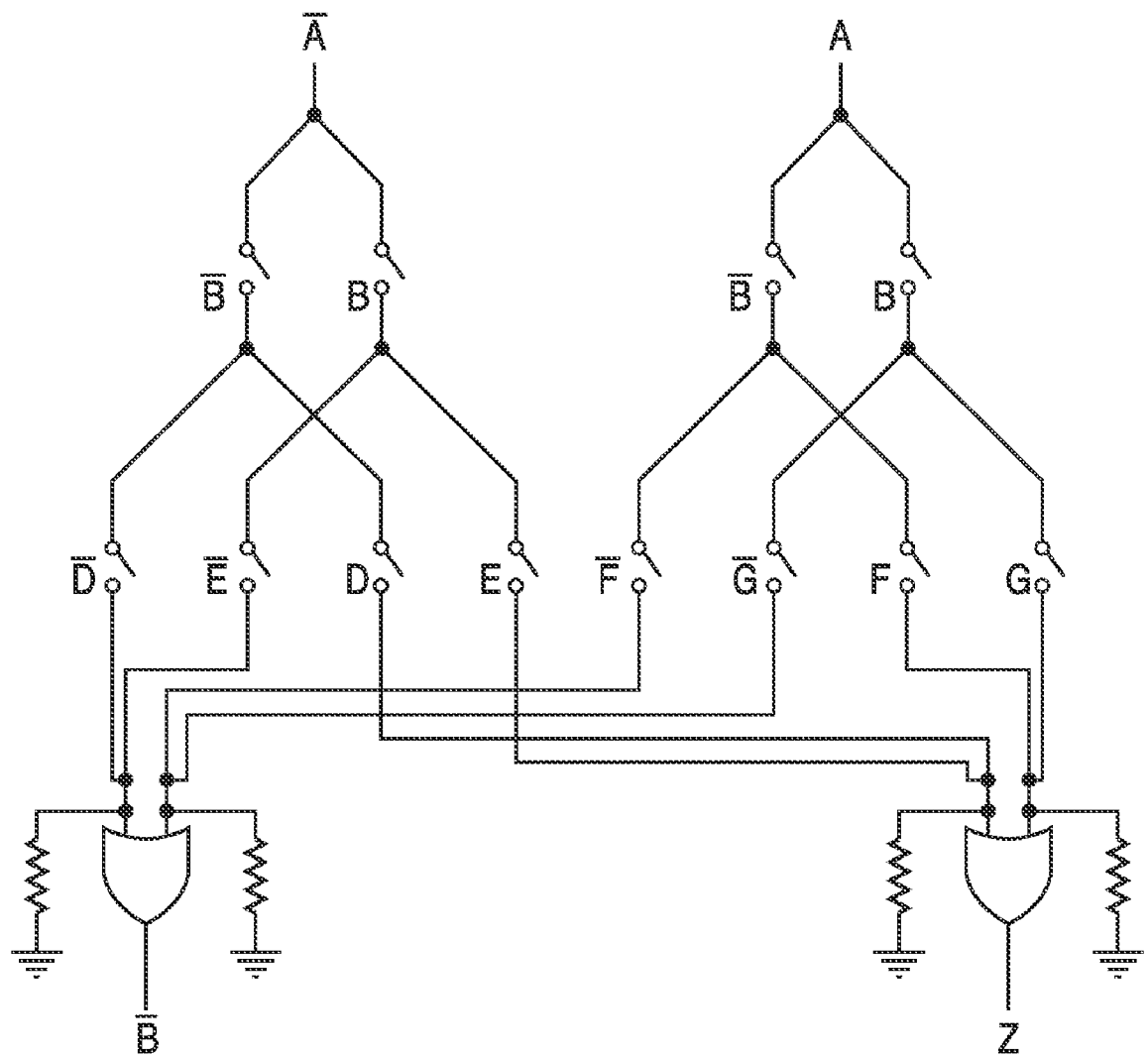
FIG. 64 is a schematic of a logic unit circuit, according to an aspect of the present invention, shown for the PQ design of FIG. 63.

FIG. 64 illustrates an example logic unit as depicted in FIG. 63. Referring to both FIG. 63 and FIG. 64, it will be seen that each logic unit (LU) has two inputs: one from a selector and one from a reset-set (RS) latch. The selector chooses between an external input and an internal input. The logic units (LUs) have a single output comprising one pair of wires. It will be appreciated that a single output is not as flexible as having two outputs, but provides for simplicity of illustration in this figure. The LU output goes to an SR latch and through a selector to a neighboring PQ-cell.

Referring again to FIG. 63, pulses pass through a pulse regenerator (PRG) before exiting the quad-cell. The circuitry in the center of the quad cell performs the join function and is similar to the circuitry that performs the join in the TQ-cell design.

The inputs to the join circuitry come from four RS latches, each of which is set by the output of an OR gate. The combination of the OR gate and SR latch detects when the LU produces an output.

This LU produced output event is of interest to the join circuitry if the corresponding cell is configured to participate in the join. If the cell is participating in the join, then the corresponding bit, in the set of bits J1, J2, J3, and J4, will be zero. In this case the event will cause a "one" to be input to the 4-input AND gate, otherwise the input will be a "zero". The output of the AND is a "one" when the LUs of all the cells participating in the join have produced an output. This output is labeled with an R in the figure and is communicated to all the other points labeled with an R in the figure. One such point is the reset input of the RS latch. After some propagation delay, this will cause the output of the AND gate to return to 0, ending the reset operation and producing the trailing edge of a pulse. In addition to resetting the latch, this pulse also briefly closes two switches, each shown labeled with an R in each cell, which produces a pulse at an input to one of the two selectors. This input corresponds to the high output of the RS latch holding the value of the latest LU output. This pulse passes through the selector only if that cell was configured to participate in the join; otherwise it has no effect.

Figure 65:
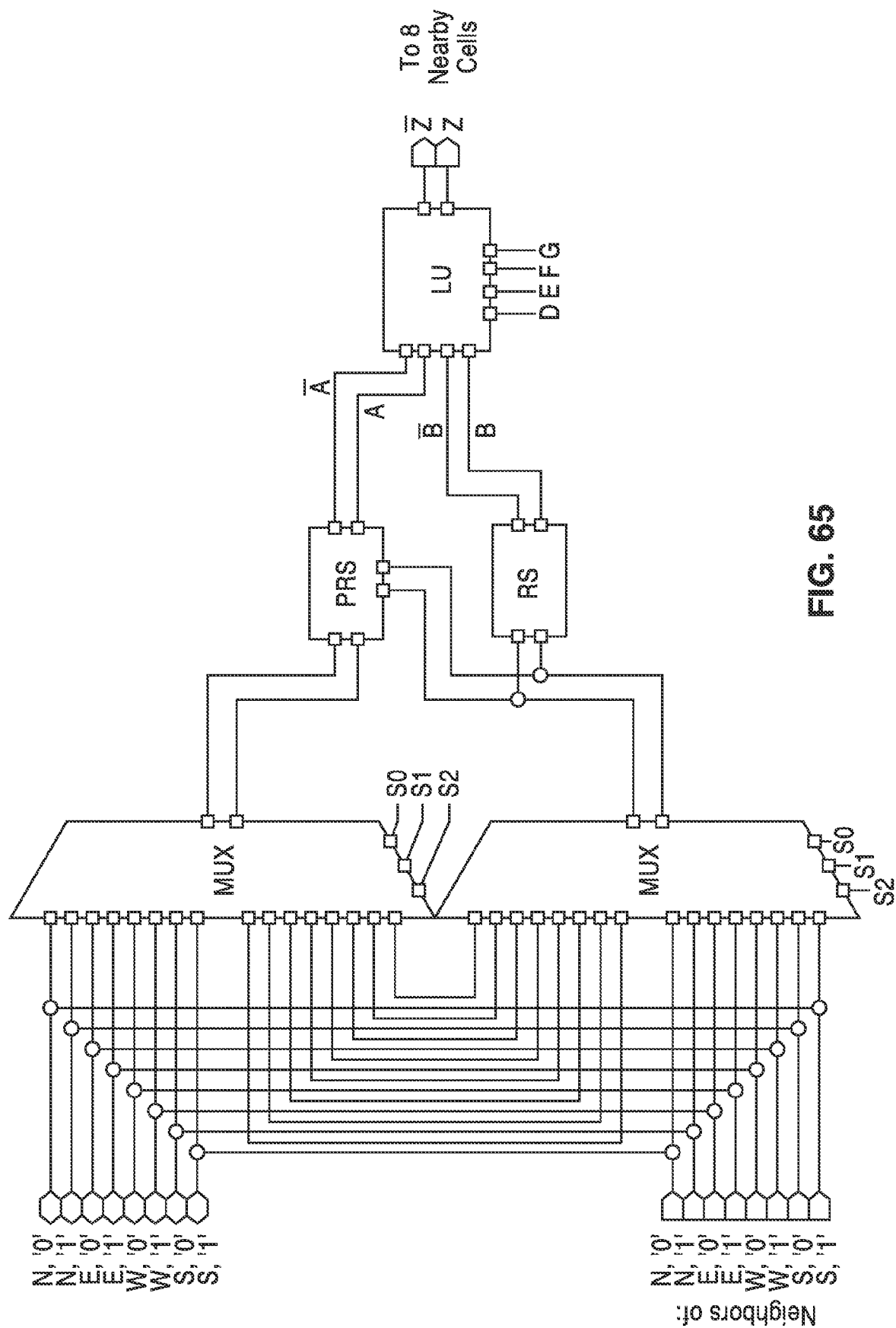
FIG. 65 is a schematic of a pulsed uni-cell (PU) according to an aspect of the present invention.

FIG. 65 illustrates an example of a pulsed uni-cell (PU-cell). Any particular configuration of a quad-cell array, whether clocked, triggered, or pulsed, may not utilize some of its cells. This could be due to routing considerations that make it difficult to pack the function tightly. An alternative design, the pulsed uni-cell (PU-cell) array, increases the connectivity of individual cells so as to make them easier to utilize. This increase in connectivity adds more routing resources to the cell, but this could be offset by higher utilization. Referring to the figure, each cell has a two-wire input from 8 cells, instead of from 2 cells as in the PQ-cell.

Figure 66:
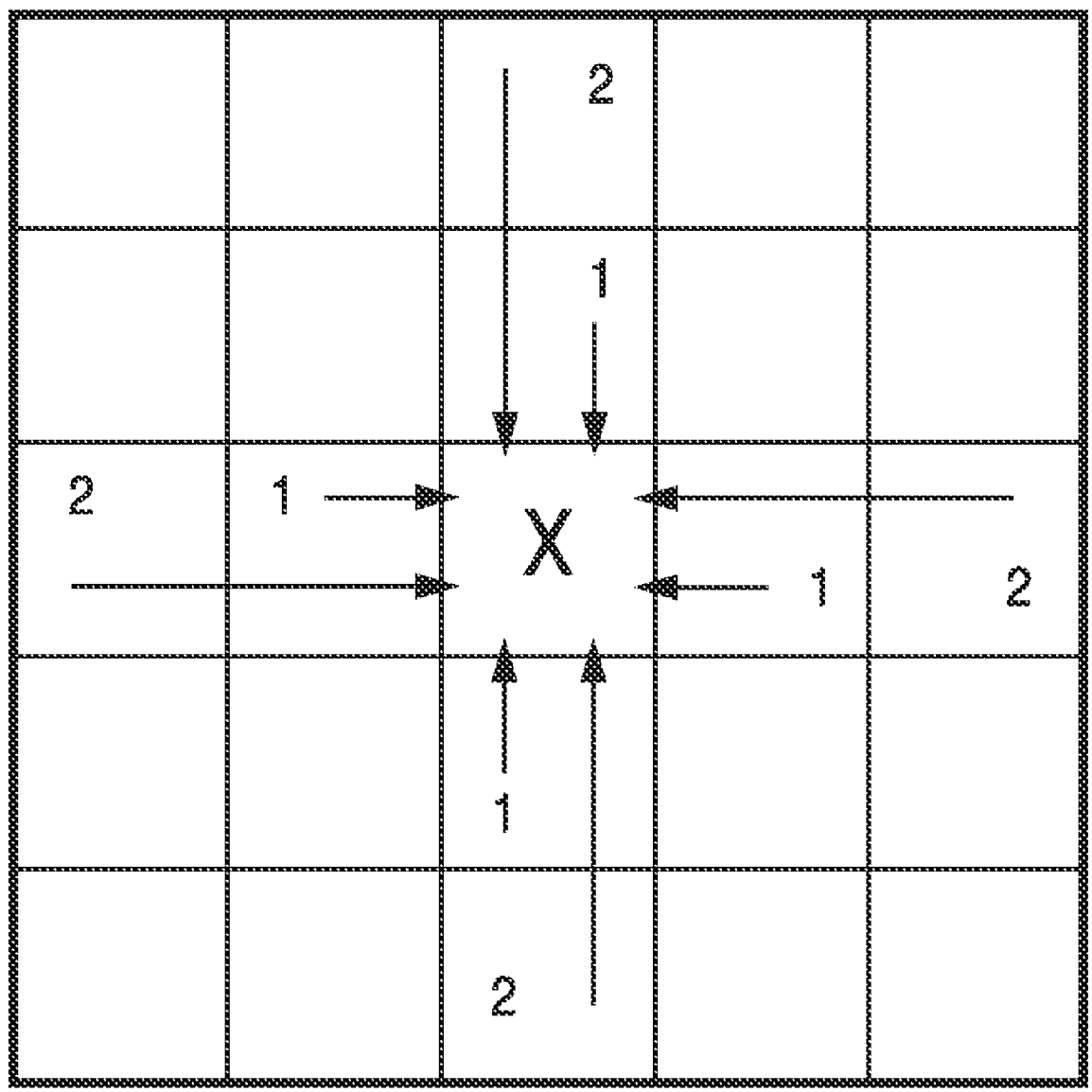
FIG. 66 is a schematic of cell "X" receiving input from 8 local neighbors according to an aspect of the present invention.
Figure 69:
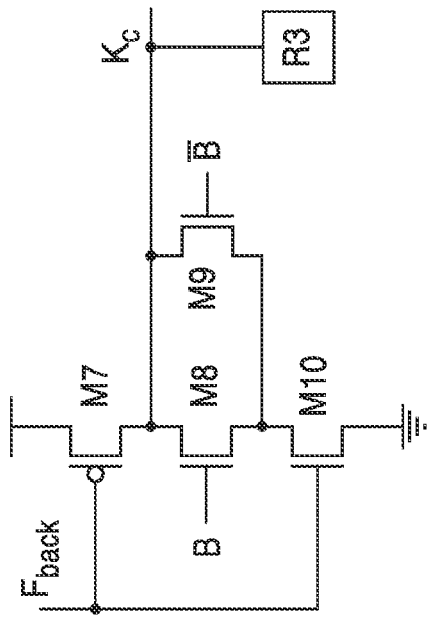
FIG. 67-70 are schematics of join circuitry according to an aspect of the present invention.
Figure 70:
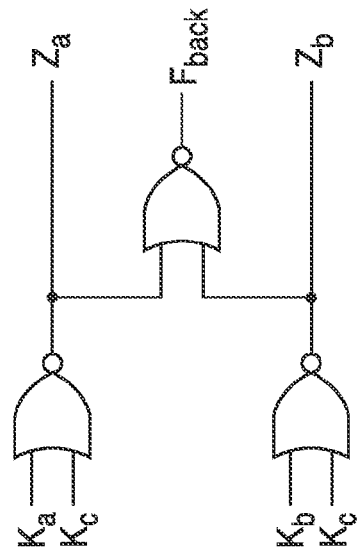
Figure 67:
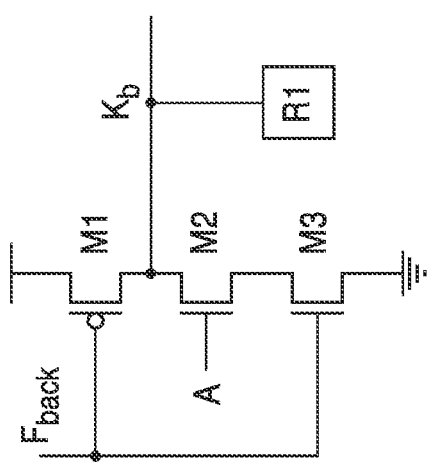
Figure 68:
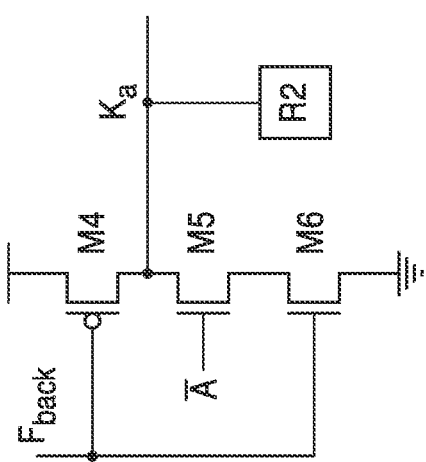

FIG. 66 depicts the 8 adjacent cells in relation to this cell. A portion of an array in the neighborhood of the cell is marked by an "X", and this cell receives inputs from 8 cells, 4 of which have arrows with a "1" at the base and 4 of which have arrows with a "2" at the base.

The LU is the same as in the PQ-cell design and one of its inputs comes from an RS latch. The other input comes from a pulse regenerator and synchronizer (PRS) circuit.

A pulse regenerator is beneficial, or more typically necessary, to assure that the pulse is properly registered along its path. As a pulse travels through many cells in an array, the leading and trailing edges may propagate at different rates. Consequently the pulse width may change. Consequently, if the pulse becomes too short, it may vanish entirely. If the pulse becomes too long it may interfere with other pulses. So the purpose of a pulse regenerator is to ensure pulse integrity by receiving a pulse whose width is in some range and to produce a pulse with a desired width.

The two synchronization functions of join and merge are now considered.

Considering the join function. In order for the LU to operate correctly, switches B and /B should be set to establish the path through the LU before pulse A or /A arrives at the LU input. It is the purpose of the synchronizer to ensure that this is so. If an input pulse (either A or /A) arrives before the switches B and /B are set, then the synchronizer holds the input pulse. The pulse is released when the switches are set.

FIG. 67 through FIG. 70 illustrate examples of the join circuitry. Initially, $K_a$, $K_b$, and $K_c$ are high, $Z_a$ and $Z_b$ are low, and $F_{back}$ is high. When input pulse A or /A arrives, either $K_a$ or $K_b$, will be low. As long as $K_c$ is unchanged, $Z_a$ and $Z_b$ will also be unchanged. When input pulse B or /B arrives, $K_c$ will change and, depending on the presence of A or /A, either $Z_a$ or $Z_b$ becomes low. $F_{back}$ is also set to high, which is fed back to M1, M4, M7 and other transistors (M3, M6, M10). Then $K_a$, $K_b$ and $K_c$ will be pulled back to high. After another gate delay, $Z_a$ and $K_b$ are pulled back to low again. So the input pulse A or /A and input pulse B or /B may arrive in any order. Their order does not change the output. Moreover, the output width depends on the delay between $Z_a$ and $F_{back}$ (or $Z_b$ and $F_{back}$) and not on the input pulse width.

Considering the merge function. There are situations in which a cell should operate with a single input pulse. For example, an iterative computation may start with a single start pulse. Consequently, the cell may be configured to merge the inputs. The merge enables the cell to operate when a pulse arrives at either of its two inputs.

Figure 71:
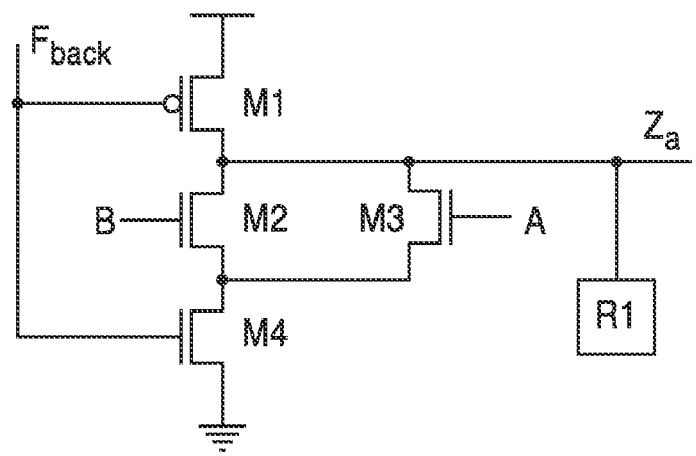
FIG. 71-73 are schematics of merge circuitry according to an aspect of the present invention.
Figure 72:
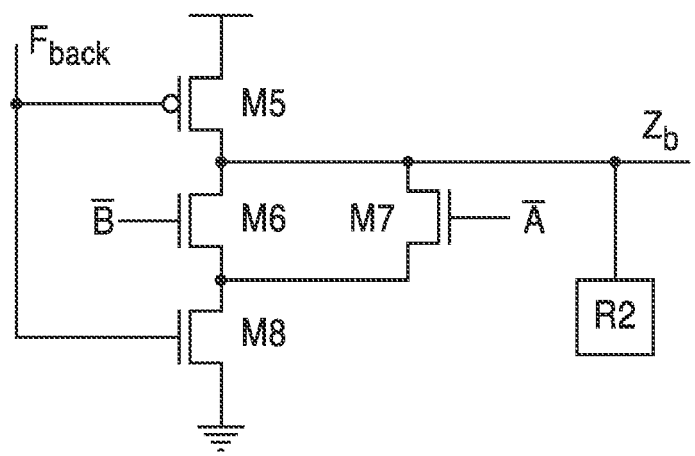

FIG. 71 through FIG. 73 illustrate an example of merge circuitry. When a pulse arrives at A or B in FIG. 71, an output pulse will be generated at $Z_a$, while an input pulse at /A or /B in FIG. 72 generates an output pulse at $Z_b$. In FIG. 73 the outputs of $Z_a$ and $Z_b$ are NORed to generate $F_{back}$.

Section 8

This section summarizes, by way of example and not limitation, a number of implementations, modes and features described herein for the present invention.

The present invention provides methods and apparatus for performing arithmetic and logic functions, computations, within a cellular array. Inventive teachings can be applied in a variety of electronic circuit apparatus and applications. The present invention includes the following inventive embodiments among others:

1. An apparatus for performing digital processing within an array of logic cells, comprising:

(a) a multiple of logic cells interconnected into a multiple cell;

(b) an arithmetic and logic circuit within each of said logic cells and adapted for performing a function selected in response to its configuration setting;

wherein each said interconnected logic cell within said multiple cell is rotated a different predetermined extent within said multiple cell;

(c) trigger generation circuits within the interior of said multiple cell for routing data between each cell of said multiple cell; and (d) trigger generation circuits at the boundary of said multiple cell, and shared with adjacent multiple cells, for routing data between adjacent multiple cells;

wherein data and triggers can be routed in multiple directions through an array of said multiple cells and be interspersed with computations.

2. An apparatus as recited within embodiment 1, wherein said arithmetic and logic circuit comprises a one-bit processing unit.

3. An apparatus as recited within embodiment 1, wherein said multiple cell is configured for outputting triggers and data to any of its neighboring multiple cells.

4. An apparatus as recited within embodiment 1, wherein said trigger and data is turned in response to traversing the circuitry of the rotated cells within a multiple cell when passes internally within the cells of the multiple cell.

5. An apparatus as recited in embodiment 1, wherein said data and said triggers are routed in response to the transmission of pulses, in which a pulse received on a first input indicates the presence of a "0" while a pulse received on a second input indicates the presence of a "1", or vice-versa.

6. An apparatus as recited in embodiment 1, further comprising a data storage element into which configuration bits can be loaded to control the operations within each said cell.

7. An apparatus as recited in embodiment 1, wherein said arithmetic and logic circuit is configured for executing digital logic operations selected from the group of digital logic operations consisting of AND, NAND, OR, NOR, XOR, XNOR, NOT, read, write as well as arithmetic functions.

8. An apparatus as recited in embodiment 1, further comprising:

selectors within each cell of said multiple cell; and wherein each selector is adapted for supporting conditional branching or exit comprising routing, forking, joining or terminating the data and/or trigger signals.

9. An apparatus for performing digital processing within a cellular logic array, comprising:

(a) an arrangement of four logic cells coupled into a quad cell;

(b) an arithmetic and logic circuit within each said logic cells and adapted for performing a function selected in response to its configuration setting;

(c) trigger generation circuits within the interior of said logic cell for routing data between each cell of said quad cell; and (d) trigger generation circuits at the boundary of said quad cell, and shared with adjacent quad cells, for routing data between adjacent quad cells;

wherein each said interconnected logic cell within said quad cell is rotated a different predetermined extent within said quad cell; and wherein data and triggers can be routed in four directions through an array of said quad cells and interspersed with computations.

10. A method of triggering cellular automata, comprising:

cascading a plurality of interconnected circuit cells; triggering, asynchronously, of each of said cells in as each cell stabilizes in preparation for receiving said trigger;

selectively processing data within a logic unit of each said cell based on the configuration of the cell and in response to receipt of data and trigger conditions from neighboring cells; and outputting triggers and data to neighboring cells.

11. A method as recited in embodiment 10, further comprising initializing said cells, prior to said selective processing and triggering, by loading configuration bits within each of the plurality of cells to control the operations within each said cell.

12. A method as recited in embodiment 11, further comprising:

initializing said cells, prior to said selective processing and triggering, by loading configuration bits within each of the plurality of cells to control the operations within each said cell; and wherein controlling of the initializing process is performed in response to a central shift register within the cell.

13. A method as recited in embodiment 10, wherein said logic unit contains two inputs and a single output, and wherein more complex combinational logic are performed in response to sequential execution of operations in cascade.

14. A method as recited in embodiment 10, wherein one operand of said logic unit comprises the "state" of the cell while the other operand is data accompanied by or associated with a trigger.

15. A method as recited in embodiment 10, wherein said logic unit is configured for executing digital logic operations selected from the group of digital logic operations consisting of AND, NAND, OR, NOR, XOR, XNOR, NOT, read, write as well as arithmetic functions.

16. A method as recited in embodiment 10, wherein said logic unit is configured for executing digital logic operations selected from the group of digital logic operations consisting of AND, OR, NOT, and its complements, as well as read and write.

17. A method as recited in embodiment 10, further comprising latching of data between each of said plurality of cells.

18. A method as recited in embodiment 10, further comprising:

latching of data between each of said plurality of cells; and wherein said latching comprises inner latching between said logic units at the interior of the cell, and outer latching at the boundaries between cells.

19. A method as recited in embodiment 10, further comprising selecting signals within each of said cells as a form of conditional branching or exit.

20. A method as recited in embodiment 10, further comprising:

selecting signals within each of said cells as a form of conditional branching or exit; and wherein said condition branching or exit comprises routing, forking, joining or terminating the data and/or trigger signals.

21. A method as recited in embodiment 10, further comprising:

selecting signals within each of said cells as a form of conditional branching or exit; and wherein said signal selection is performed by selector circuits connected either before or after the previous selector.

22. A method as recited in embodiment 10, wherein said method melds the use of asynchronous triggering within reconfigurable logic to yield an intelligent cellular electronic structure having a number of benefits over existing circuitry and individual components.

23. A method as recited in embodiment 10, wherein the state of a cell within said plurality of cells can only be changed upon receipt of a trigger.

24. A method as recited in embodiment 10, wherein said triggers may be conditionally output in response to the result provided by said logic unit.

25. A method as recited in embodiment 10, further comprising routing of data and triggers within said cellular automata in support of turns, forks and joins.

26. A method as recited in embodiment 10, wherein said triggers are cell-to-cell events within the plurality of cells.

27. A method as recited in embodiment 10, further comprising interleaving triggers so that computational paths can cross one another.

28. A method as recited in embodiment 10:

wherein said trigger comprises a single pulse generated by a trigger generator (TG) within the cell; and wherein upon receipt of a trigger the receiving cell generates a new pulse whose output assures the integrity of the received pulse as having sufficient duration.

29. A method as recited in embodiment 10: wherein said trigger comprises a single pulse generated by a trigger generator (TG) within the cell;

wherein upon receipt of a trigger the receiving cell generates a new pulse whose output assures the integrity of the received pulse as having sufficient duration; and wherein each of said cells is configured with a trigger generator in each of four directions.

30. A method as recited in embodiment 10:
wherein said trigger comprises a single pulse generated by a trigger generator (TG) within the cell;
wherein upon receipt of a trigger the receiving cell generates a new pulse whose output assures the integrity of the received pulse as having sufficient duration;
wherein each of said cells is configured with a trigger generator in each of four directions; and
wherein each said trigger generator receives its input from either inside or outside of the respective cell.

31. A method as recited in embodiment 10:
wherein said plurality of cells are arranged as groups of interleaved cells; and
wherein configuration in said groups supports a wider variety of trigger functions than would arise in response to the interconnection of individual cells within an array.

32. A method as recited in embodiment 10:
wherein said plurality of cells are arranged as groups of interleaved cells;
wherein configuration in said groups supports a wider variety of trigger functions than would arise in response to the interconnection of individual cells within an array; and
wherein cells in each said group of cells comprise rotated instances of a single cell connected toward a different direction.

33. A method as recited in embodiment 10:
wherein said plurality of cells are arranged as groups of interleaved cells;
wherein configuration in said groups supports a wider variety of trigger functions than would arise in response to the interconnection of individual cells within an array; and
wherein four cells are contained in each said group of cells and connected in four different directions.

34. A method as recited in embodiment 10:
wherein said plurality of cells are arranged as groups of interleaved cells;
wherein configuration in said groups supports a wider variety of trigger functions than would arise in response to the interconnection of individual cells within an array;
wherein four cells are contained in each said group of cells and connected in four different directions; and
wherein said four different directions are at right angles to one another and referred to as north, east, south and west directions.

35. A method as recited in embodiment 10, wherein the functioning of said cells is determined in response to the receipt of configuration bits.

36. A method as recited in embodiment 10:
wherein the functioning of said cells is determined in response to the receipt of configuration bits; and
wherein said circuit cells comprise identical hardware.

37. A method as recited in embodiment 10, wherein the functioning of said cells is at least partially determined in response to the direction and/or location of trigger arrival within the cell.

38. A method as recited in embodiment 10, wherein the functioning of said cells toggles in response to arrival of said trigger.

39. A method as recited in embodiment 10, wherein asynchronous triggers are generated within the plurality of cells in response to detection of a selected condition.

40. A method as recited in embodiment 10:
wherein asynchronous triggers are generated within the plurality of cells in response to detection of a selected condition; and
wherein said selected condition comprises arrival of a valid output from an arithmetic and logic unit within a given cell.

41. A method as recited in embodiment 10, wherein the cells of the array are asynchronously clocked without the need of a global clock.

42. A method as recited in embodiment 10:
wherein the cells of the array are asynchronously clocked without the need of a global clock; and
wherein in response to the elimination of the limitations of global clock distribution, the plurality of cells can be made as large as desired.

43. A method as recited in embodiment 10:
wherein the cells of the array are asynchronously clocked without the need of a global clock;
wherein in response to the elimination of the limitations of global clock distribution, the plurality of cells can be made as large as desired; and
wherein only triggered cells are active, and power is not dissipated by cells which receive a global clock but are not subject to a data transition.

44. A method as recited in embodiment 10, wherein said triggers provide edge triggering of data retention elements within the cells.

45. A method as recited in embodiment 10, wherein the triggers and data are combined and specific data setup times are eliminated between data and an associated trigger.

46. A method as recited in embodiment 10, further comprising qualifying trigger conditions within a cell in response to detecting thermal conditions about said cell.

47. A method as recited in embodiment 10, further comprising:
qualifying trigger conditions within a cell in response to detecting thermal conditions about said cell; and
wherein the generation of said trigger is delayed in response to detecting elevated temperatures conditions toward mitigating thermal ramping of the cells.

48. A method as recited in embodiment 10, wherein processing within said cellular automata is performed in response to steps comprising:
(a) propagating data to the desired cells;
(b) forming terms within the desired cells to which data has been propagated; and
(c) combining the terms to generate a result.

49. A method as recited in embodiment 10, wherein multiple computational processing can be performed simultaneously within a single cell of said plurality of cells.

50. A method as recited in embodiment 1, wherein said cellular automata comprises a form of extendable field-programmable gate array (FPGA).

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

TS-Config Configuration Bit

| Bit Value | Source of input trigger |
|---|---|
| 0 | Outside the cell |
| 1 | Inside the cell |

TABLE 2

TS-Config Configuration Bit for TS-output

| Bit Value | Operation |
|---|---|
| 0 | Conditional |
| 1 | Unconditional |

TABLE 3

Timing Constraints of TG w/o Gate Propagation Delays

| | |
|---|---|
| $W_d = W_b + D_2$ | Eq. 3.1 |
| $D_3 > D_2$ | Eq. 3.2 |
| $W_b > D_3 - D_2$ | Eq. 3.3 |
| $T > D_3 + W_b$ | Eq. 3.4 |

TABLE 4

Timing Constraints of TG with Gate Propagation Delays

| | |
|---|---|
| $0 < PD_{OR} < W/2$ | Eq. 3.5 |
| $5W/2 \leq T$ | Eq. 3.6 |

TABLE 5

TS-Output

| Result of ALU operation (stored in I-FF) | Output of TS-Output |
|---|---|
| 0 | condition not satisfied yet. |
| 1 | condition is satisfied. |

What is claimed is:

1. An apparatus for performing digital processing within an array of logic cells, comprising:
   a multiple of logic cells interconnected into a multiple cell;
   an arithmetic and logic circuit within each of said logic cells and adapted for performing a function selected in response to its configuration setting;
   wherein each said interconnected logic cell within said multiple cell is rotated a different predetermined extent within said multiple cell;
   trigger generation circuits within the interior of said multiple cell for routing data between each cell of said multiple cell; and
   trigger generation circuits at the boundary of said multiple cell, and shared with adjacent multiple cells, for routing data between adjacent multiple cells;
   wherein data and triggers can be routed in multiple directions through an array of said multiple cells and be interspersed with computations.

2. An apparatus as recited in claim 1, wherein said arithmetic and logic circuit comprises a one-bit processing unit.

3. An apparatus as recited in claim 1, wherein said multiple cell is configured for outputting triggers and data to any of its neighboring multiple cells.

4. An apparatus as recited in claim 1, wherein said trigger and data is turned in response to traversing the circuitry of the rotated cells within a multiple cell when passes internally within the cells of the multiple cell.

5. An apparatus as recited in claim 1, wherein said data and said triggers are routed in response to the transmission of pulses, in which a pulse received on a first input indicates the presence of a "0" while a pulse received on a second input indicates the presence of a "1", or vice-versa.

6. An apparatus as recited in claim 1, further comprising a data storage element into which configuration bits can be loaded to control the operations within each said cell.

7. An apparatus as recited in claim 1, wherein said arithmetic and logic circuit is configured for executing digital logic operations selected from the group of digital logic operations consisting of AND, NAND, OR, NOR, XOR, XNOR, NOT, read, write as well as arithmetic functions.

8. An apparatus as recited in claim 1, further comprising:
   selectors within each cell of said multiple cell; and
   wherein each selector is adapted for supporting conditional branching or exit comprising routing, forking, joining or terminating the data and/or trigger signals.

9. An apparatus for performing digital processing within a cellular logic array, comprising:
   an arrangement of four logic cells coupled into a quad cell;
   an arithmetic and logic circuit within each said logic cells and adapted for performing a function selected in response to its configuration setting;
   trigger generation circuits within the interior of said logic cell for routing data between each cell of said quad cell; and
   trigger generation circuits at the boundary of said quad cell, and shared with adjacent quad cells, for routing data between adjacent quad cells;
   wherein each said interconnected logic cell within said quad cell is rotated a different predetermined extent within said quad cell; and
   wherein data and triggers can be routed in four directions through an array of said quad cells and interspersed with computations.

10. A method of triggering a cellular logic array, comprising:
    cascading a plurality of interconnected circuit cells;
    triggering, asynchronously, of each of said cells in as each cell stabilizes in preparation for receiving said trigger;
    selectively processing data within a logic unit of each said cell based on the configuration of the cell and in response to receipt of data and trigger conditions from neighboring cells; and
    outputting triggers and data to neighboring cells.

11. A method as recited in claim 10, further comprising initializing said cells, prior to said selective processing and triggering, by loading configuration bits within each of the plurality of cells to control the operations within each said cell.

12. A method as recited in claim 11, further comprising:
    initializing said cells, prior to said selective processing and triggering, by loading configuration bits within each of the plurality of cells to control the operations within each said cell; and
    wherein controlling of the initializing process is performed in response to a central shift register within the cell.

13. A method as recited in claim 10, wherein said logic unit contains two inputs and a single output, and wherein more complex combinational logic are performed in response to sequential execution of operations in cascade.

14. A method as recited in claim 10, wherein one operand of said logic unit comprises the "state" of the cell while the other operand is data accompanied by or associated with a trigger.

15. A method as recited in claim 10, wherein said logic unit is configured for executing digital logic operations selected from the group of digital logic operations consisting of AND, NAND, OR, NOR, XOR, XNOR, NOT, read, write as well as arithmetic functions.

16. A method as recited in claim 10, wherein said logic unit is configured for executing digital logic operations selected from the group of digital logic operations consisting of AND, OR, NOT, and its complements, as well as read and write.

17. A method as recited in claim 10, further comprising latching of data between each of said plurality of cells.

18. A method as recited in claim 10, further comprising:
    latching of data between each of said plurality of cells; and
    wherein said latching comprises inner latching between said logic units at the interior of the cell, and outer latching at the boundaries between cells.

19. A method as recited in claim 10, further comprising selecting signals within each of said cells as a form of conditional branching or exit.

20. A method as recited in claim 10, further comprising:
    selecting signals within each of said cells as a form of conditional branching or exit; and
    wherein said condition branching or exit comprises routing, forking, joining or terminating the data and/or trigger signals.

21. A method as recited in claim 10, further comprising selecting signals within each of said cells as a form of conditional branching or exit; and
    wherein said signal selection is performed by selector circuits connected either before or after the previous selector.

22. A method as recited in claim 10, wherein said method melds the use of asynchronous triggering within reconfigurable logic to yield an intelligent cellular electronic structure having a number of benefits over existing circuitry and individual components.

23. A method as recited in claim 10, wherein the state of a cell within said plurality of cells can only be changed upon receipt of a trigger.

24. A method as recited in claim 10, wherein said triggers may be conditionally output in response to the result provided by said logic unit.

25. A method as recited in claim 10, further comprising routing of data and triggers within said cellular logic array in support of turns, forks and joins.

26. A method as recited in claim 10, wherein said triggers are cell-to-cell events within the plurality of cells.

27. A method as recited in claim 10, further comprising interleaving triggers so that computational paths can cross one another.

28. A method as recited in claim 10:
    wherein said trigger comprises a single pulse generated by a trigger generator (TG) within the cell; and
    wherein upon receipt of a trigger the receiving cell generates a new pulse whose output assures the integrity of the received pulse as having sufficient duration.

29. A method as recited in claim 10:
    wherein said trigger comprises a single pulse generated by a trigger generator (TG) within the cell;
    wherein upon receipt of a trigger the receiving cell generates a new pulse whose output assures the integrity of the received pulse as having sufficient duration; and
    wherein each of said cells is configured with a trigger generator in each of four directions.

30. A method as recited in claim 10:
    wherein said trigger comprises a single pulse generated by a trigger generator (TG) within the cell;
    wherein upon receipt of a trigger the receiving cell generates a new pulse whose output assures the integrity of the received pulse as having sufficient duration;
    wherein each of said cells is configured with a trigger generator in each of four directions; and
    wherein each said trigger generator receives its input from either inside or outside of the respective cell.

31. A method as recited in claim 10:
    wherein said plurality of cells are arranged as groups of interleaved cells; and
    wherein configuration in said groups supports a wider variety of trigger functions than would arise in response to the interconnection of individual cells within an array.

32. A method as recited in claim 10:
    wherein said plurality of cells are arranged as groups of interleaved cells;
    wherein configuration in said groups supports a wider variety of trigger functions than would arise in response to the interconnection of individual cells within an array; and
    wherein cells in each said group of cells comprise rotated instances of a single cell connected toward a different direction.

33. A method as recited in claim 10:
    wherein said plurality of cells are arranged as groups of interleaved cells;
    wherein configuration in said groups supports a wider variety of trigger functions than would arise in response to the interconnection of individual cells within an array; and
    wherein four cells are contained in each said group of cells and connected in four different directions.

34. A method as recited in claim 10:
    wherein said plurality of cells are arranged as groups of interleaved cells;
    wherein configuration in said groups supports a wider variety of trigger functions than would arise in response to the interconnection of individual cells within an array;
    wherein four cells are contained in each said group of cells and connected in four different directions; and
    wherein said four different directions are at right angles to one another and referred to as north, east, south and west directions.

35. A method as recited in claim 10, wherein the functioning of said cells is determined in response to the receipt of configuration bits.

36. A method as recited in claim 10:
wherein the functioning of said cells is determined in response to the receipt of configuration bits; and
wherein said circuit cells comprise identical hardware.

37. A method as recited in claim 10, wherein the functioning of said cells is at least partially determined in response to the direction and/or location of trigger arrival within the cell.

38. A method as recited in claim 10, wherein the functioning of said cells toggles in response to arrival of said trigger.

39. A method as recited in claim 10, wherein asynchronous triggers are generated within the plurality of cells in response to detection of a selected condition.

40. A method as recited in claim 10:
wherein asynchronous triggers are generated within the plurality of cells in response to detection of a selected condition; and
wherein said selected condition comprises arrival of a valid output from an arithmetic and logic unit within a given cell.

41. A method as recited in claim 10, wherein the cells of the array are asynchronously clocked without the need of a global clock.

42. A method as recited in claim 10:
wherein the cells of the array are asynchronously clocked without the need of a global clock; and
wherein in response to the elimination of the limitations of global clock distribution, the plurality of cells can be made as large as desired.

43. A method as recited in claim 10:
wherein the cells of the array are asynchronously clocked without the need of a global clock;
wherein in response to the elimination of the limitations of global clock distribution, the plurality of cells can be made as large as desired; and
wherein only triggered cells are active, and power is not dissipated by cells which receive a global clock but are not subject to a data transition.

44. A method as recited in claim 10, wherein said triggers provide edge triggering of data retention elements within the cells.

45. A method as recited in claim 10, wherein the triggers and data are combined and specific data setup times are eliminated between data and an associated trigger.

46. A method as recited in claim 10, further comprising qualifying trigger conditions within a cell in response to detecting thermal conditions about said cell.

47. A method as recited in claim 10, further comprising:
qualifying trigger conditions within a cell in response to detecting thermal conditions about said cell; and
wherein the generation of said trigger is delayed in response to detecting elevated temperatures conditions toward mitigating thermal ramping of the cells.

48. A method as recited in claim 10, wherein processing within said cellular logic array is performed in response to steps comprising:
(a) propagating data to the desired cells;
(b) forming terms within the desired cells to which data has been propagated; and
(c) combining the terms to generate a result.

49. A method as recited in claim 10, wherein multiple computational processing can be performed simultaneously within a single cell of said plurality of cells.

50. A method as recited in claim 10, wherein said cellular logic array comprises a form of extendable field-programmable gate array (FPGA).

* * * * *